(12) United States Patent
Moon et al.

(10) Patent No.: US 9,525,138 B2
(45) Date of Patent: Dec. 20, 2016

(54) ORGANIC LIGHT-EMITTING DIODE, METHOD OF MANUFACTURING THE SAME, AND METHOD OF FORMING MATERIAL LAYER

(71) Applicant: Samsung Display Co., Ltd., Yongin, Gyeonggi-Do (KR)

(72) Inventors: Jung-Min Moon, Yongin (KR); Seong-Jong Kang, Yongin (KR); Tae-Jin Park, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 635 days.

(21) Appl. No.: 13/913,935

(22) Filed: Jun. 10, 2013

(65) Prior Publication Data

US 2014/0103306 A1    Apr. 17, 2014

(30) Foreign Application Priority Data

Oct. 12, 2012    (KR) ........................ 10-2012-0113829

(51) Int. Cl.
*H01L 51/50* (2006.01)
*H01L 51/00* (2006.01)

(52) U.S. Cl.
CPC ....... *H01L 51/0052* (2013.01); *H01L 51/0077* (2013.01); *H01L 51/508* (2013.01); *H01L 51/0067* (2013.01); *H01L 51/0072* (2013.01); *H01L 51/0085* (2013.01); *H01L 2251/308* (2013.01)

(58) Field of Classification Search
None
See application file for complete search history.

(56) References Cited

U.S. PATENT DOCUMENTS 8,174,184 B2   5/2012   Park et al.
2011/0084259 A1   4/2011   Lee et al.

FOREIGN PATENT DOCUMENTS

KR   10-2010-0022638 A   3/2010
KR   10-2011-0040735 A   4/2011
KR   10-2012-0039325 A   4/2012

*Primary Examiner* — Gregory Clark
(74) *Attorney, Agent, or Firm* — Knobbe Martens Olson & Bear LLP

(57) ABSTRACT

In an aspect, an organic light-emitting diode, a method of manufacturing the same, and a method of forming a material layer are provided.

16 Claims, 5 Drawing Sheets

ORGANIC LIGHT-EMITTING DIODE, METHOD OF MANUFACTURING THE SAME, AND METHOD OF FORMING MATERIAL LAYER

INCORPORATION BY REFERENCE TO ANY PRIORITY APPLICATIONS

Any and all priority claims identified in the Application Data Sheet, or any correction thereto, are hereby incorporated by reference under 37 CFR 1.57. For example, this application claims priority to and the benefit of Korean Patent Application No. 10-2012-0113829, filed on Oct. 12, 2012, in the Korean Intellectual Property Office, the disclosure of which is incorporated herein in its entirety by reference.

BACKGROUND

Field

One or more embodiments of the present invention relate to an organic light-emitting diode, a method of manufacturing the same, and a method of forming a material layer.

Description of the Related Technology

Organic light-emitting diodes (OLEDs), which are self-emitting diodes, have advantages such as wide viewing angles, excellent contrast, quick response, high brightness, excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. In this regard, the hole transport layer, the emission layer, and the electron transport layer are organic thin films formed of organic compounds.

An operating principle of an OLED having the above-described structure is as follows.

When a voltage is applied between the anode and the cathode, holes injected from the anode move to the emission layer via the hole transport layer, and electrons injected from the cathode move to the emission layer via the electron transport layer. The holes and electrons recombine in the emission layer to generate excitons. When the excitons drop from an excited state to a ground state, light is emitted.

SUMMARY

One or more embodiments of the present invention include an organic light-emitting diode (OLED) with high efficiency and improved lifetime through using an electron transport layer having a novel structure.

One or more embodiments of the present invention include a method of manufacturing the organic light-emitting diode, and a method of forming a material layer.

Additional aspects will be set forth in part in the description which follows and, in part, will be apparent from the description, or may be learned by practice of the presented embodiments.

According to one or more embodiments of the present invention, an organic light-emitting diode includes: a substrate; a first electrode disposed on the substrate; a second electrode disposed opposite to the first electrode; an emission layer disposed between the first electrode and the second electrode; and an electron transport layer disposed between the emission layer and the second electrode, wherein the electron transport layer includes a stack structure including n number of electron transport units (where n is an integer of 1 or greater) each including a stack of a first layer, a first mixed layer, a second layer, a second mixed layer, and a third layer that are sequentially stacked upon one another, the first mixed layer and the second mixed layer each include an electron-transporting organic material and an electron migration-facilitating material, and the first layer includes a first electron migration-facilitating material and excludes the electron-transporting organic material, the second layer includes a second electron migration-facilitating material and excludes the electron-transporting organic material, and the third layer includes a third electron migration-facilitating material and excludes the electron-transporting organic material.

According to one or more embodiments of the present invention, a method of manufacturing an organic light-emitting diode includes: forming a first electrode on a substrate; forming an emission layer on the first electrode; forming an electron transport layer on the emission layer; and forming a second electrode on the electron transport layer, wherein the forming of the electron transport layer includes:

preparing a first deposition source discharging an electron migration-facilitating material, a second deposition source discharging an electron-transporting organic material, and a third deposition source discharging an electron migration-facilitating material;

arranging the first deposition source, the second deposition source and the third deposition source at predetermined intervals therebetween so that a discharging domain of the electron migration-facilitating material from the first deposition source and a discharging domain of the electron-transporting organic material from the second deposition source overlap with each other, and a discharging domain of the electron-transporting organic material from the second deposition source and a discharging domain of the electron migration-facilitating material from the third deposition source overlap with each other; and reciprocating the first deposition source, the second deposition source and the third deposition source from a first end via a second end of a region in which an electron transport layer is formed and then back to the first end of the region in which the electron transport layer is formed, wherein the reciprocating is performed n times, where n is an integer of 1 or greater, to form the organic light-emitting diode including: a substrate; a first electrode disposed on the substrate; a second electrode disposed opposite to the first electrode; an emission layer disposed between the first electrode and the second electrode; and an electron transport layer disposed between the emission layer and the second electrode, wherein the electron transport layer includes a stack structure including n number of electron transport units (where n is an integer of 1 or greater) each including a stack of a first layer, a first mixed layer, a second layer, a second mixed layer, and a third layer that are sequentially stacked upon one another, the first mixed layer and the second mixed layer each include an electron-transporting organic material and an electron migration-facilitating material, and the first layer includes a first electron migration-facilitating material and excludes the electron-transporting organic material, the second layer includes a second electron migration-facilitating material and excludes the electron-transporting organic material, and the third layer includes a third electron migration-facilitating material and excludes the electron-transporting organic material.

According to one or more embodiments of the present invention, a method of forming a material layer includes:

preparing a substrate;

preparing a first deposition source discharging a first material, a second deposition source discharging a second material, and a third deposition source discharging a third material;

arranging the first deposition source, the second deposition source and the third deposition source at predetermined intervals therebetween so that a discharging domain of the first material from the first deposition source and a discharging domain of the second material from the second deposition source overlap with each other, and a discharging domain of the second material from the second deposition source and a discharging domain of the third material from the third deposition source overlap with each other; and reciprocating the first deposition source, the second deposition source and the third deposition source from a first end to a second end of the substrate and then back to the first end of the substrate;

wherein the reciprocating is performed n times, where n is an integer of 1 or greater, to form the material layer having a stack structure including n number of stack units on the substrate, where n is an integer of 1 or greater, each stack unit including: a third material layer, a mixed layer of the third material and the second material, a mixed layer of the first material and the third material, a mixed layer of the first material and the second material, and a first material layer that are sequentially stacked upon one another on the substrate.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
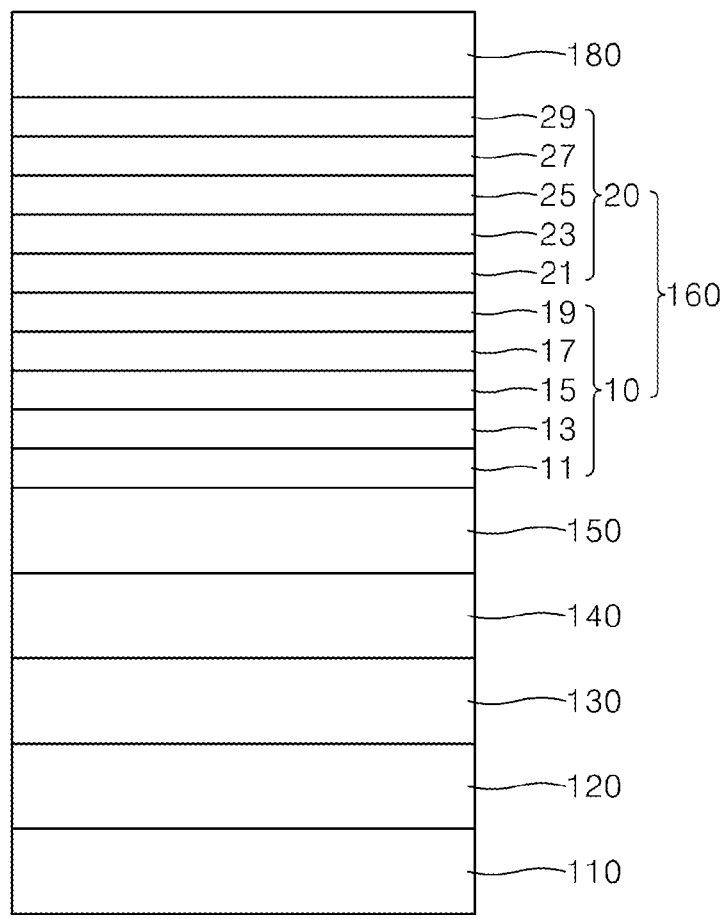
FIG. 1 is a schematic view of a structure of an organic light-emitting diode according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed. Expressions such as "at least one of," when preceding a list of elements, modify the entire list of elements and do not modify the individual elements of the list.

An organic light-emitting diode 100 according to an embodiment of the present invention will be described with reference to FIG. 1.

Referring to FIG. 1, the organic light-emitting diode 100 has a stack structure in which a substrate 110, a first electrode 120, a hole injection layer 130, a hole transport layer 140, an emission layer 150, an electron transport layer 160, and a second electrode 180 are sequentially stacked upon one another. The electron transport layer 160 has a stack structure including:

a first electron transport unit 10 including a first layer 11, a first mixed layer 13, a second layer 15, a second mixed layer 17, and a third layer 19 that are sequentially stacked upon one another; and a second electron transport unit 20 including a first layer 21, a first mixed layer 23, a second layer 25, a second mixed layer 27, and a third layer 29 that are sequentially stacked upon one another.

That is, the number (n) of electron transport units in the electron transport layer 160 of the organic light-emitting diode 100 is 2.

In some embodiments, the substrate 110 may be any substrate that is used in existing organic light-emitting diodes. In some embodiments, the substrate 11 may be a glass substrate or a transparent plastic substrate with strong mechanical strength, thermal stability, transparency, surface smoothness, ease of handling, and water resistance.

In some embodiments, the first electrode 120 may be formed by depositing or sputtering a first electrode-forming material on the substrate 110. When the first electrode 120 constitutes an anode, a material having a high work function may be used as the first electrode-forming material to facilitate hole injection. In some embodiments, the first electrode 120 may be a reflective electrode, a semi-transmission electrode, or a transmission electrode. Transparent and conductive materials such as ITO, IZO, $SnO_2$, and ZnO may be used to form the first electrode 13. In some embodiments, the first electrode 120 may be formed as a reflective electrode using magnesium (Mg), aluminum (Al), aluminum-lithium (Al—Li), calcium (Ca), magnesium-indium (Mg—In), magnesium-silver (Mg—Ag), or the like.

In some embodiments, the first electrode 120 may have a single-layer structure or a multi-layer structure including at least two layers. For example, the first electrode 120 may have a three-layered structure of ITO/Ag/ITO, but is not limited thereto.

In some embodiments, a hole injection layer 130 may be disposed on the first electrode 120. In some embodiments, the hole injection layer 130 may be formed on the first electrode 120 by vacuum deposition, spin coating, casting, Langmuir-Blodgett (LB) deposition, or the like.

When the hole injection layer 130 is formed using vacuum deposition, vacuum deposition conditions may vary according to the compound that is used to form the hole injection layer 130, and the desired structure and thermal properties of the hole injection layer 130 to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the hole injection layer 130 is formed using spin coating, the coating conditions may vary according to a compound that is used to form the hole injection layer 130, and the structure and thermal properties of the hole injection layer 121 to be formed. For example, the spine coating may be performed at a coating rate of about 2000 to about 5000 rpm, and a temperature for heat treatment which is performed to remove a solvent after the coating may be from about 80 to about 200° C.

The hole injection layer 130 may be formed of any material that is commonly used to form a hole injection layer. Non-limiting examples of the material that can be used to form the hole injection layer are N,N'-diphenyl-N,N'-bis-[4-(phenyl-m-tolyl-amino)-phenyl]-biphenyl-4,4'-diamine, (DNTPD), a phthalocyanine compound such as copper-phthalocyanine, 4,4',4"-tris(3-methylphenylphenylamino) triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline)/poly(4-styrenesulfonate (PANI/PSS).

m-MTDATA

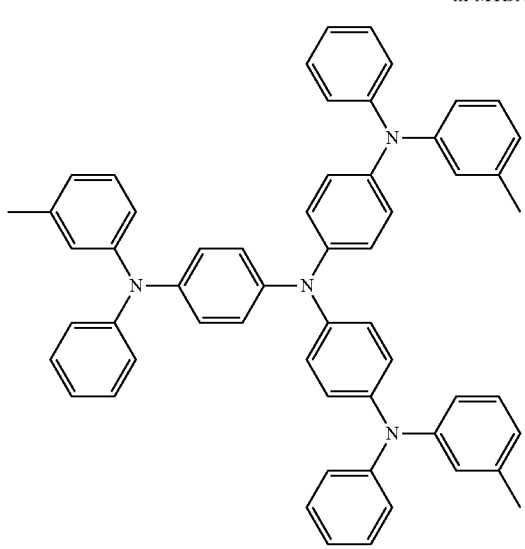

TDATA

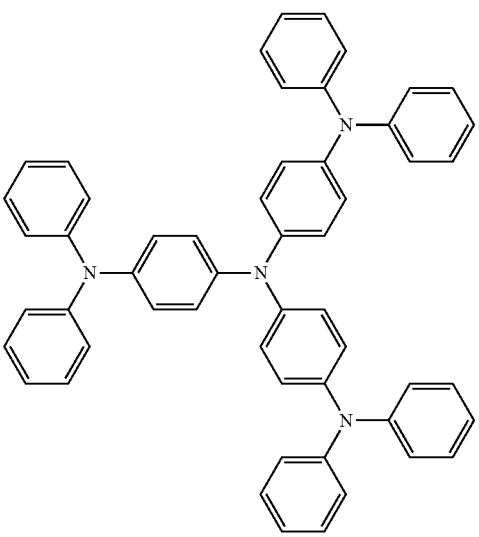

2-TNATA

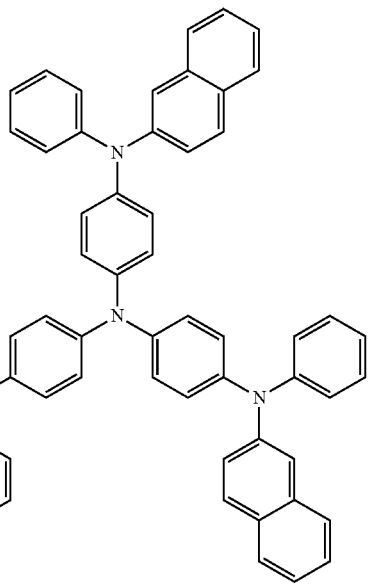

In some embodiments, the thickness of the hole injection layer 130 may be from about 100 Å to about 10000 Å, and in some embodiments, may be from about 100 Å to about 1000 Å. When the thickness of the hole injection layer 130 is within these ranges, the hole injection layer 130 may have good hole injecting ability without a substantial increase in driving voltage.

In some embodiments, a hole transport layer 140 may be formed on the hole injection layer 130 by using vacuum deposition, spin coating, casting, Langmuir-Blodgett (LB) deposition, or the like. When the hole transport layer 140 is formed using vacuum deposition or spin coating, the conditions for deposition and coating may be similar to those for the formation of the hole injection layer 130, although the conditions for the deposition and coating may vary according to the material that is used to form the hole transport layer 122.

Non-limiting examples of suitable known hole transport materials are carbazole derivatives, such as N-phenylcarbazole or polyvinylcarbazole, N,N-bis(3-methylphenyl)-N,N-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

TPD

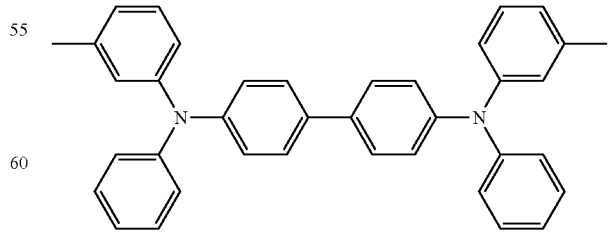

In some embodiments, the hole transport layer 140 may have a thickness of from about 50 Å to about 2000 Å, and in some embodiments, from about 100 Å to about 1500 Å.

When the thickness of the hole transport layer 140 is within these ranges, the hole transport layer 140 may have satisfactory hole transporting ability without a substantial increase in driving voltage.

In some embodiments, at least one layer of the hole injection layer 130 and the hole transport layer 140 may include at least one compounds represented by Formulae 300 and 350 below:

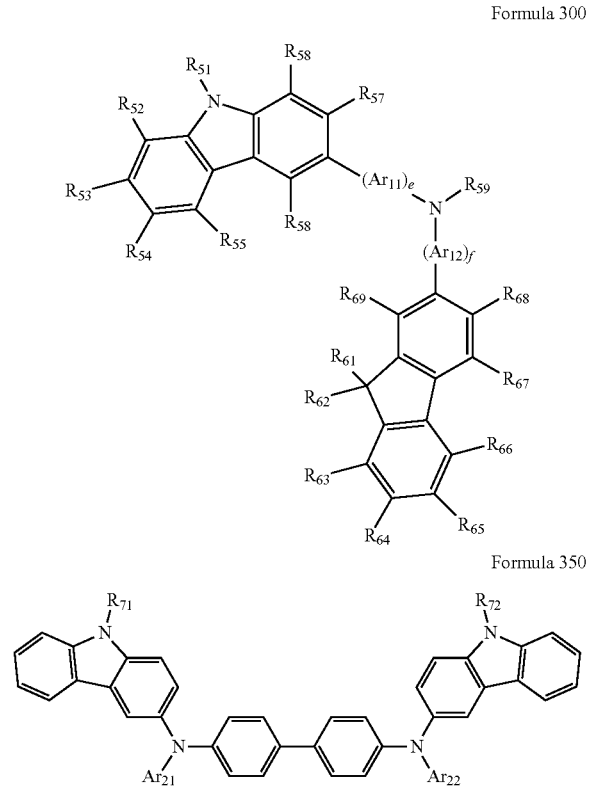

Formula 300

Formula 350

In Formula 300, $Ar_{11}$ and $Ar_{12}$ may be each independently a substituted or unsubstituted $C_6$-$C_{60}$ arylene group. For example, $Ar_{11}$ and $Ar_{12}$ may be each independently selected from a substituted or unsubstituted phenylene group, a substituted or unsubstituted naphthylene group, a substituted or unsubstituted fluorenylene group, and a substituted or unsubstituted anthrylene, but are not limited thereto. At least one of substituents of the substituted phenylene group, the substituted naphthylene group, the substituted fluorenylene group and the substituted anthrylene group may be selected from a deuterium atom, a halogen atom, a hydroxyl group, a cyano group, a $C_1$-$C_{20}$alkyl group, a $C_1$-$C_{20}$alkoxy group, a phenyl group, a naphthyl group, an anthryl group, a carbazolyl group, and a phenyl-substituted carbazolyl group, but is not limited thereto.

In Formula 350, $Ar_{21}$ and $Ar_{22}$ may be each independently selected from a substituted or unsubstituted $C_6$-$C_{60}$ alkyl group, and a substituted or unsubstituted $C_2$-$C_{60}$ heteroaryl group. For example, $Ar_{21}$ and $Ar_{22}$ may be each independently, selected from a substituted or unsubstituted phenyl group, a substituted or unsubstituted naphthyl group, a substituted or unsubstituted phenanthrenyl group, a substituted or unsubstituted anthryl group, a substituted or unsubstituted pyrenyl group, a substituted or unsubstituted chrysenyl group, a substituted or unsubstituted fluorenyl group, a substituted or unsubstituted carbazolyl group, a substituted or unsubstituted dibenzofuranyl group, and a substituted or unsubstituted dibenzothiophenyl group. At least one substituents from among the substituted phenyl group, the substituted naphthyl group, the substituted phenanthrenyl group, the substituted anthryl group, the substituted pyrenyl group, substituted chrysenyl group, the substituted fluorenyl group, the substituted carbazolyl group, the substituted dibenzofuranyl group, and the substituted dibenzothiophenyl group may be a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$alkyl group, a $C_1$-$C_{10}$alkoxy group, a phenyl group, a naphthyl group, a fluorenyl group, a phenanthrenyl group, an anthryl group, a tyouriphenylenyl group, a pyrenyl group, a chrysenyl group, an imidazolyl group, an imidazolinyl group, an imidazopyridinyl group, an imidazopyrimidinyl group, a pyridinyl group, a pyrazinyl group, a pyrimidinyl group, and an indolyl group; and a phenyl group, a naphthyl group, a fluorenyl group, a phenanthrenyl group, an anthryl group, a triphenylenyl group, a pyrenyl group, a chrysenyl group, an imidazolyl group, an imidazolinyl group, an imidazopyridinyl group, an imidazopyrimidinyl group, a pyridinyl group, a pyrazinyl group, a pyrimidinyl group, and an indolyl group, substituted with at least one of a deuterium atom a halogen atom, a hydroxyl group, a cyano group, a nitro group, an amino group, an amidino group, a hydrazine, a hydrazone, a carboxyl group or a salt thereof, a sulfonic acid group or a salt thereof, phosphoric acid group or a salt thereof, a $C_1$-$C_{10}$alkyl group, and a $C_1$-$C_{10}$alkoxy group.

In Formula 300, e and f may be each independently an integer from 0 to 5, for example, may be 0, 1, or 2. In a non-limiting embodiment, e may be 1, and f may be 0.

In Formulae 300 and 350 above, $R_{51}$ to $R_{58}$, $R_{61}$ to $R_{69}$, $R_{71}$, and $R_{72}$ may be each independently selected from a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, and a substituted or unsubstituted $C_6$-$C_{60}$ arylthio group. In some embodiments, $R_{51}$ to $R_{58}$, $R_{61}$ to $R_{69}$, $R_{71}$, and $R_{72}$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, or the like) and a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, and a pyrenyl group; and a phenyl group, a naphthyl group, an anthryl group, a fluorenyl group, and a pyrenyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Formula 300, $R_{59}$ may be selected from a phenyl group, a naphthyl group, an anthryl group, a biphenyl group, and a pyridyl group; and a phenyl group, a naphthyl group, an anthryl group, a biphenyl group, and a pyridyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In an embodiment the compound of Formula 300 may be a compound represented by Formula 300A below:

Formula 300A

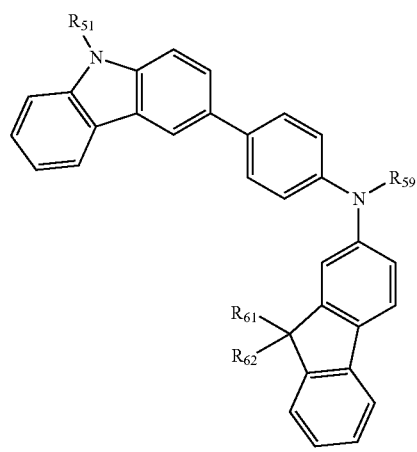

In Formula 300A, $R_{51}$, $R_{60}$, $R_{61}$, and $R_{59}$ may be as defined above.

For example, at least one layer of the hole injection layer 130 and the hole transport layer 140 may include at least one of Compounds 301 to 310 below, but is not limited thereto:

301

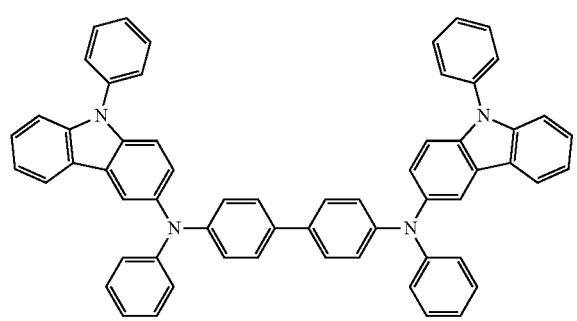

302

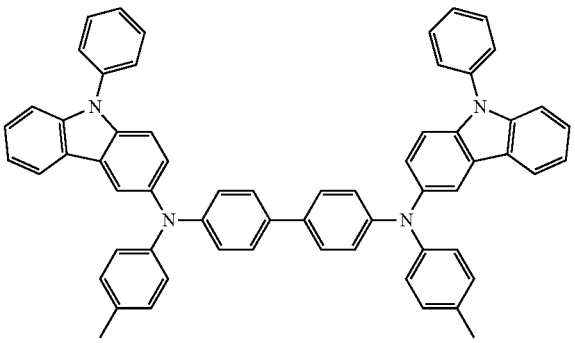

303

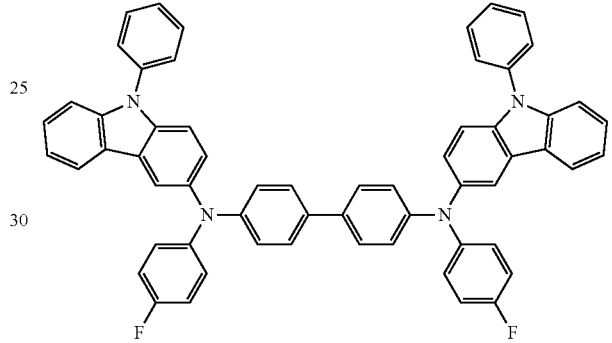

304

305

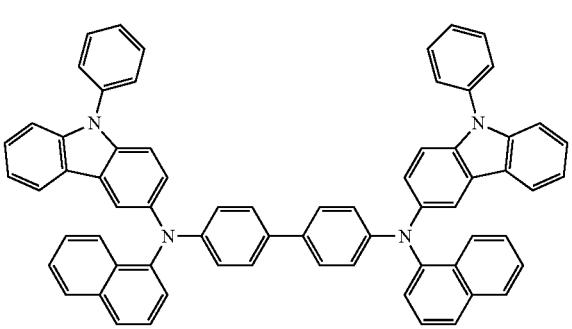

306
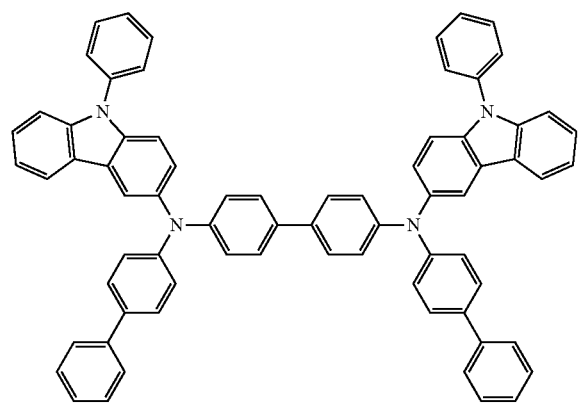
307
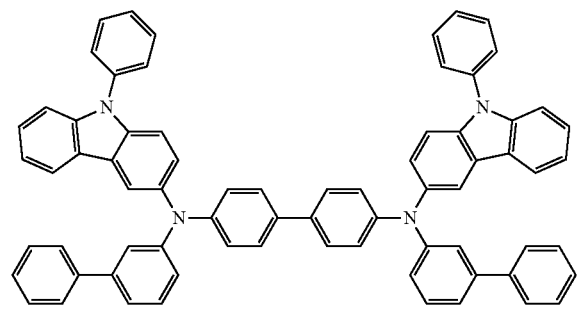
308
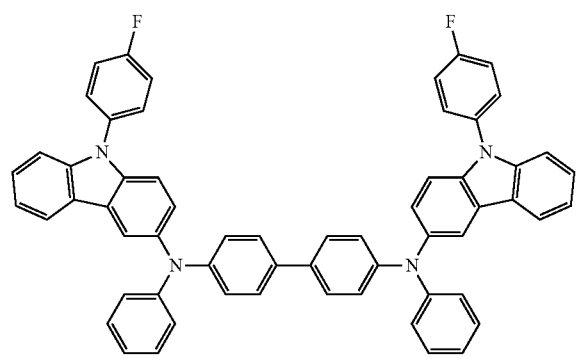
309
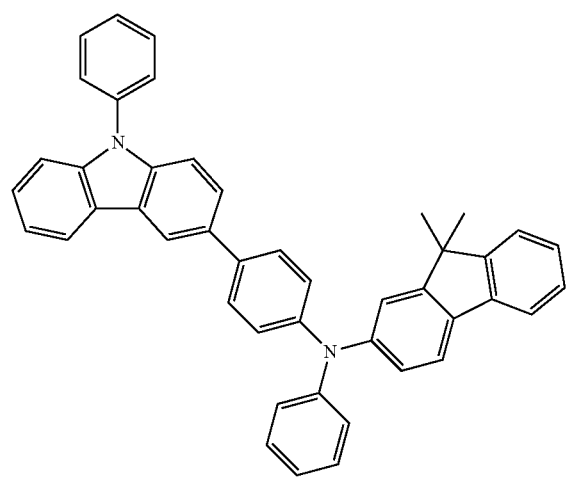
310
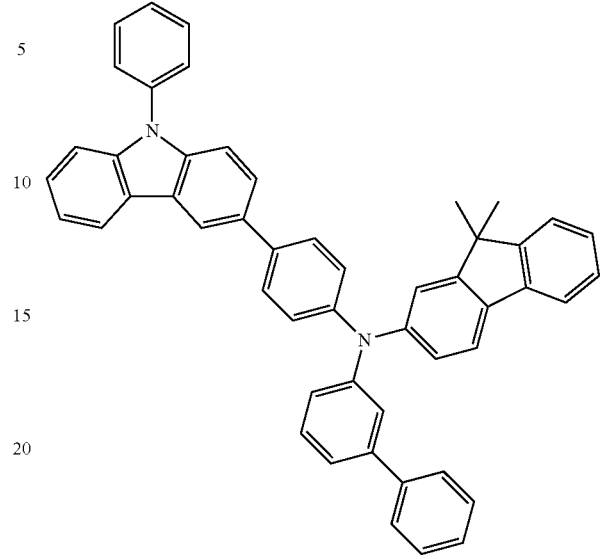
311
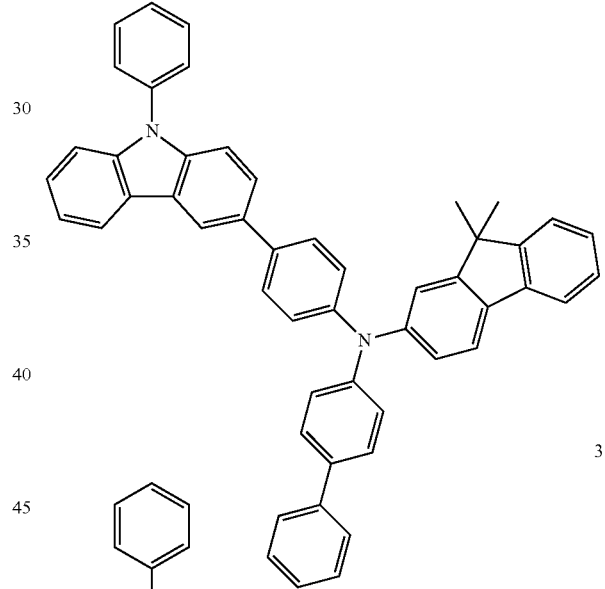
312
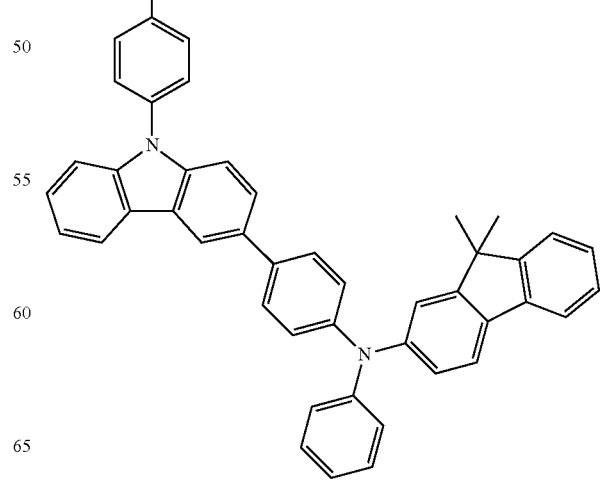

313
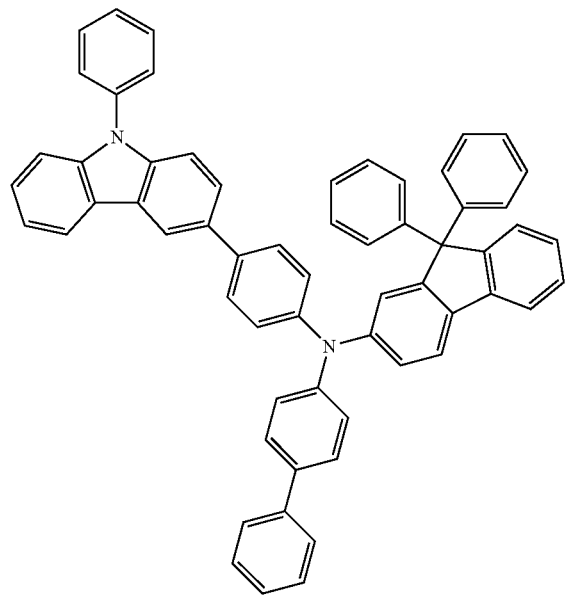
314
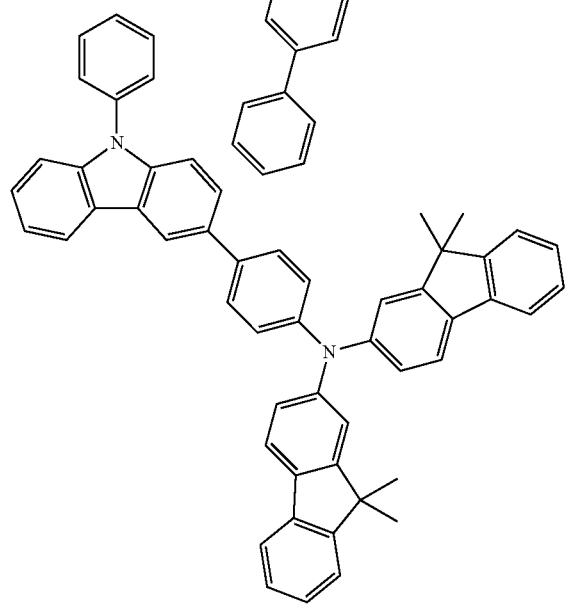
316
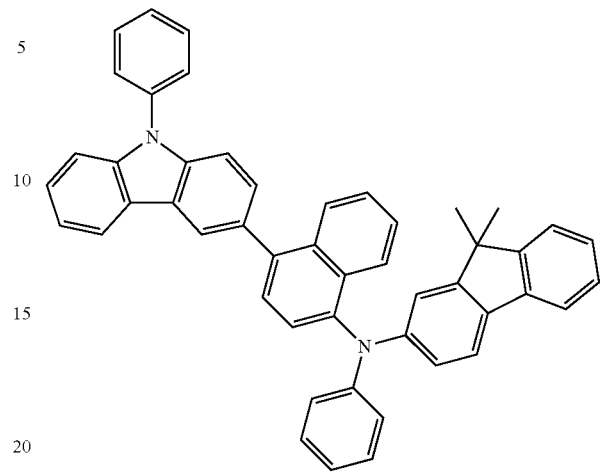
317
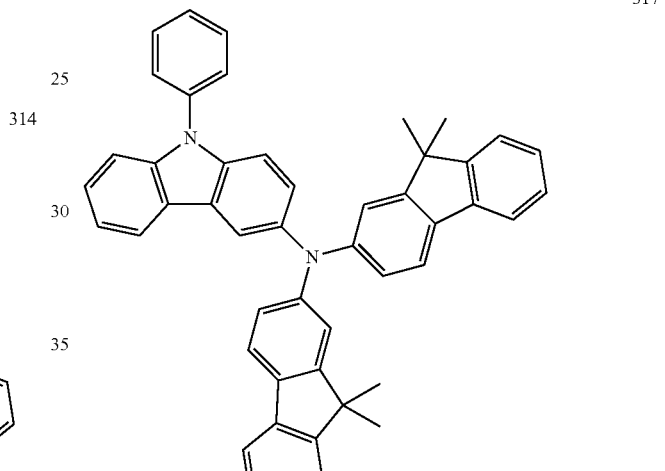
318
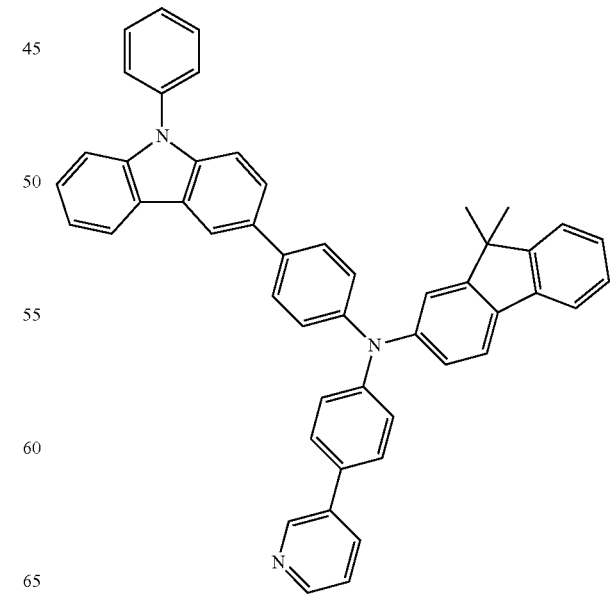

-continued

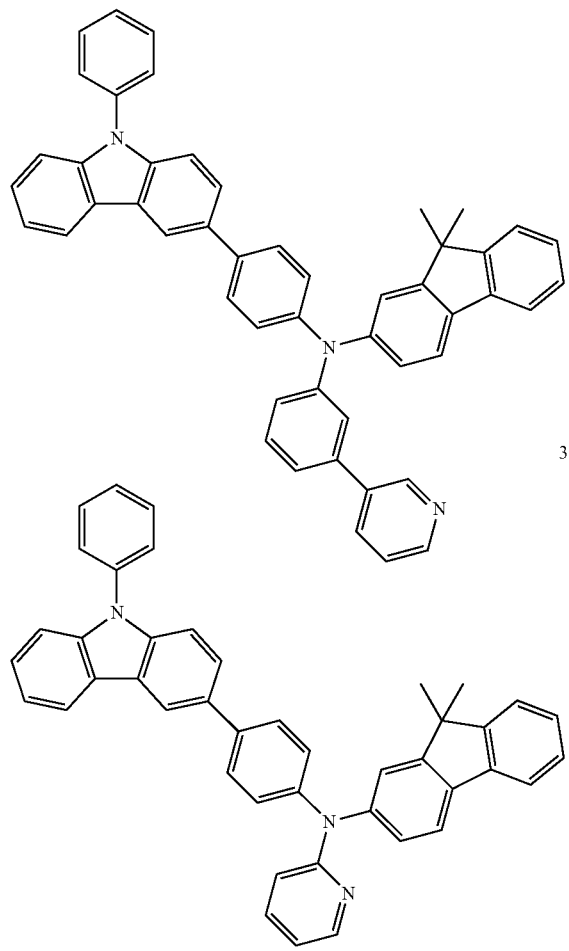

319

320

In some embodiments, at least one of the hole injection layer 130 and the hole transport layer 140 may further include a charge-generating material for improving conductivity of the layer.

In some embodiments, the charge-generating material may be, for example, a p-dopant. In some embodiments, the p-dopant may be one of quinine derivatives, metal oxides, and compounds with a cyano group, but are not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 390 below.

Compound 390

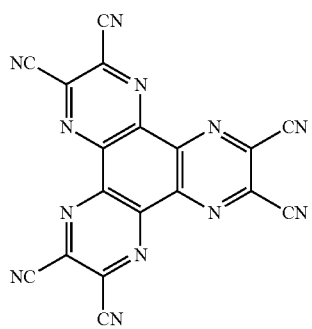

-continued

F4-TCNQ

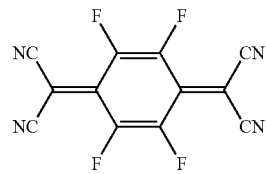

When at least one of the hole injection layer 130 and the hole transport layer 140 further includes a charge-generating material, the charge-generating material may be homogeneously dispersed or inhomogeneously distributed in the at least one of the hole injection layer 130 and the hole transport layer 140.

An intermediate layer (not shown in FIG. 1) may be between the hole transport layer 140 and the emission layer 150. In some embodiments, the intermediate layer may compensate for an optical resonance distance of light according to a wavelength of the light emitted from the emission layer 150, and thus may increase efficiency. The intermediate layer may include a known hole injection material, a known hole transport material, or the like. In some embodiments, the intermediate may include the same maternal as used in one of the hole injection layer 130 and/or the hole transport layer 140 underlying the intermediate layer.

In some embodiments, the emission layer 150 may be formed on the hole transport layer 140 using any of a variety of methods, for example, by vacuum deposition, spin coating, casting, LB deposition, or the like. When the emission layer 150 is formed using vacuum deposition or spin coating, the deposition and coating conditions may be similar to those for the formation of the hole injection layer 130, though the conditions for deposition and coating may vary according to the material that is used to form the emission layer 150.

In some embodiments, the emission layer 150 may include any known light-emitting material. For example, the emission layer 150 may include a known host and a known dopant.

Non-limiting example of the host are Alq3, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), dmCBP (see a formula below), and Compounds 501 to 509 below.

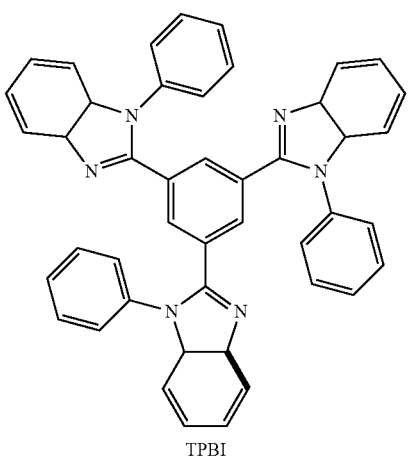

TPBI

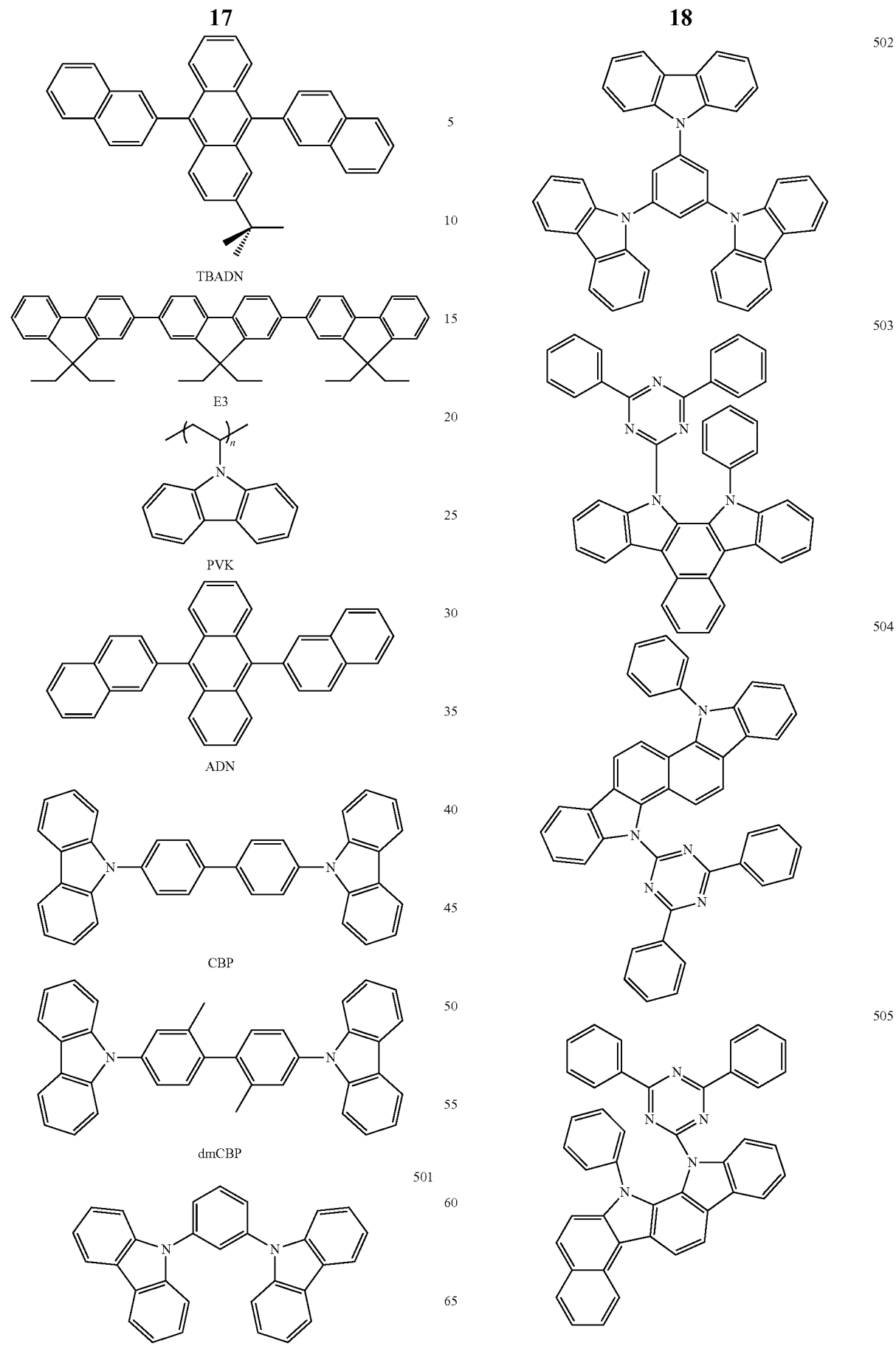

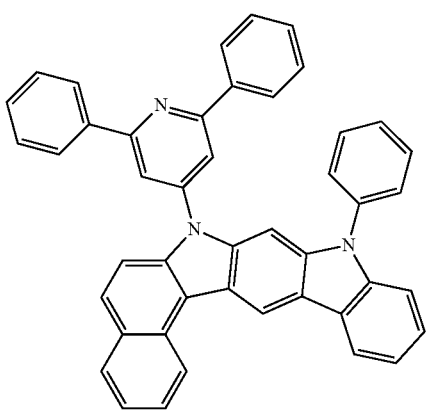

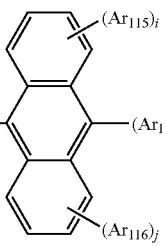

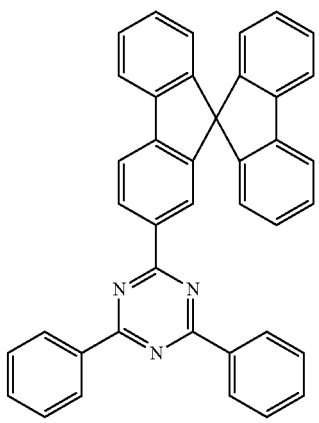

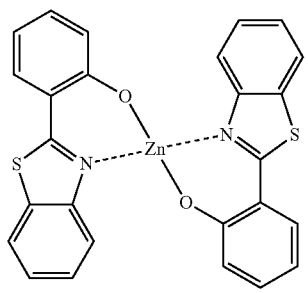

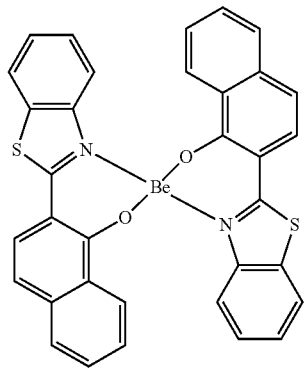

In some embodiments, a compound represented by Formula 400 below may be used as the host.

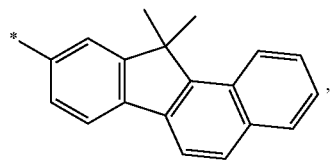 [SMILES: *c1ccc2c(c1)C(C)(C)c1c-2ccc2ccccc12]

Formula 400

In Formula 400 above, $Ar_{111}$ and $Ar_{112}$ may be each independently a substituted or unsubstituted $C_6$-$C_{60}$ arylene group; $Ar_{113}$ to $Ar_{116}$ may be selected from each independently a substituted or unsubstituted $C_1$-$C_{10}$ alkyl group, and a substituted or unsubstituted $C_6$-$C_{60}$aryl group; g, h, i and j may be each independently an integer from 0 to 4.

In some non-limiting embodiments, $Ar_{111}$ and $Ar_{112}$ in Formula 400 may be each independently selected from a phenylene group, a naphthylene group, a phenanthrenylene group, and a pyrenylene group; and a phenylene group, a naphthylene group, a phenanthrenylene group, a fluorenyl group, and a pyrenylene group, substituted with at least one of a phenyl group, a naphthyl group, and an anthryl group.

In Formula 400 above, g, h, i, and j may be each independently 0, 1, or 2.

In Formula 400, $Ar_{113}$ to $Ar_{116}$ may be each independently selected from a $C_1$-$C_{10}$ alkyl group substituted with at least one of a phenyl group, a naphthyl group and an anthryl group; a phenyl group, a naphthyl group, an anthryl group, a pyrenyl group, a phenanthrenyl group, and a fluorenyl group; a phenyl group, a naphthyl group, an anthryl group, a pyrenyl group, a phenanthrenyl group, and a fluorenyl group, substituted with at least one a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, an naphthyl group, an anthryl group, a pyrenyl group, a phenanthrenyl group, and a fluorenyl group; and but is not limited thereto.

For example, the anthracene compound of Formula 400 above may be one of the compounds represented by the following formulae, but is not limited thereto:

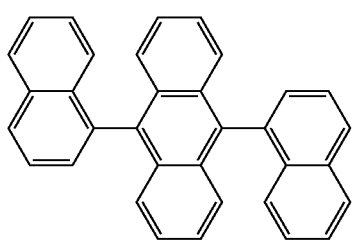
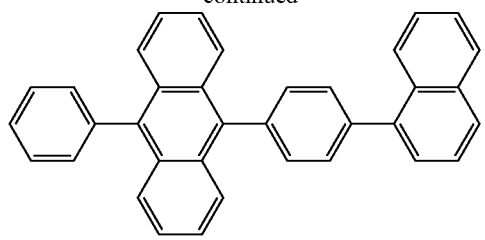
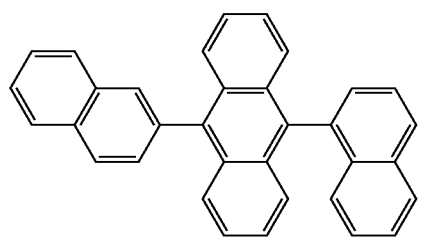
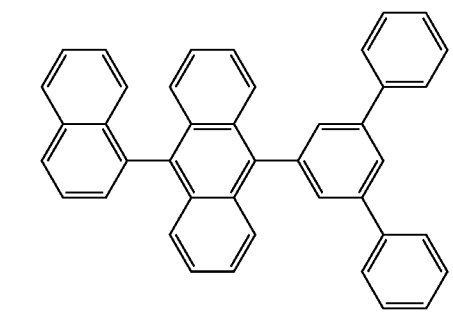
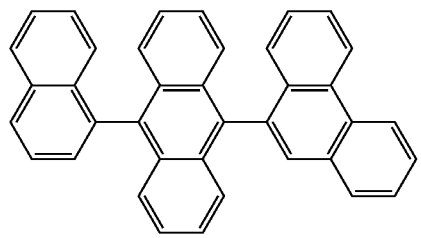
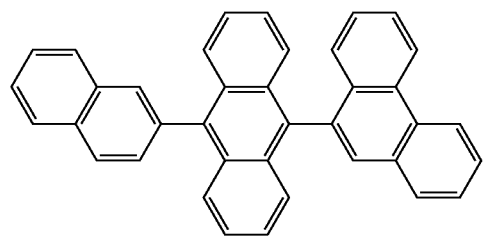
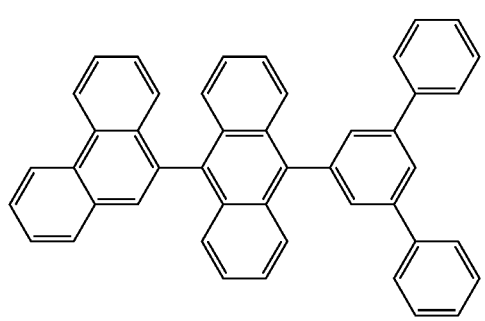
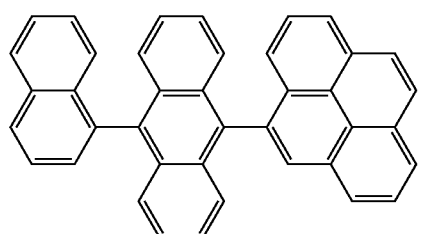
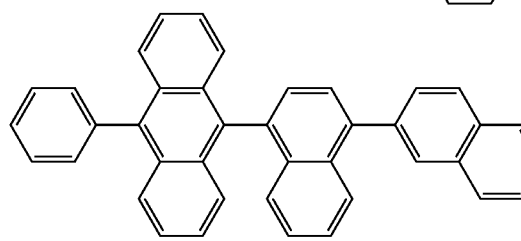
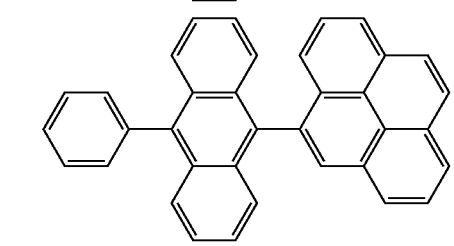
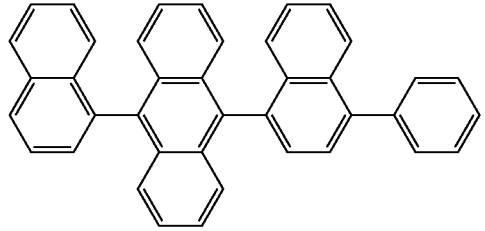
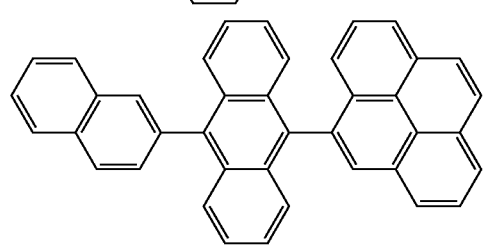
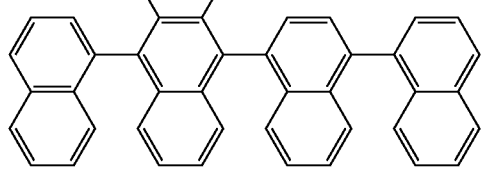

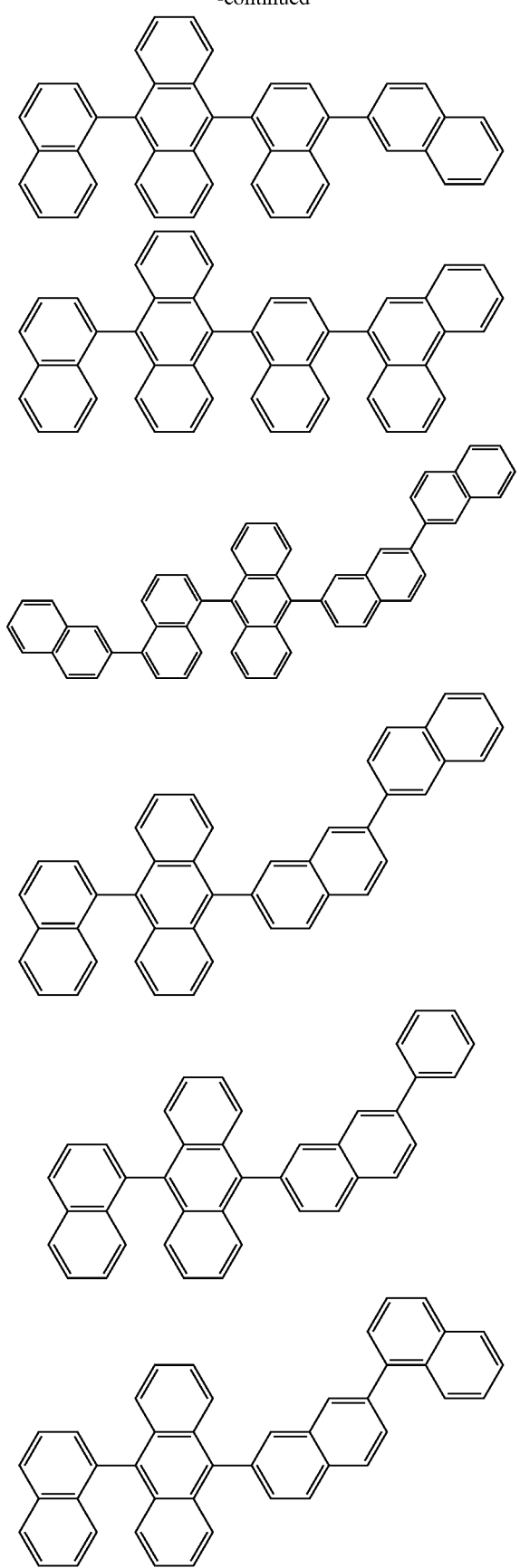
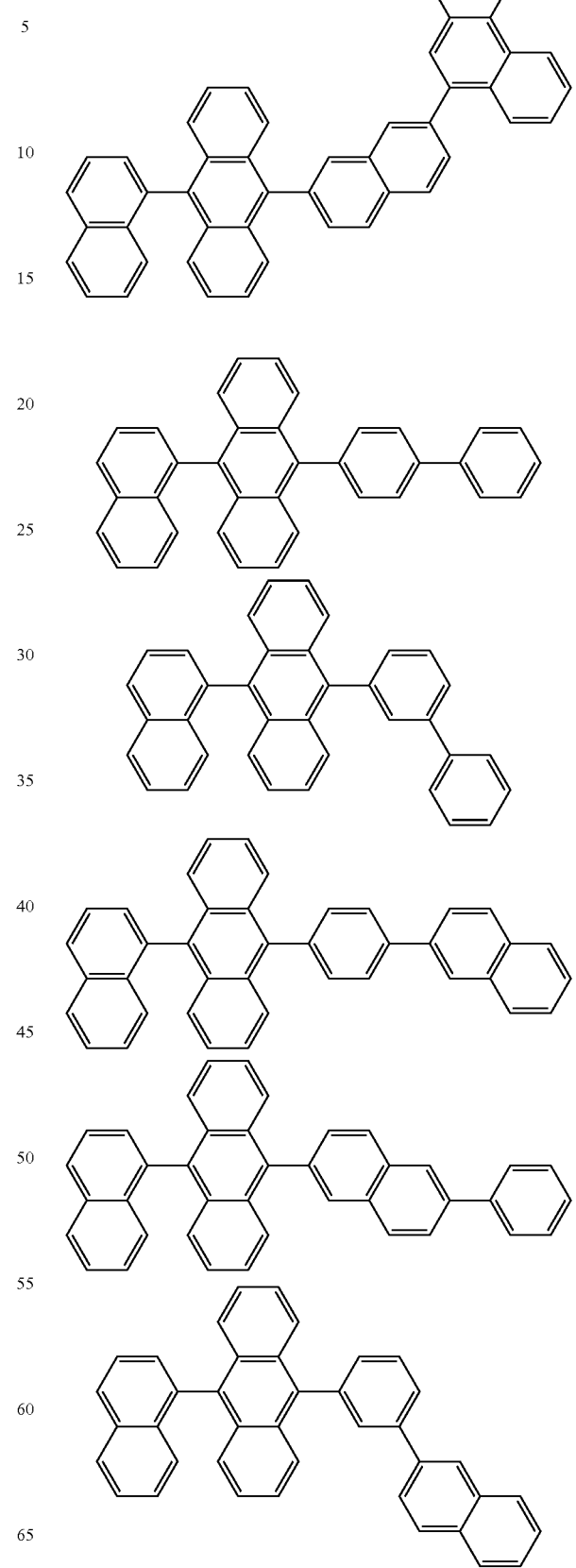

25
-continued
26
-continued
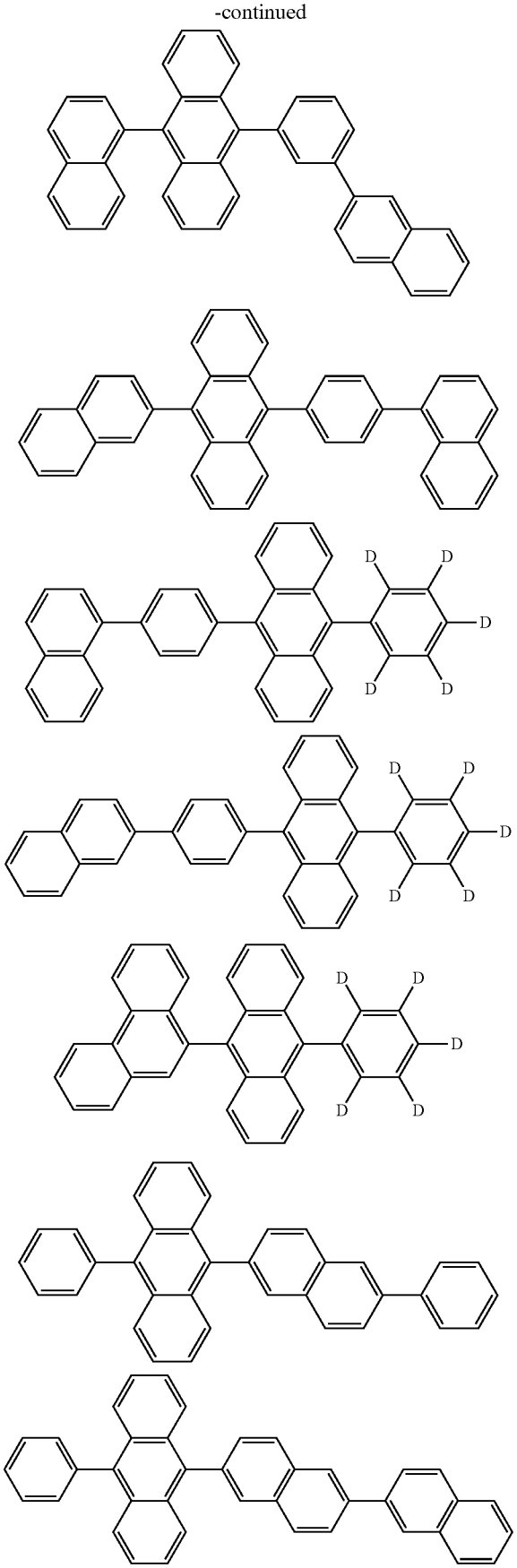
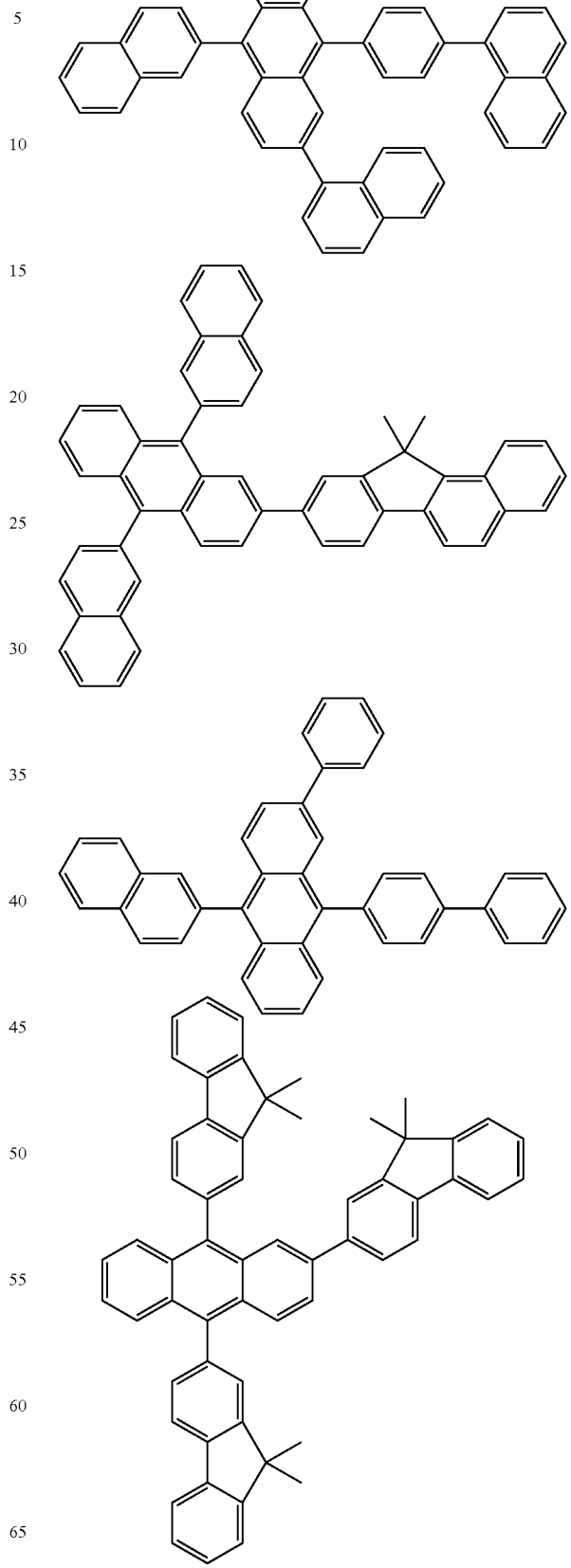

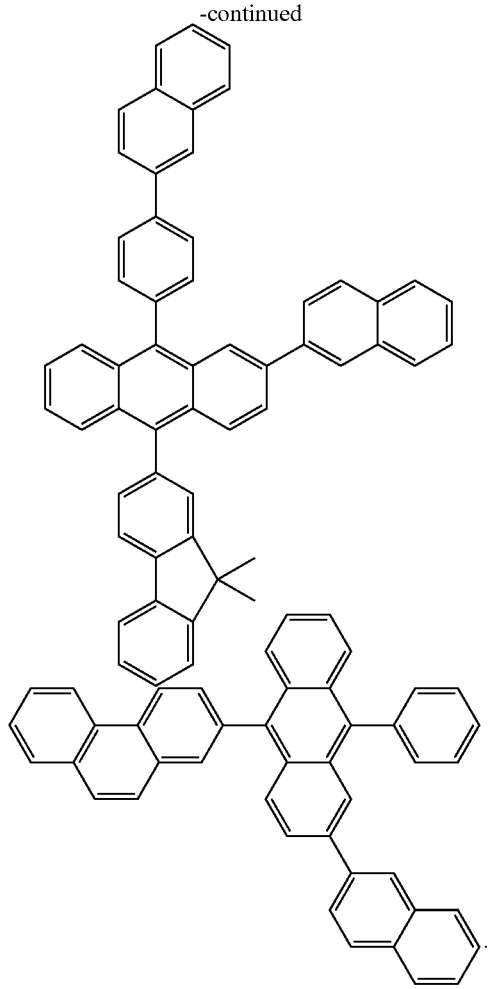

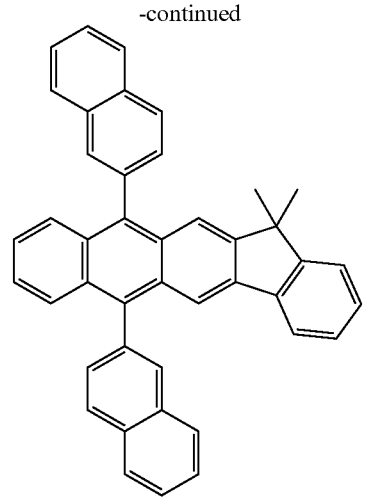

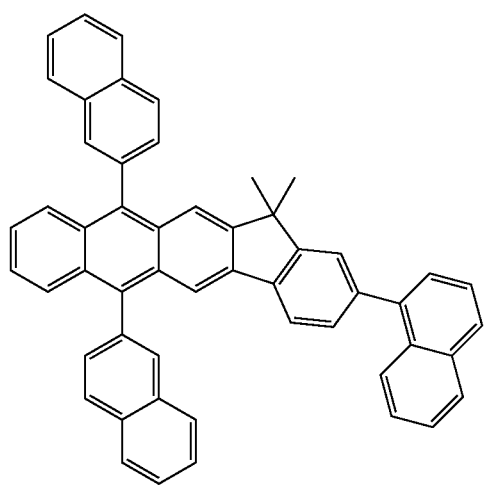

In some embodiments, a compound represented by Formula 401 below may be used as the host.

Formula 401

In Formula 401, $Ar_{122}$ to $Ar_{125}$ are as defined in conjunction of $Ar_{113}$ in Formula 400.

In Formula 401, $Ar_{126}$ and $Ar_{127}$ may be each independently a $C_1$-$C_{10}$alkyl group, for example, a methyl group, an ethyl group, or a propyl group.

In Formula 401, k and l may be each independently an integer from 0 to 4, for example, 0, 1, or 2.

For example, the compound of Formula 401 above may be one of the compounds represented by the following formulae, but is not limited thereto:

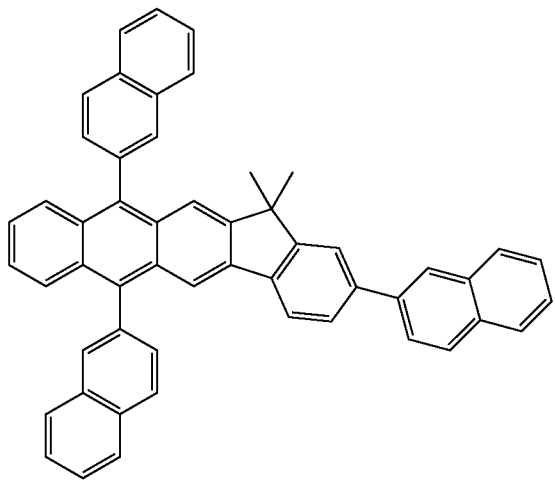

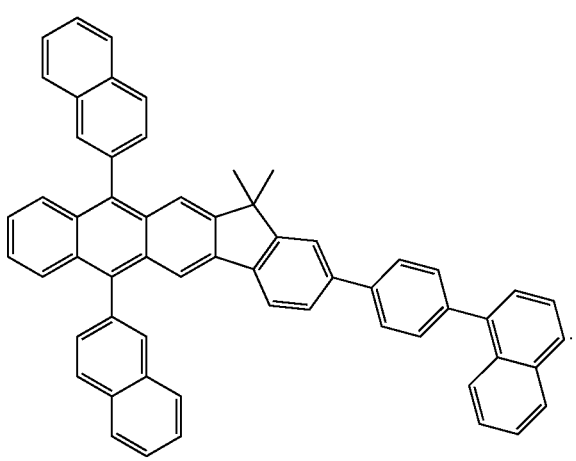 [SMILES: CC1(C)c2cc(-c3ccc(-c4cccc5ccccc45)cc3)ccc2-c2cc3c(-c4ccc5ccccc5c4)c4ccccc4c(-c4ccc5ccccc5c4)c3cc21]

Non-limiting examples of the host are Compound H1, Compound H2, and Compound H3 below.
Compound H1
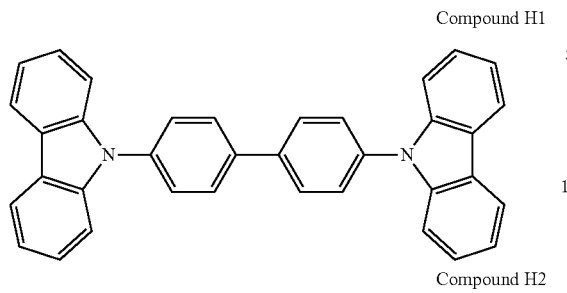
Compound H2
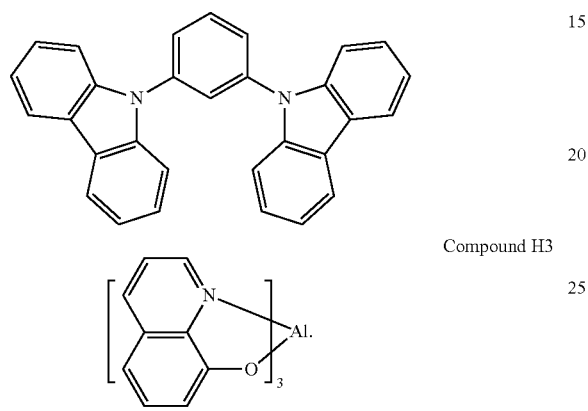
Compound H3
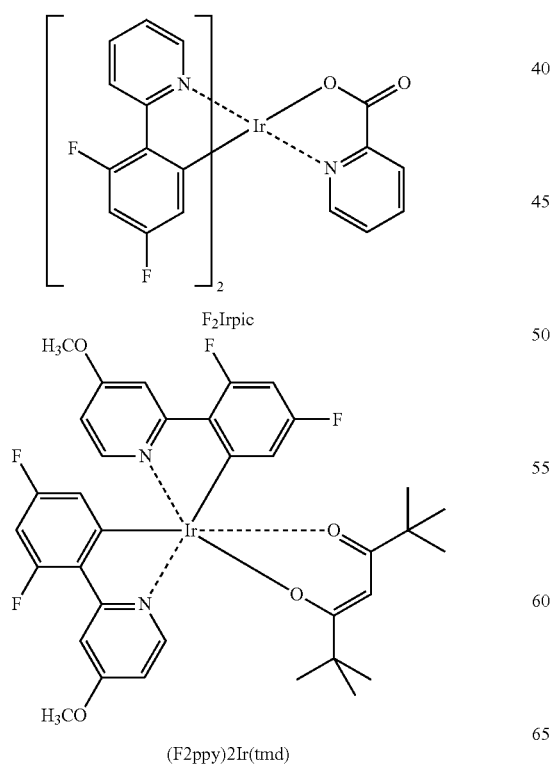
In some embodiments, the emission layer 150 may include a blue dopant, a green dopant, or a red dopant.
Non-limiting examples of the blue dopant are compounds represented by the following formulae.
F2Irpic
(F2ppy)2Ir(tmd)
-continued
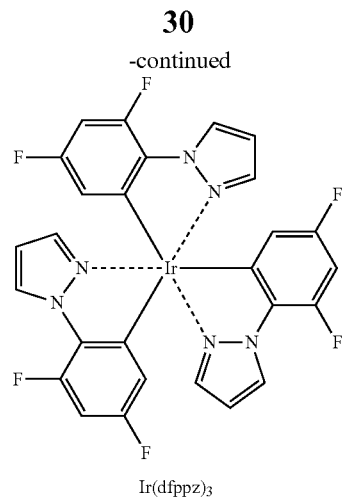
Ir(dfppz)3
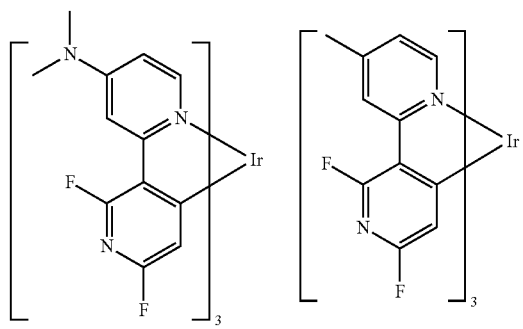
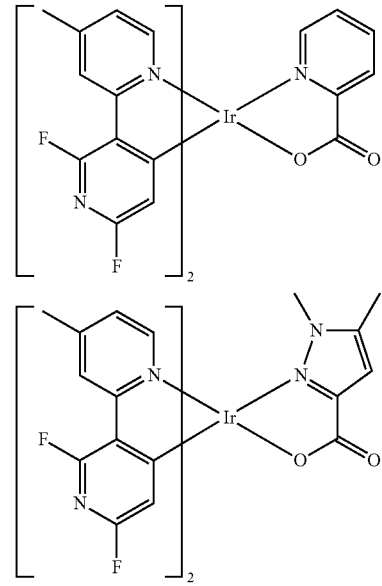

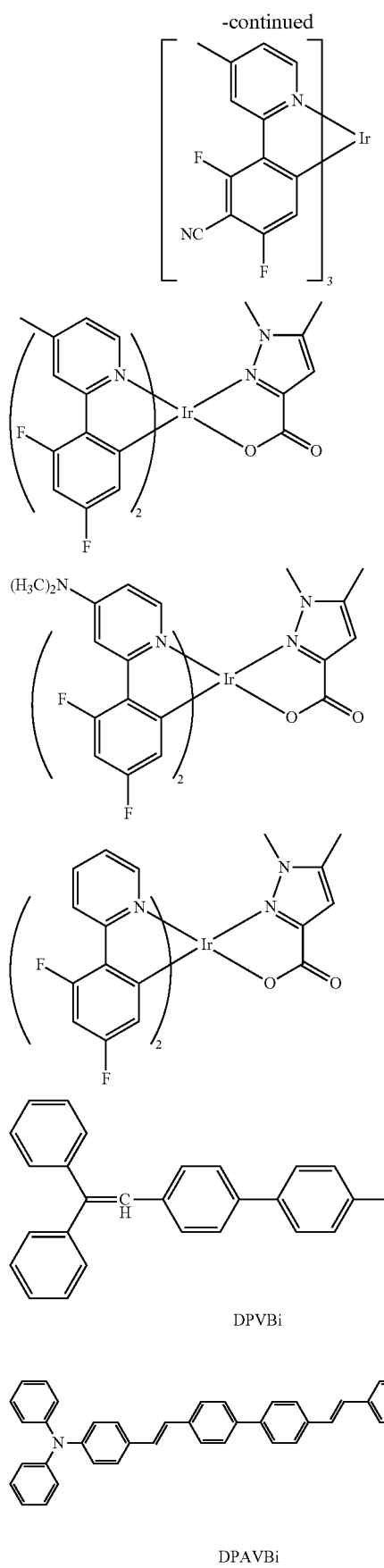
DPVBi
DPAVBi
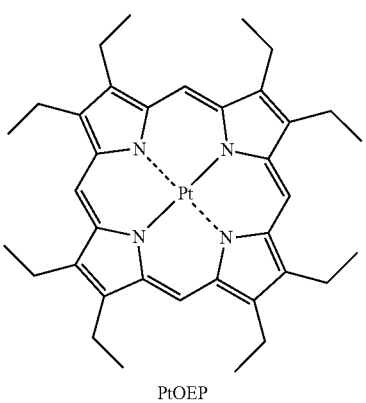
TBPe
Non-limiting examples of the red dopant are compounds represented by the following formulae. In some embodiments, the red dopant may be DCM or DCJTB, which will be described later.
PtOEP
Ir(piq)₃  Btp₂Ir(acac)
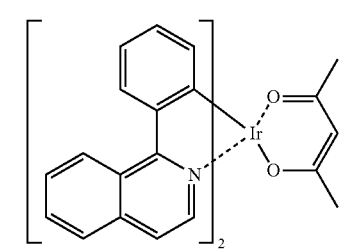

-continued
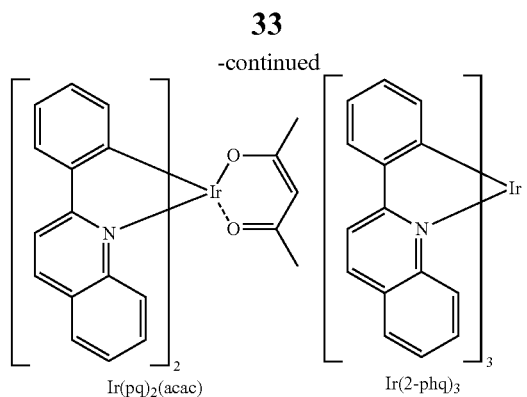
Ir(pq)₂(acac)    Ir(2-phq)₃
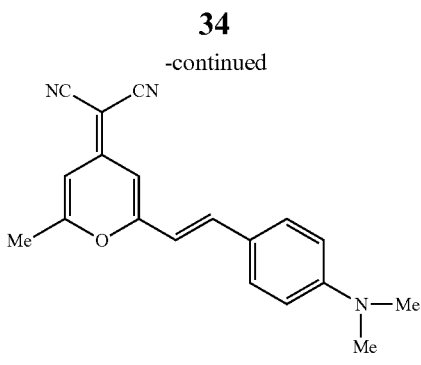
DCM
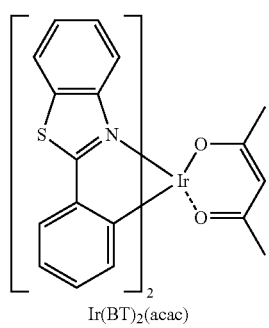
Ir(BT)₂(acac)
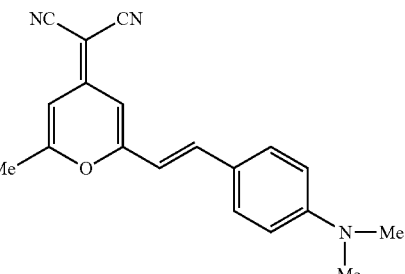
DCJTB
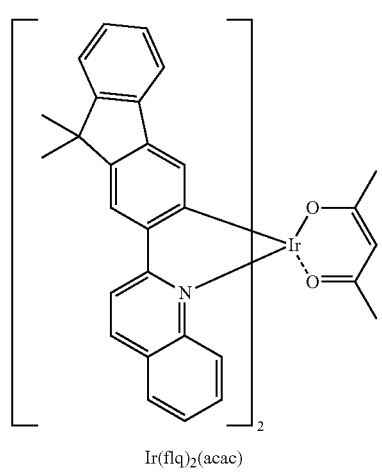
Ir(flq)₂(acac)
Compound RD1
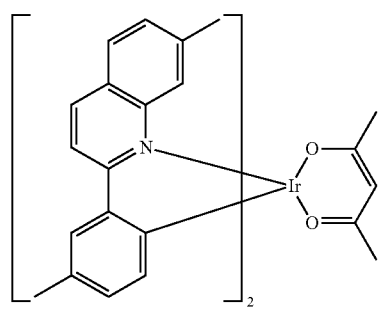
Compound RD2
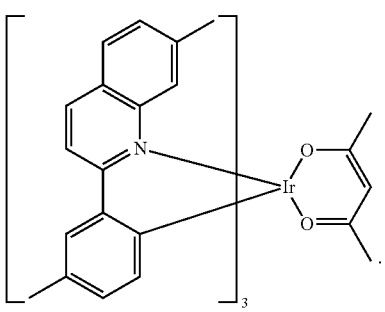
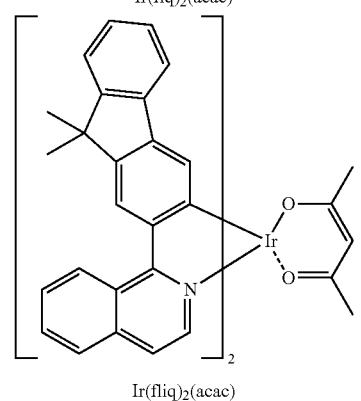
Ir(fliq)₂(acac)
Non-limiting examples of the green dopant are compounds represented by the following formulae. In an embodiment, the green dopant may be C545T represented below.

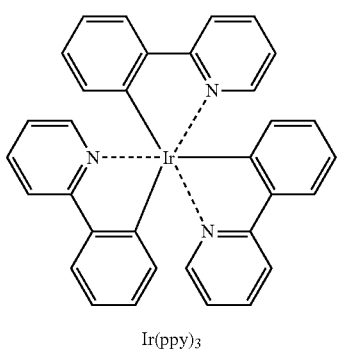
Ir(ppy)₃
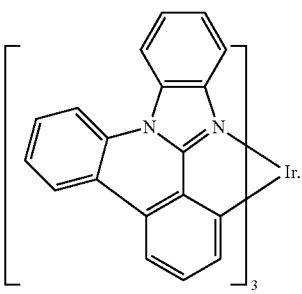
Compound GD2
Non-limiting examples of the dopant that may be used in the emission layer are complexes represented by the following formulae.
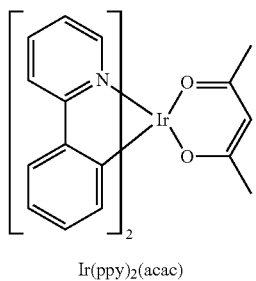
Ir(ppy)₂(acac)
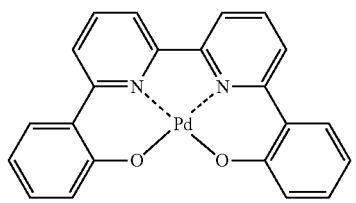
D1
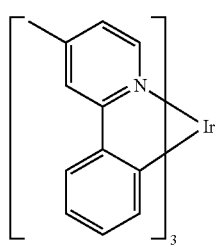
Ir(mpyp)₃
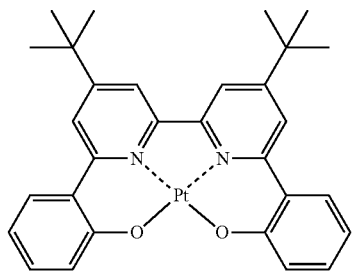
D2
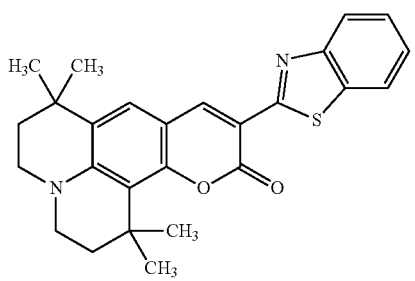
C545T
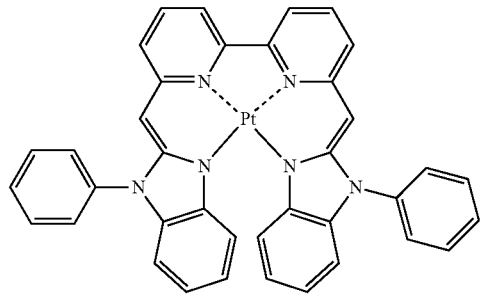
D3
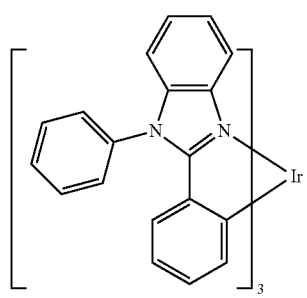
Compound GD1
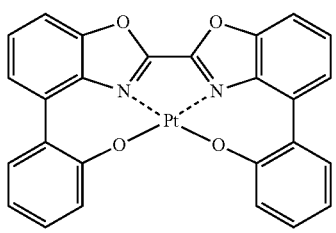
D4

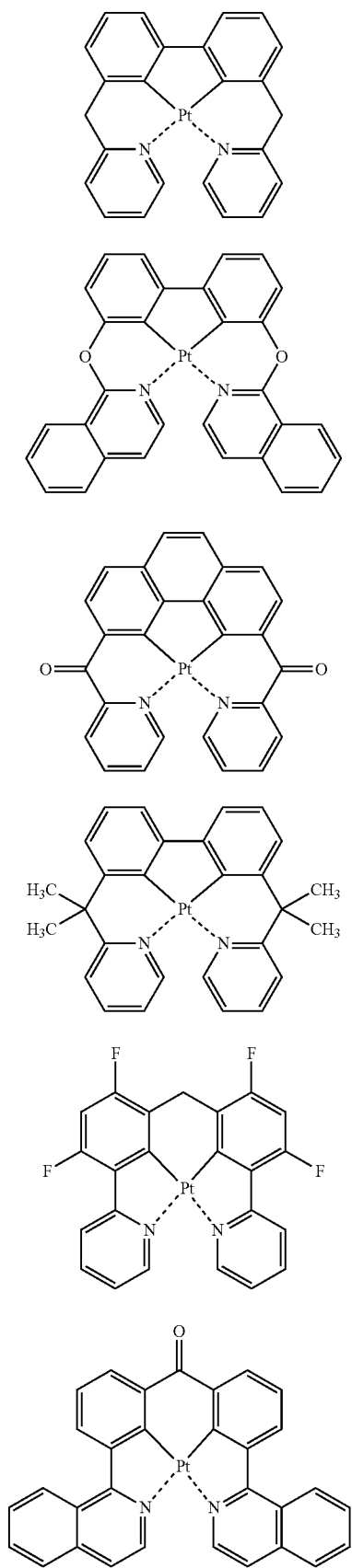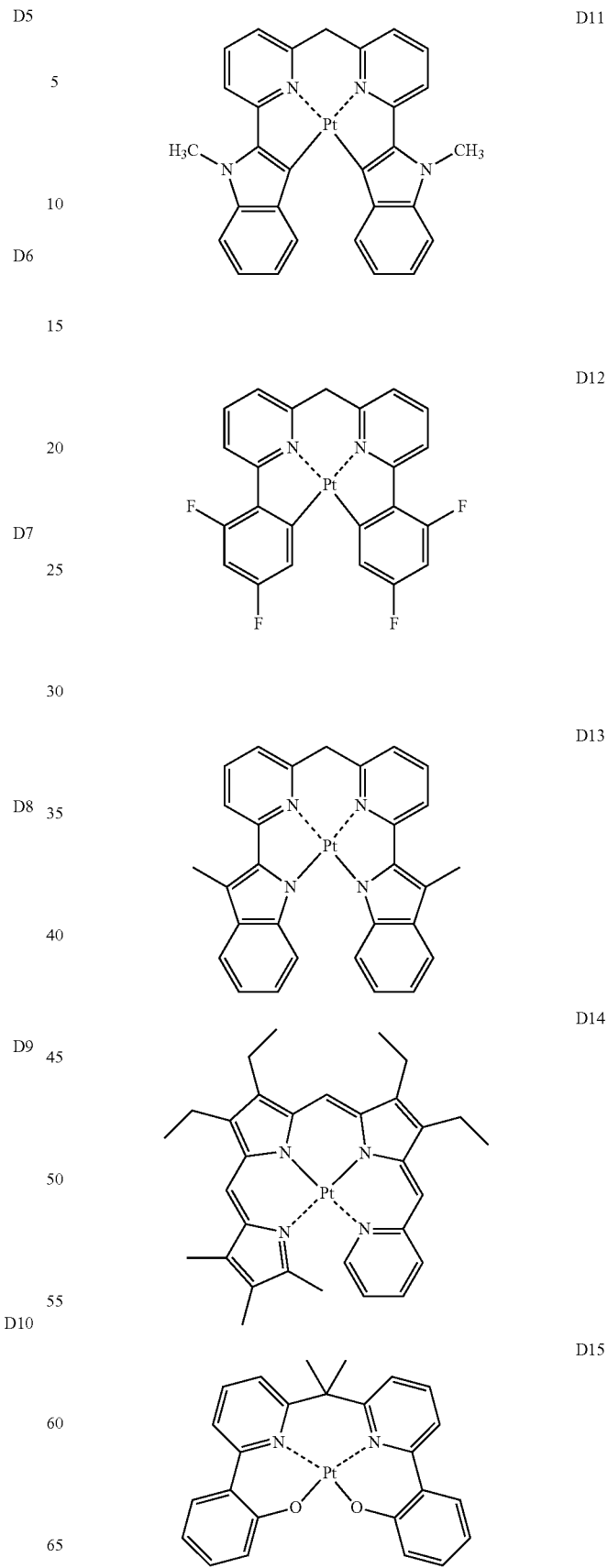

D16
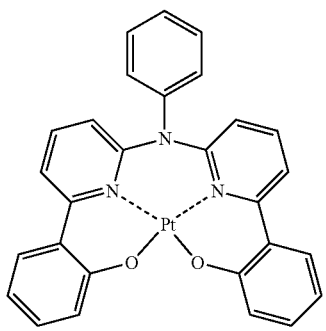
D17
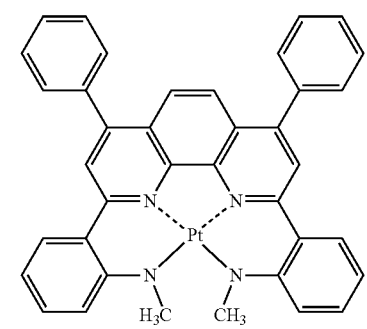
D18
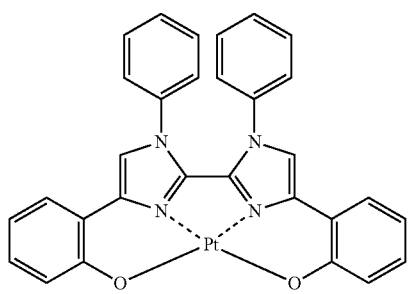
D19
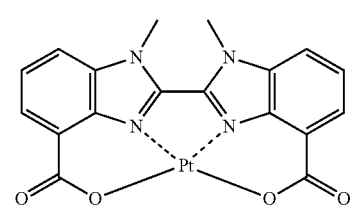
D20
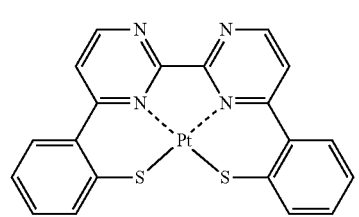
D21
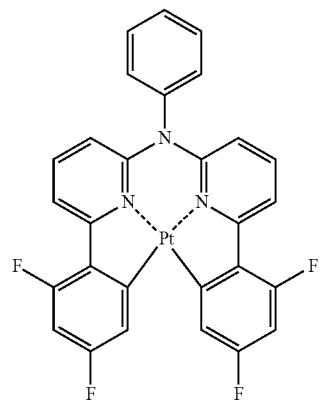
D22
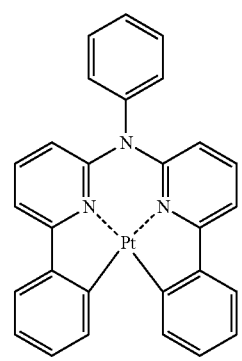
D23
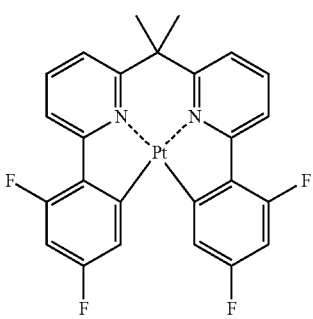
D24
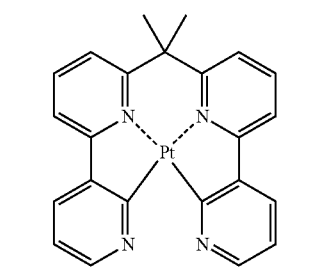
D25
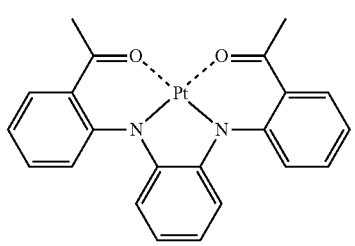

D26 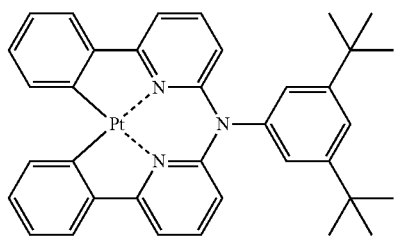
D27 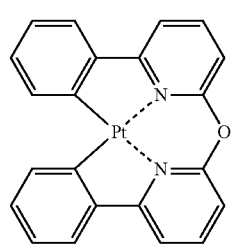
D28 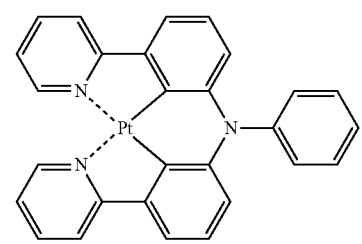
D29 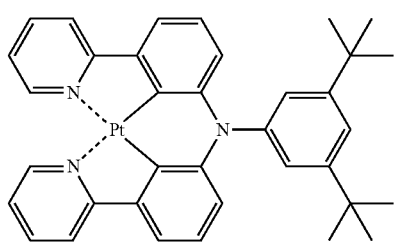
D30 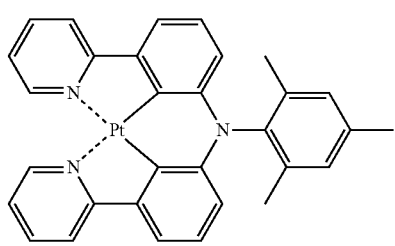
D31 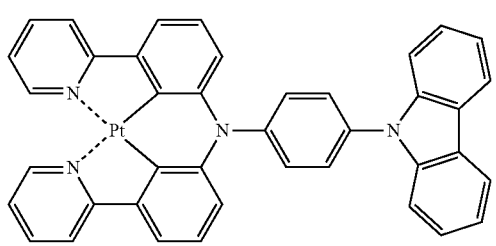
D32 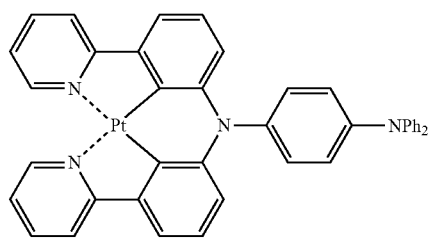
D33 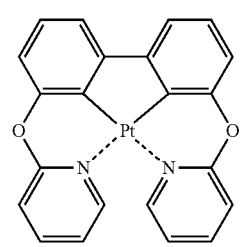
D34 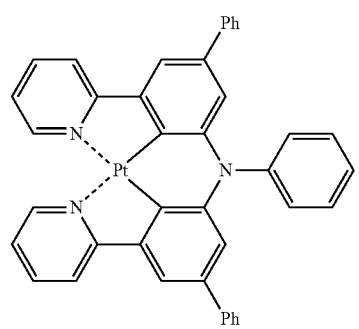
D35 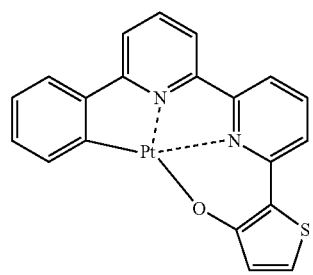
D36 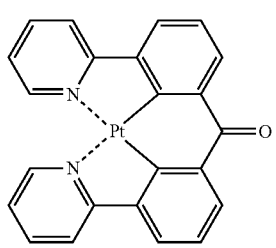

-continued
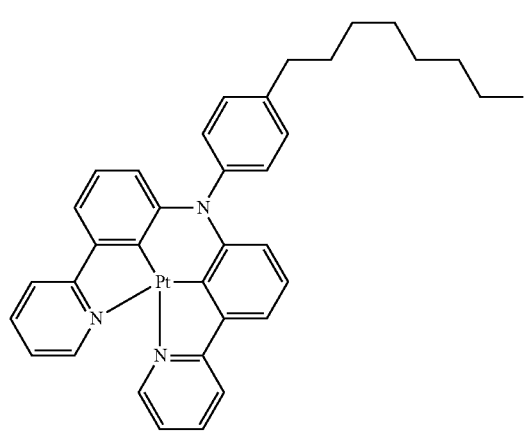 D37
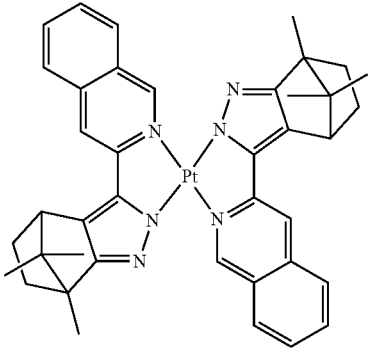 D42
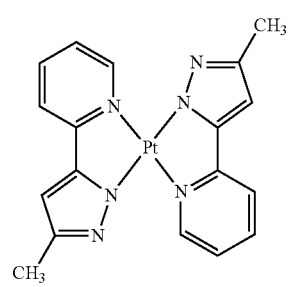 D38
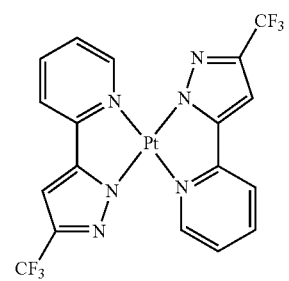 D43
D39
D44
D40
D45
D41
D46

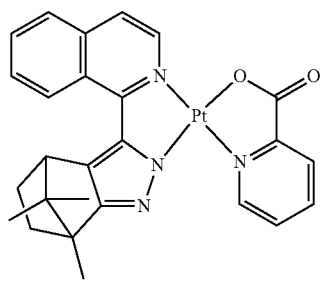

D47

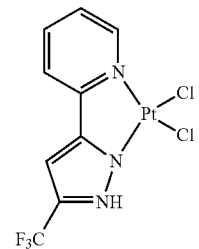

D48

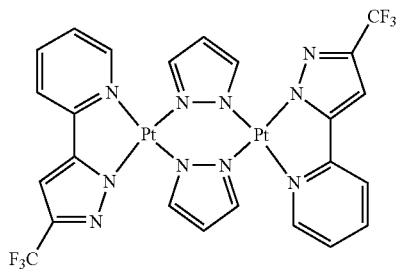

D49

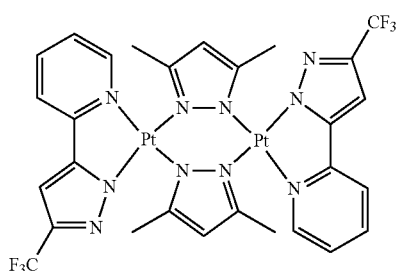

D50

Non-limiting examples of the dopant that may be used in the emission layer are Os complexes represented by the following formulae.

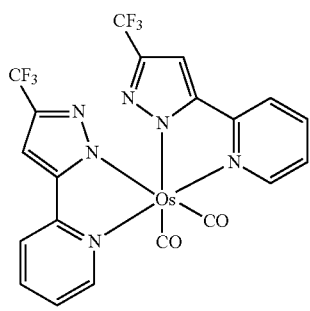

Os(fppz)₂(CO)₂

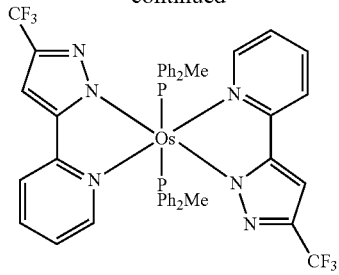

Os(fppz)₂(PPh₂)Me)₂

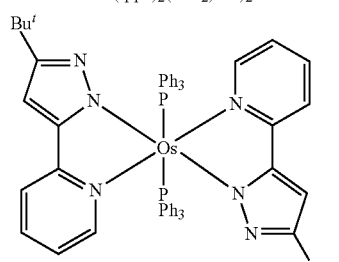

Os(bppz)₂(PPh₃)₂

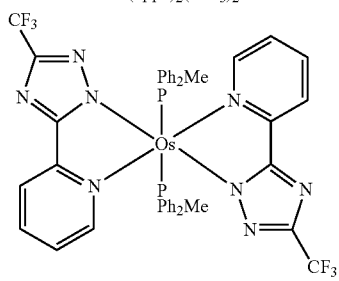

Os(fptz)₂(PPh₂Me)₂

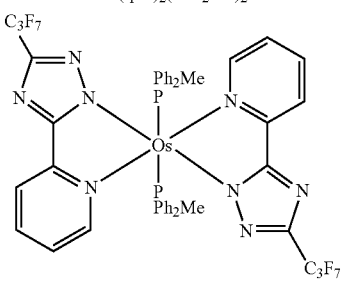

Os(hptz)₂(PPhMe₂)₂

When the emission layer 150 includes both a host and a dopant, the amount of the dopant may be, but is not limited to, from about 0.01 to about 15 parts by weight based on 100 parts by weight of the host.

In some embodiments, a thickness of the emission layer 150 may be from about 100 Å to about 1000 Å, and in some embodiments, may be from about 100 Å to about 600 Å. When the thickness of the emission layer 150 is within these ranges, the emission layer 160 may have improved light emitting ability without a substantial increase in driving voltage.

In some embodiments, the emission layer 150 may include a red emission layer, a green emission layer, and a blue emission layer that are patterned within a red sub-pixel, a green sub-pixel, and a blue sub-pixel, respectively, or may include a stack of a red emission layer, green emission layer and a blue emission layer that are sequentially stacked upon one other and thus may emit white light. The emission layer 150 is not limited thereto and may have any of a variety of structures. For example, the emission layer 150 may include a blue emission layer emitting blue light, but is not limited thereto.

In some embodiments, the electron transport layer 160 is on the emission layer 150, wherein the electron transport layer 160 is a stack of the first electron transport unit 10 including the first layer 11, the first mixed layer 13, the second layer 15, the second mixed layer 17, and the third layer 19, and the second electron transport unit 20 including the first layer 21, the first mixed layer 23, the second layer 25, the second mixed layer 27, and the third layer 29.

In some embodiments, the first layers 11 and 21, the second layers 15 and 25, and the third layers 19 and 29 may each include electron migration-facilitating materials. For example, the first layers 11 and 21, the second layers 15 and 25, and the third layers 19 and 29 may each consist of electron migration-facilitating materials. For example, the first layers 11 and 21, the second layers 15 and 25, and the third layers 19 and 29 may exclude the electron-transporting organic materials in the first mixed layers 13 and 23, and the second mixed layers 17 and 27, which will be described below.

In some embodiments, the electron migration-facilitating material in the first layers 11 and 21, the electron migration-facilitating material in the second layers 15 and 25, and the electron migration-facilitating material in the third layers 19 and 29 may each be one electron migration-facilitating material or a mixture of at least two different electron migration-facilitating materials.

In some embodiments, the electron migration-facilitating material in the first layers 11 and 21, the electron migration-facilitating material in the second layers 15 and 25, and the electron migration-facilitating material in the third layers 19 and 29 may be the same. In some embodiments, at least two of the electron migration-facilitating material in the first layers 11 and 21, the electron migration-facilitating material in the second layers 15 and 25, and the electron migration-facilitating material in the third layers 19 and 29 may differ from one another.

In some embodiments, the electron migration-facilitating material in the first layers 11 and 21 may differ from the electron migration-facilitating material in the third layers 19 and 29, and the second layers 15 and 25 may each consist of the electron migration-facilitating material in the first layer 11 and 21 and the electron migration-facilitating material in the third layers 19 and 29.

In some embodiments, the electron migration-facilitating material in the first layers 11 and 21, the electron migration-facilitating material in the second layers 15 and 25, and the electron migration-facilitating materials in the third layers 19 and 29 may each independently include a n-dopant. For example, the electron migration-facilitating material in the first layers 11 and 21, the electron migration-facilitating material in the second layers 15 and 25, and the electron migration-facilitating materials in the third layers 19 and 29 may each independently include at least one of a Li complex, LiF, CsF, $Al_2O_3$, $SiO_2$, $Si_3N_4$, and $Cs_2CO_3$, but are not limited thereto. In some other embodiments, the electron migration-facilitating material in the first layers 11 and 21, the electron migration-facilitating material in the second layers 15 and 25, and the electron migration-facilitating materials in the third layers 19 and 29 may each independently include Compound 250 or Compound 251, but are not limited thereto:

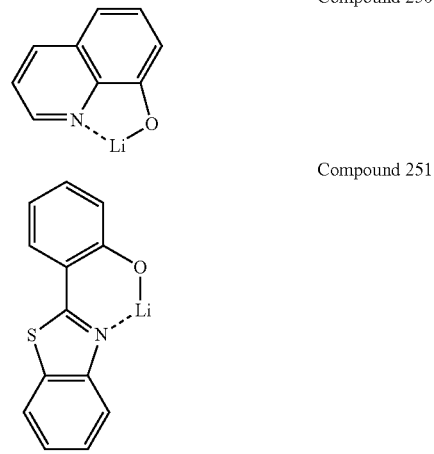

Compound 250

Compound 251

For example, the first layers 11 and 21, the second layers 15 and 25, and the third layers 19 and 29 each may consist of Compound 250 above, but are not limited thereto.

In some embodiments, the first layers 11 and 21, the second layers 15 and 25, and the third layers 19 and 29 may each independently have a thickness of from about 0.1 Å to about 500 Å, and in some embodiments, a thickness of from about 1 Å to about 200 Å, and in some other embodiments, a thickness of from about 1 Å to about 10 Å. When the thicknesses of the first layers 11 and 21, the second layers 15 and 25, and the third layers 19 and 29 are within these ranges, improved electron injection characteristics may be obtained without a substantial increase in driving voltage.

For examples, the thicknesses of the first layers 11 and 21 may be the same as those of the third layers 19 and 29.

In some embodiments, the thicknesses of the first layers 11 and 21 may be the same as those of the third layers 19 and 29, and the thicknesses of the second layers 15 and 25 may be twice those of the first layers 11 and 21. However, the present invention is not limited thereto.

In some embodiments, the first mixed layers 13 and 23 and the second mixed layers 17 and 27 each include an electron-transporting organic material and an electron migration-facilitating material.

In some embodiments, at least one of the electron migration-facilitating material in the first layers 11 and 21, the electron migration-facilitating material in the second layers 15 and 25, and the electron migration-facilitating material in the third layers 19 and 29 may be the same as at least one of the electron migration-facilitating material in the first mixed layers 13 and 23 and the electron migration-facilitating material in the second mixed layers 17 and 27.

In some embodiments, the electron migration-facilitating material in the first layers 11 and 21, the electron migration-facilitating material in the second layers 15 and 25, the electron migration-facilitating material in the third layers 19 and 29, the electron migration-facilitating material in the first mixed layers 13 and 23, and the electron migration-facilitating material in the second mixed layers 17 and 27 may be the same.

For example, the first layers 11 and 21, the second layers 15 and 25, and the third layers 19 and 29 may consist of Compound 250, and the electron migration-facilitating materials in the first mixed layers 13 and 23 and in the second mixed layers 17 and 27 may be Compound 250, but are not limited thereto.

With regard to the electron migration-facilitating materials in the first mixed layers 13 and 23 and in the second mixed layers 17 and 27, the detailed description of the electron migration-facilitating materials provided above in conjunction with the first layer 11 and 21, the second layers 15 and 25, and the third layers 19 and 29 may be referred to herein.

In some embodiments, the electron-transporting organic materials in the first mixed layers 13 and 23 and the second mixed layers 17 and 27 may be selected from among the materials known as electron transport layer materials with good electron transporting characteristics for use in organic light-emitting diodes.

In some embodiments, the electron-transporting organic material in the first mixed layers 13 and 23 and the electron-transporting organic material in the second mixed layers 17 and 27 may be the same as or differ from each other. For example, the electron-transporting organic material in the first mixed layers 13 and 23 and the electron-transporting organic material in the second mixed layers 17 and 27 may be the same, but are not limited thereto.

In some embodiments, the electron-transporting organic material in the first mixed layers 13 and 23 and the electron-transporting organic material in the second mixed layers 17 and 27 may each independently include at least one of i) compounds of Formulae 10A, 10B, and 10C, and ii) a compound of Formula 20A below:

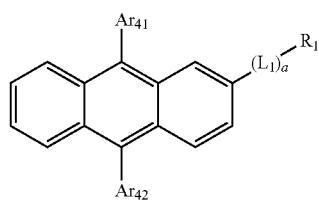

Formula 10A

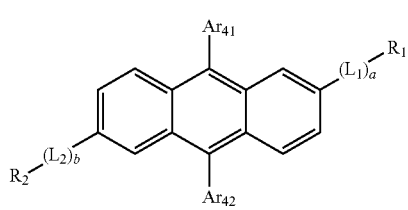

Formula 10B

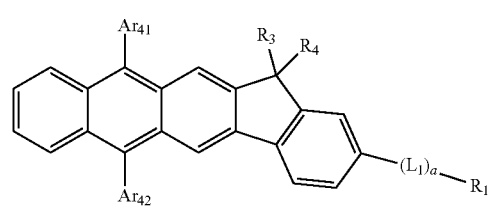

Formula 10C

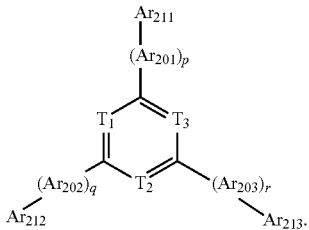

Formula 20A

In Formulae 10A to 10C, $Ar_{41}$ and $Ar_{42}$ may be each independently selected from a substituted or unsubstituted $C_6$-$C_{60}$aryl group, and a substituted or unsubstituted $C_2$-$C_{60}$ heteroaryl group.

For example, $Ar_{41}$ and $Ar_{42}$ may be each independently selected from a $C_6$-$C_{60}$aryl group and a $C_2$-$C_{60}$ heteroaryl group; and a $C_6$-$C_{60}$aryl group and a $C_2$-$C_{60}$ heteroaryl group, substituted with at least one of a deuterium atom, —F, —Cl, —Br, —I, —CN, a hydroxyl group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_1$-$C_{60}$alkoxy group, a $C_2$-$C_{60}$ alkenyl group, a $C_2$-$C_{60}$alkynyl group, a $C_6$-$C_{60}$aryl group, and a $C_2$-$C_{60}$ heteroaryl group.

For example, $Ar_{41}$ and $Ar_{42}$ may be each independently selected from a phenyl group, a naphthyl group, an anthryl group, a pyrenyl group, a fluorenyl group, a pyridinyl group, a pyrazinyl group, and a pyrimidinyl group; and a phenyl group, a naphthyl group, an anthryl group, a pyrenyl group, a fluorenyl group, a pyridinyl group, a pyrazinyl group, and a pyrimidinyl group, substituted with at least one of a phenyl group, a naphthyl group, an anthryl group, a pyrenyl group, a fluorenyl group, a pyridinyl group, a pyrazinyl group, and a pyrimidinyl group.

$Ar_{41}$ and $Ar_{42}$ may be the same, but are not limited thereto.

In Formulae 10A to 10C, $L_1$ and $L_2$ may be each independently selected from a substituted or unsubstituted $C_6$-$C_{60}$arylene group, and a substituted or unsubstituted $C_2$-$C_{60}$ hetero arylene group.

For example, $L_1$ and $L_2$ may be each independently selected from a $C_6$-$C_{60}$ arylene group and a $C_2$-$C_{60}$ hetero arylene group; and a $C_6$-$C_{60}$ arylene group and a $C_2$-$C_{60}$ hetero arylene group, substituted with at least one of a deuterium atom, —F, —Cl, —Br, —I, —CN, a hydroxyl group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_1$-$C_{60}$alkoxy group, a $C_2$-$C_{60}$ alkenyl group, a $C_2$-$C_{60}$alkynyl group, a $C_6$-$C_{60}$aryl group, and a $C_2$-$C_{60}$ heteroaryl group.

In some other embodiments, $L_1$ and $L_2$ may be each independently selected from a phenylene group, a naphthylene group, an anthrylene group, a pyrenylene group, a fluorenylene group, a pyridinylene group, a pyrazinylene group, and a pyrimidinylene group; and a phenylene group, a naphthylene group, an anthrylene group, a pyrenylene group, a fluorenylene group, a pyridinylene group, a pyrazinylene group, and a pyrimidinylene group, substituted with at least one of a phenyl group, a naphthyl group, an anthryl group, a pyrenyl group, a fluorenyl group, a pyridinyl group, a pyrazinyl group, and a pyrimidinyl group, but are not limited thereto.

In Formulae 10A to 10C, a and b may be each independently 0, 1 or 2. For example, in Formulae 10A to 10C, a and b may be each independently 0 or 1.

In Formulae 10A to 10C, $R_1$ and $R_2$ may be each independently selected from a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolyl group, a substituted or unsubstituted isoquinolyl group, a substituted or unsubstituted quinazolyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, and a substituted or unsubstituted phenanthrenyl group.

For example, in Formulae 10A to 10C, $R_1$ and $R_2$ may be each independently selected from a benzoimidazolyl group, a benzoxazolyl group, a benzothiazolyl group, a benzopyrimidinyl group, an imidazopyridinyl group, a quinolyl group, an isoquinolyl group, a quinazolyl group, a pyridinyl group, a pyrimidinyl group, a pyrazinyl group, a phenyl group, a naphthyl group, a pyrenyl group, a chrysenyl group, a fluorenyl group, and a phenanthrenyl group; and a benzoimidazolyl group, a benzoxazolyl group, a benzothiazolyl group, a benzopyrimidinyl group, an imidazopyridinyl group, a quinolyl group, an isoquinolyl group, a quinazolyl group, a pyridinyl group, a pyrimidinyl group, a pyrazinyl group, a phenyl group, a naphthyl group, a pyrenyl group, a chrysenyl group, a fluorenyl group, and a phenanthrenyl group, substituted with at least one of a deuterium atom, —F, —Cl, —Br, —I, —CN, a hydroxyl group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_1$-$C_{60}$alkoxy group, a $C_2$-$C_{60}$alkenyl group, a $C_2$-$C_{60}$alkynyl group, a $C_6$-$C_{60}$aryl group, and a $C_2$-$C_{60}$ heteroaryl group.

In Formula 10C, $R_3$ and $R_4$ may be each independently selected from a $C_1$-$C_{20}$alkyl group, and a $C_6$-$C_{20}$aryl group; and a $C_1$-$C_{20}$alkyl group, and a $C_2$-$C_{20}$aryl group, substituted with at least one of a deuterium atom, —F, —Cl, —Br, —I, —CN, a hydroxyl group, a nitro group, an amino group, an amidino group, a hydrazine, a hydrazone, a carboxyl group or a salt thereof, a sulfonic acid group or a salt thereof, and a phosphoric acid group or a salt thereof. For example, $R_3$ and $R_4$ may be each independently selected from a methyl group, an ethyl group, a propyl group, a butyl group, a pentyl group, a hexyl group, a phenyl group, and a naphthyl group, but are not limited thereto.

For example, $R_1$ and $R_2$ may be each independently one of Formulae 11(1) to 11(24), but are not limited thereto:

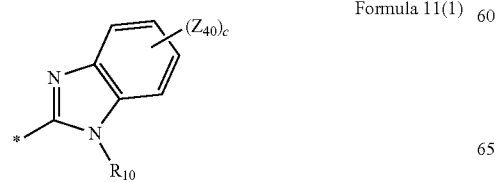

Formula 11(1)

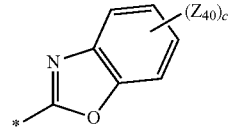

Formula 11(2)

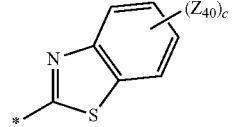

Formula 11(3)

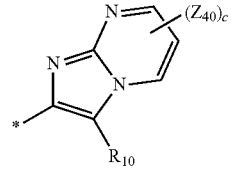

Formula 11(4)

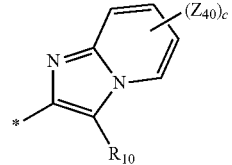

Formula 11(5)

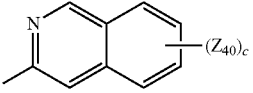

Formula 11(6)

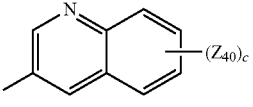

Formula 11(7)

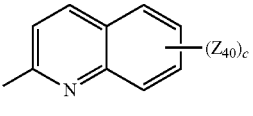

Formula 11(8)

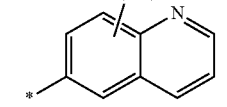

Formula 11(9)

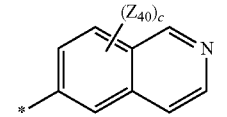

Formula 11(10)

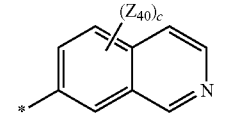

Formula 11(11)

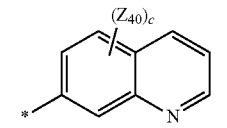

Formula 11(12)

Formula 11(13)
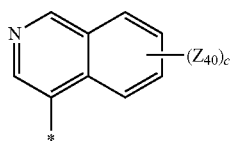

Formula 11(14)
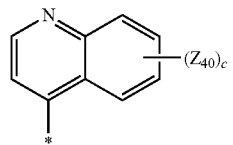

Formula 11(15)
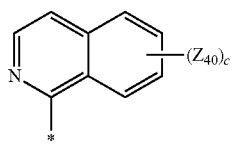

Formula 11(16)
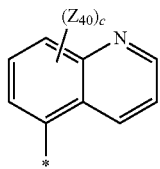

Formula 11(17)
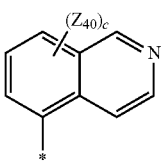

Formula 11(18)
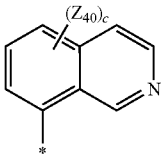

Formula 11(19)
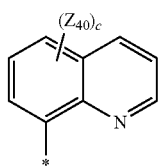

Formula 11(20)
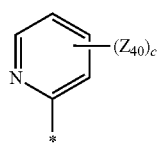

Formula 11(21)
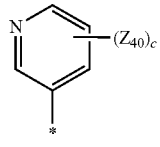

Formula 11(22)
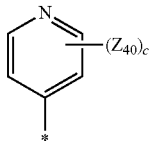

Formula 11(23)

Formula 11(24)

In Formulae 11(1) to 11(24), $R_{10}$ may be selected from a substituted or unsubstituted $C_1$-$C_{60}$alkyl group, and a substituted or unsubstituted $C_6$-$C_{60}$aryl group;

$Z_{40}$ may be selected from a hydrogen atom, a deuterium atom, —F, —Cl, —Br, —I, —CN, a hydroxyl group, —NO$_2$, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_1$-$C_{60}$alkoxy group, a $C_6$-$C_{60}$aryl group, and a $C_2$-$C_{60}$ heteroaryl group; and a $C_1$-$C_{60}$alkyl group, a $C_1$-$C_{60}$alkoxy group, a $C_6$-$C_{60}$aryl group, and a $C_2$-$C_{60}$ heteroaryl group, substituted with at least one a deuterium atom, —F, —Cl, —Br, —I, —CN, a hydroxyl group, a nitro group, an amino group, an amidino group, a hydrazine, a hydrazone, a carboxyl group or a salt thereof, a sulfonic acid group or a salt thereof, and a phosphoric acid group or a salt thereof; and c may be an integer from 1 to 5.

For example, $R_{10}$ may be selected from a methyl group, an ethyl group, a propyl group, a butyl group, a pentyl group, a hexyl group, a heptyl group, an octyl group, a phenyl group, a naphthyl group, an anthryl group, a fluorenyl group, and a phenanthrenyl group; a methyl group, an ethyl group, a propyl group, a butyl group, a pentyl group, a hexyl group, a heptyl group, an octyl group, a phenyl group, a naphthyl group, an anthryl group, a fluorenyl group, and a phenanthrenyl group, substituted with at least one of a deuterium atom, —F, —Cl, —Br, —I, —CN, a hydroxyl group, a nitro group, an amino group, an amidino group, a hydrazine, a hydrazone, a carboxyl group or a salt thereof, a sulfonic acid group or a salt thereof, and a phosphoric acid group or a salt thereof.

In some embodiments, at least one of the electron-transporting organic material in the first mixed layer 13 and 23 and the electron-transporting organic material in the second mixed layer 17 and 27 may include a compound represented by one of Formulae 10A(1) to 10A(12), 10B(1) to 10B(12), and 10C(1) to 10C(6), but is not limited thereto:

Formula 10A(1)
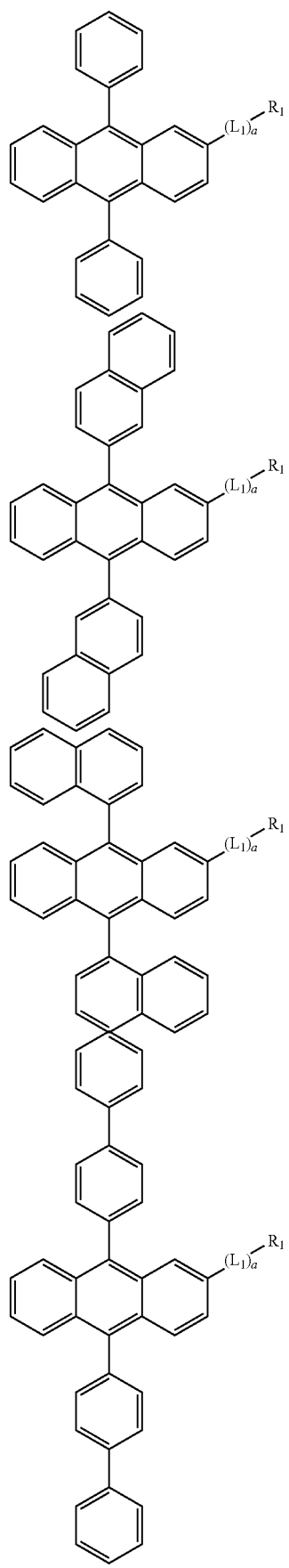
Formula 10A(2)
Formula 10A(3)
Formula 10A(4)
Formula 10A(5)
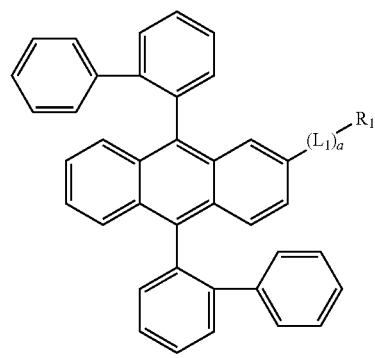
Formula 10A(6)
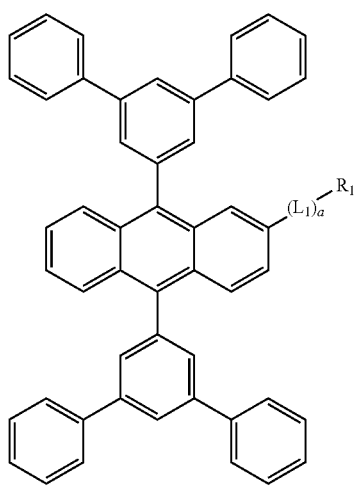
Formula 10A(7)
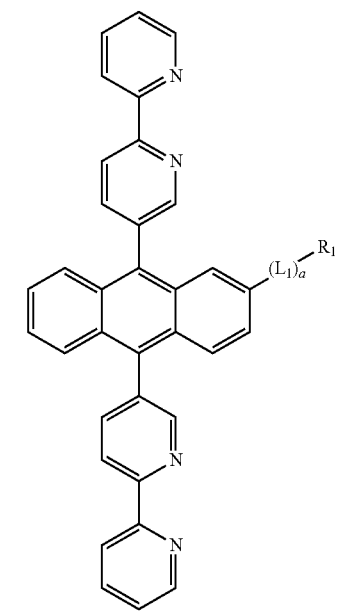

Formula 10A(8)
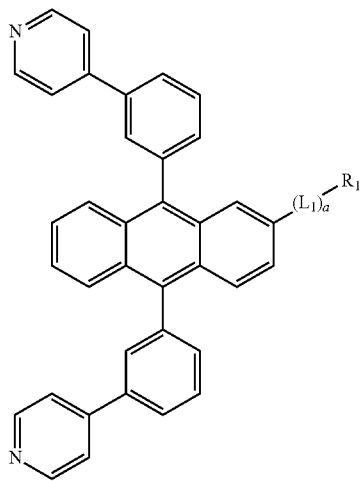
Formula 10A(9)
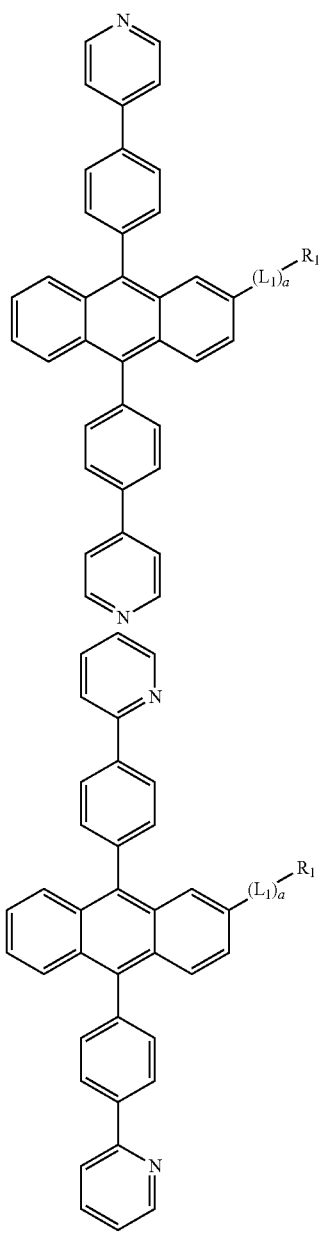
Formula 10A(11)
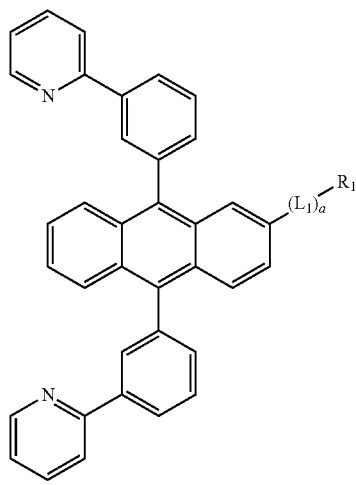
Formula 10A(12)
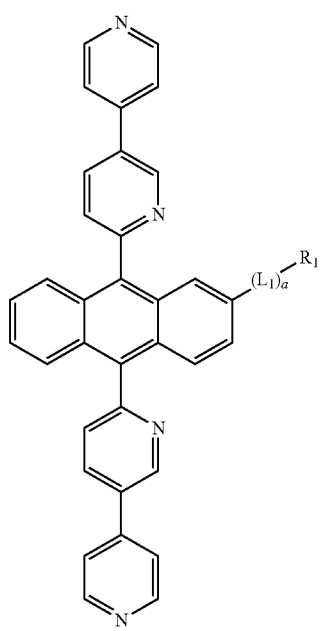
Formula 10B(1)
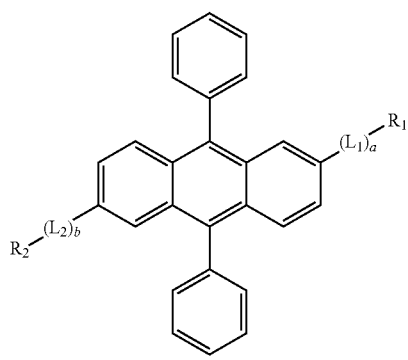

Formula 10B(2)
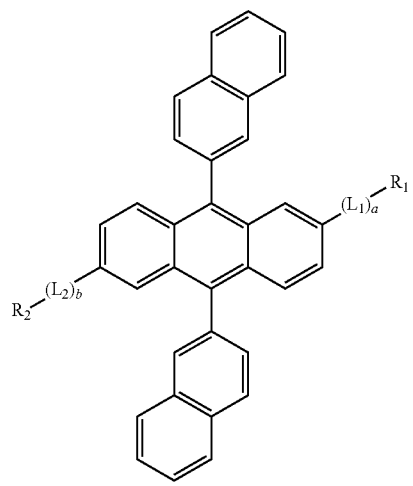
Formula 10B(3)
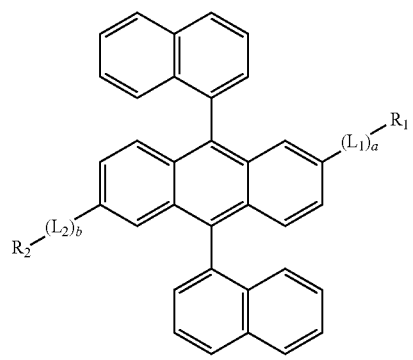
Formula 10B(4)
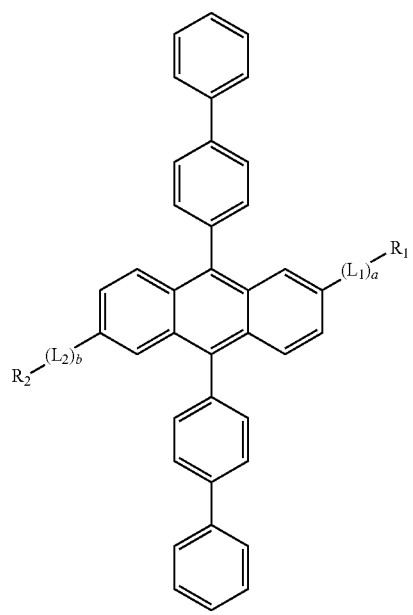
Formula 10B(5)
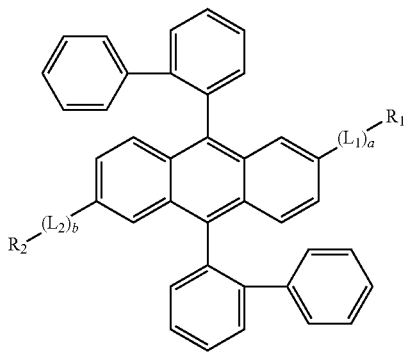
Formula 10B(6)
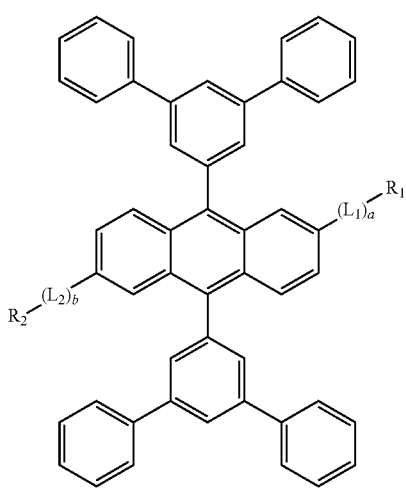
Formula 10B(7)
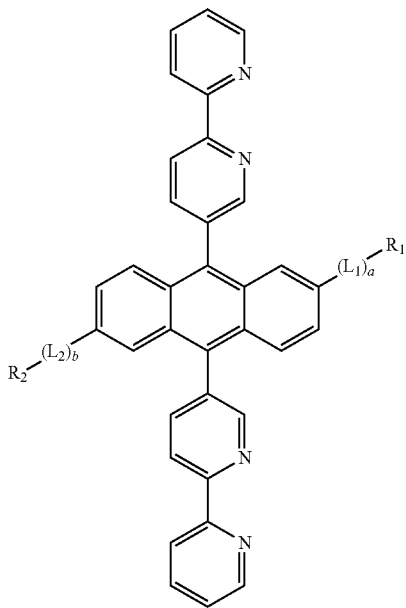

Formula 10B(8)
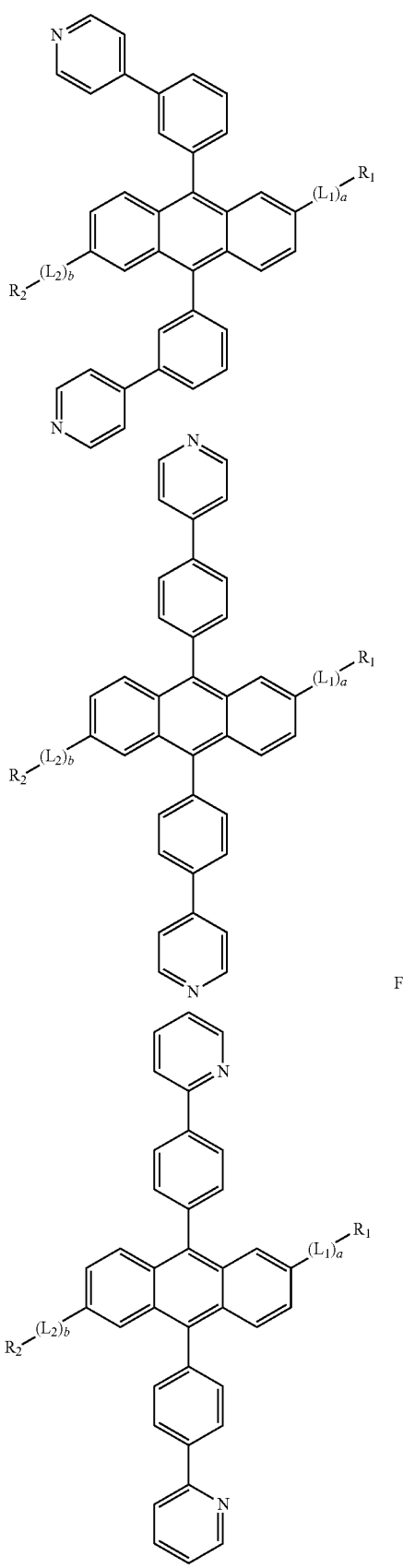
Formula 10B(9)
Formula 10B(10)
Formula 10B(11)
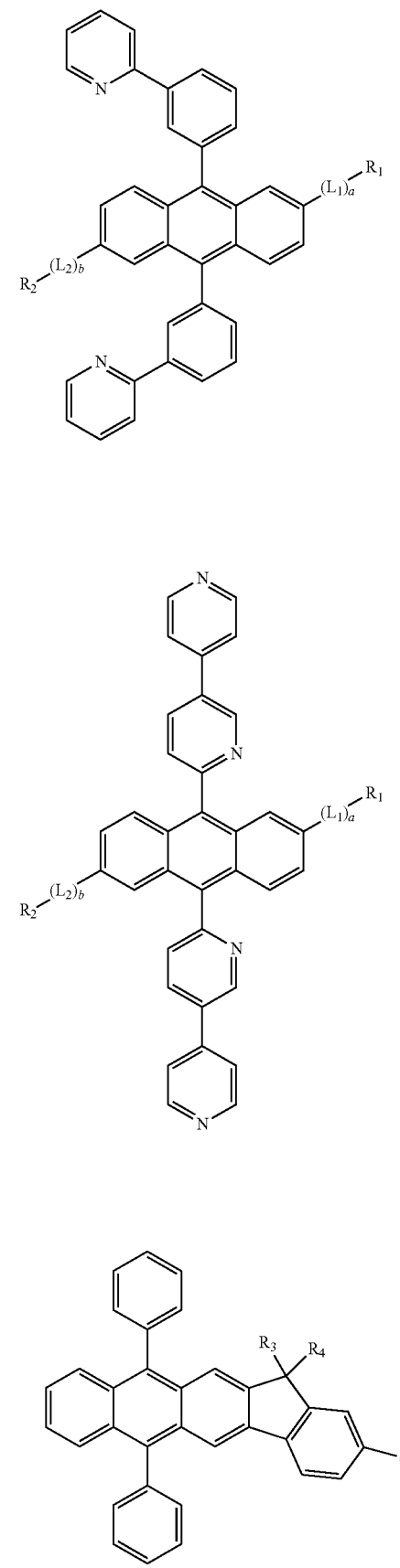
Formula 10B(12)
Formula 10C(1)

Formula 10C(2)

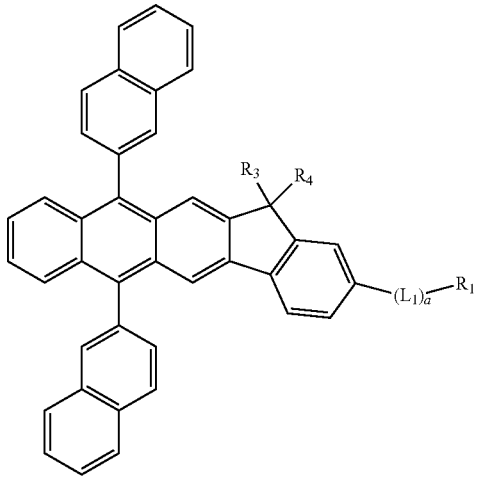

Formula 10C(3)

Formula 10C(4)

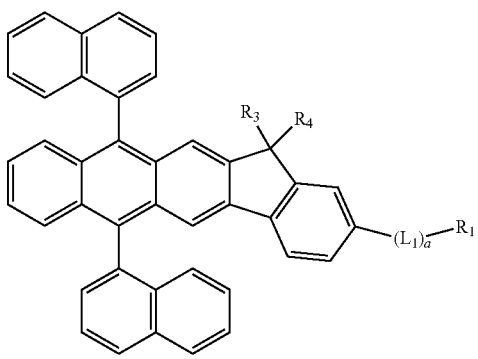

Formula 10C(5)

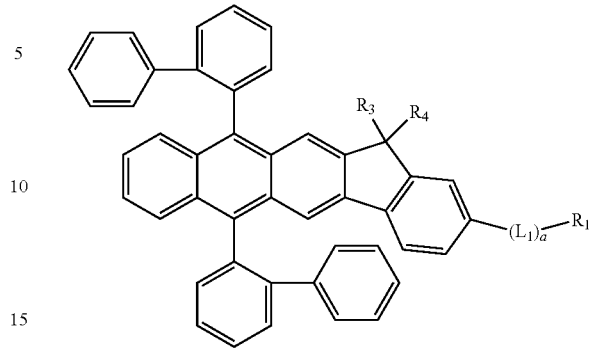

Formula 10c(6)

In Formulae 10A(1) to 10A(12), 10B(1) to 10B(12), and 10C(1) to 10C(6), L1, L2, a, b, and $R_1$ to $R_4$ are as defined above.

In some embodiments, at least one of the electron-transporting organic material in the first mixed layers 13 and 23 and the electron-transporting organic material in the second mixed layers 17 and 27 may include a compound represented by one of Formulae 10A(1) to 10A(6), 10B(1) to 10B(6), and 10C(1) to 10C(6). In this regard, in Formulae 10A(1) to 10A(6), 10B(1) to 10B(6), and 10C(1) to 10C(6), $R_1$ and $R_2$ may be each independently selected from a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolyl group, a substituted or unsubstituted isoquinolyl group, a substituted or unsubstituted quinazolyl group, a substituted or unsubstituted pyridinyl group, a substituted or unsubstituted pyrimidinyl group, and a substituted or unsubstituted pyrazinyl group (for example, one of Formulae 11(1) to 11(22)).

In some embodiment, at least one of the electron-transporting organic material in the first mixed layers 13 and 23 and the electron-transporting organic material in the second mixed layers 17 and 27 may include a compound represented by one of Formulae 10A(1) to 10A(6), 10B(1) to 10B(6), and 10C(1) to 10C(6). In this regard, in Formulae 10A(1) to 10A(6), 10B(1) to 10B(6), and 10C(1) to 10C(6), $R_1$ and $R_2$ may be each independently selected from a substituted or unsubstituted benzoimidazolyl group, a substituted or unsubstituted benzoxazolyl group, and a substituted or unsubstituted benzothiazolyl group (for example, one of Formulae 11(1) to 11(3)).

In some embodiments at least one of the electron-transporting organic material in the first mixed layers 13 and 23 and the electron-transporting organic material in the second mixed layers 17 and 27 may include a compound represented by one of Formulae 10A(7) to 10A(12), and 10B(7) to 10B(12). In this regard, in Formulae 10A(7) to 10A(12), and 10B(7) to 10B(12), $R_1$ and $R_2$ may be each independently selected from a substituted or unsubstituted phenyl group, and a substituted or unsubstituted naphthyl group (for example, Formula 11(23) or 11(24)), but is not limited thereto.

In some embodiments, the electron-transporting organic material in the first mixed layers 13 and 23 and the electron-transporting organic material in the second mixed layers 17 and 27 may be one of Compounds 200 to 210, but is not limited thereto:

Compound 200

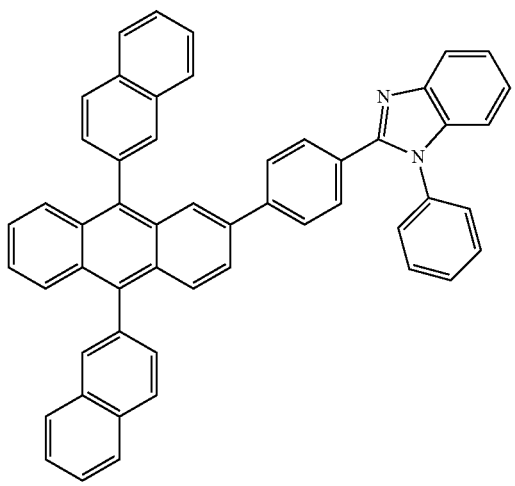

Compound 201

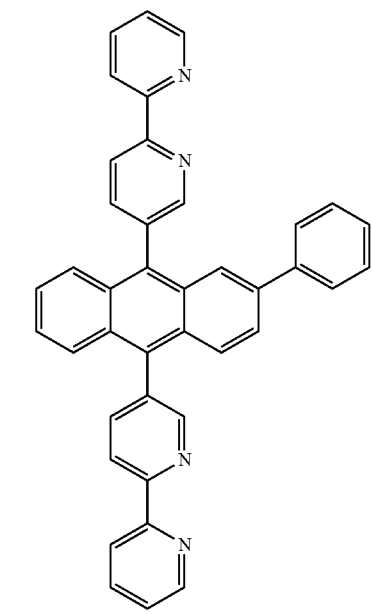

Compound 202

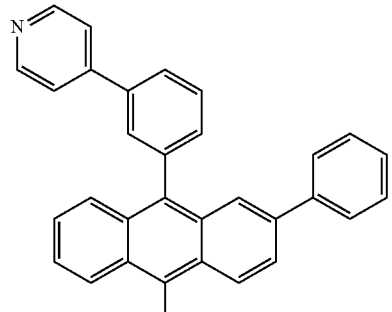

Compound 203

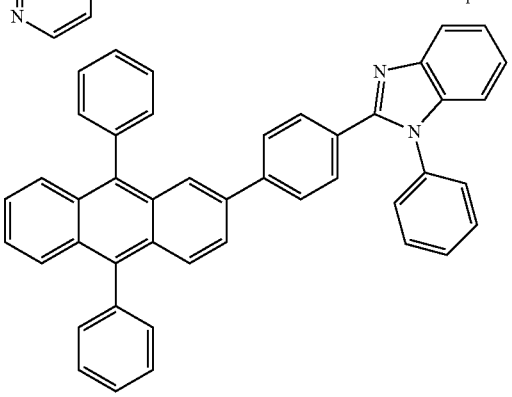

Compound 204

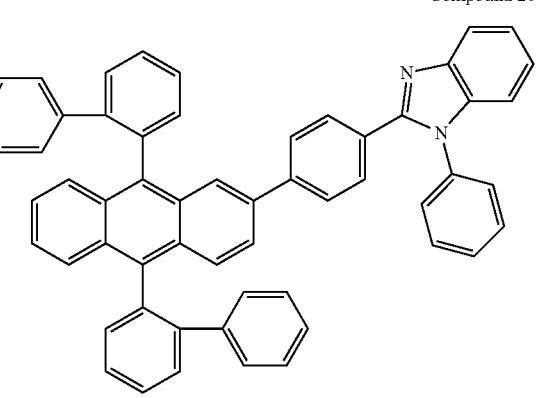

Compound 205

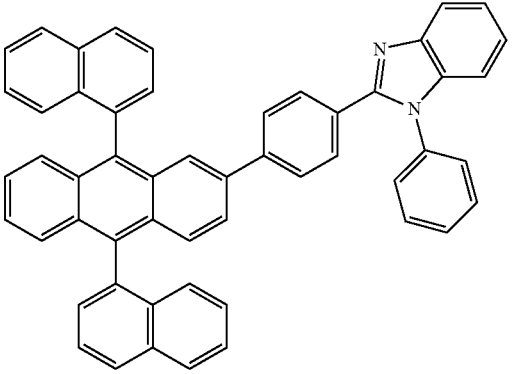

Compound 206
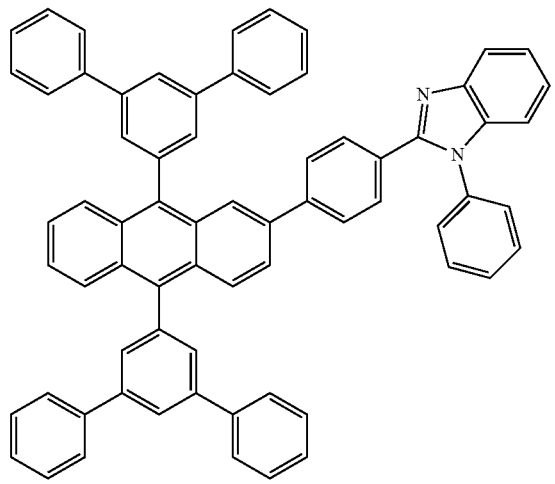

Compound 207
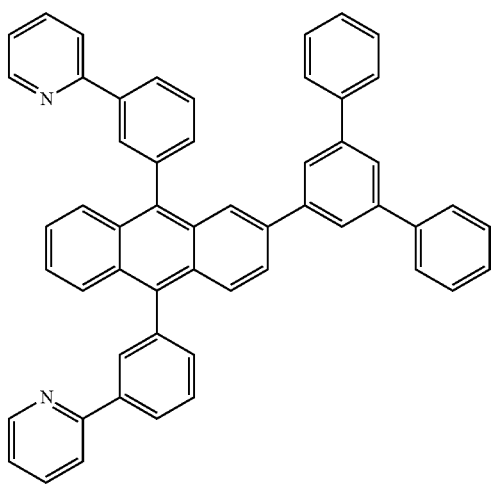

Compound 208
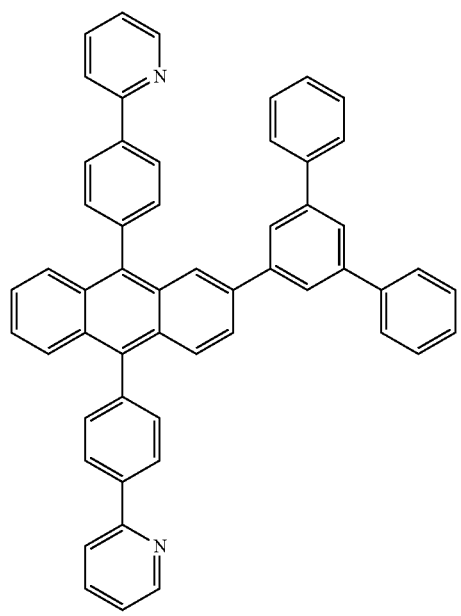

Compound 209
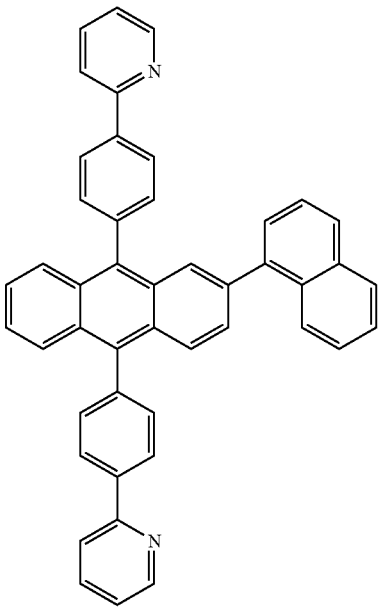

Compound 210
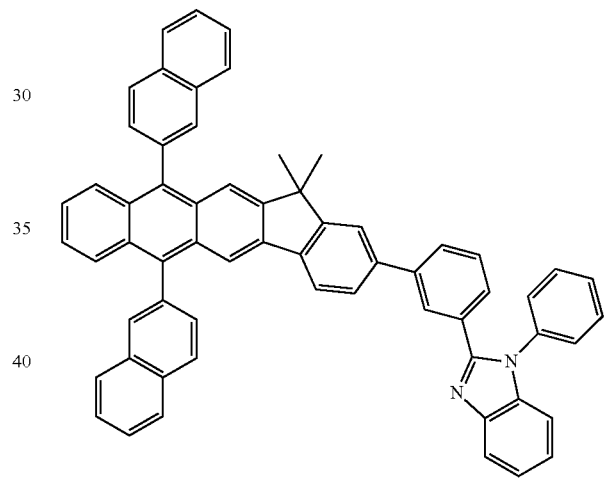

In some embodiments, at least one of the electron-transporting organic material in the first mixed layers 13 and 23 and the electron-transporting organic material in the second mixed layers 17 and 27 may include a compound of Formula 20a above.

In Formula 20A, i) all of $T_1$ to $T_3$ may be N; ii) $T_1$ may be $C(R_{100})$ and $T_2$ and $T_3$ may be N; iii) or all of $T_1$ to $T_3$ may be $C(R_{100})$, but not limited thereto.

In Formula 20A, $Ar_{201}$ to $Ar_{203}$ may be each independently selected from a substituted or unsubstituted $C_6$-$C_{60}$ arylene group, and a substituted or unsubstituted $C_2$-$C_{60}$ hetero arylene group. $Ar_{201}$ to $Ar_{203}$ may be each independently selected from a phenylene group, a naphthylene group, an anthrylene group, a pyrenylene group, a fluorenylene group, a pyridinylene group, a pyrazinylene group, and a pyrimidinylene group; and a phenylene group, a naphthylene group, an anthrylene group, a pyrenylene group, a fluorenylene group, a pyridinylene group, a pyrazinylene group, and a pyrimidinylene group, substituted with at least one of a phenyl group, a naphthyl group, an anthryl group, a pyrenyl group, a fluorenyl group, a pyridinyl group, a pyrazinyl group, and a pyrimidinyl group, but are not limited thereto.

In Formula 20A, p, q and r may be each independently 0, 1 or 2. For example, in Formula 20A, p, q and r may be each independently 0 or 1, but are not limited thereto.

In Formula 20A, $Ar_{211}$ to $Ar_{213}$ may be each independently selected from a substituted or unsubstituted $C_6$-$C_{60}$ aryl group, and a substituted or unsubstituted $C_2$-$C_{60}$ heteroaryl group. For example, $Ar_{211}$ to $Ar_{213}$ may be each independently selected from a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolyl group, a substituted or unsubstituted isoquinolyl group, a substituted or unsubstituted quinazolyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, and a substituted or unsubstituted phenanthrenyl group.

In some embodiments, $Ar_{211}$ to $Ar_{213}$ may be each independently one of Formulae 11(1) to 11(26), but are not limited thereto:

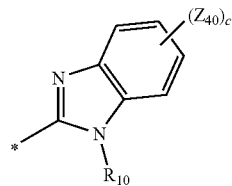

Formula 11(1)

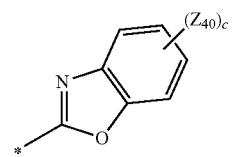

Formula 11(2)

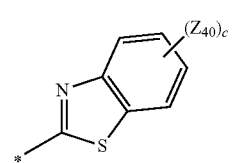

Formula 11(3)

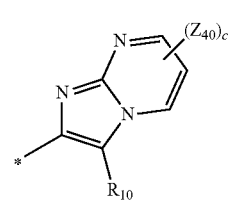

Formula 11(4)

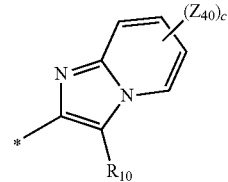

Formula 11(5)

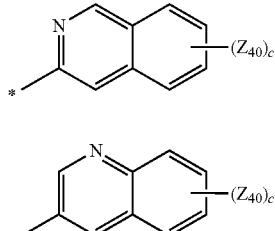

Formula 11(6)

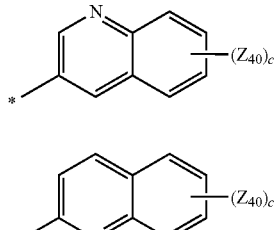

Formula 11(7)

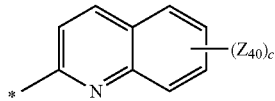

Formula 11(8)

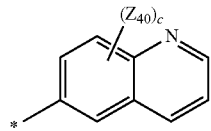

Formula 11(9)

Formula 11(10)

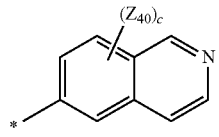

Formula 11(11)

Formula 11(12)

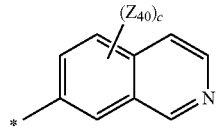

Formula 11(13)

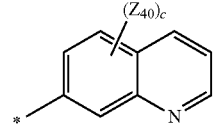

Formula 11(14)

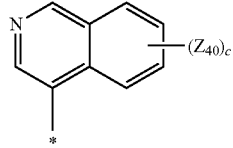

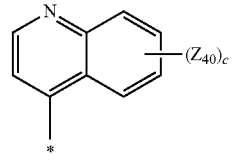

-continued

Formula 11(15)
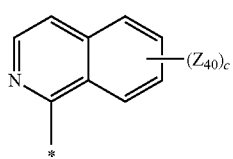

Formula 11(16)

Formula 11(17)
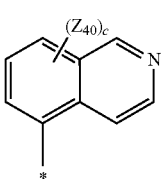

Formula 11(18)
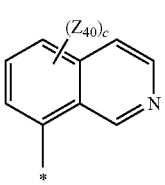

Formula 11(19)

Formula 11(20)
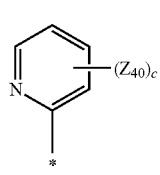

Formula 11(21)
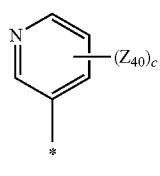

Formula 11(22)
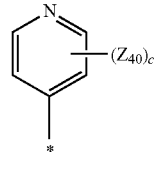

Formula 11(23)
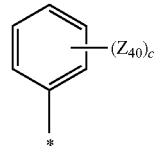

-continued

Formula 11(24)
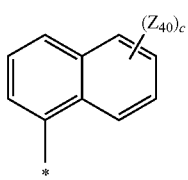

Formula 11(25)
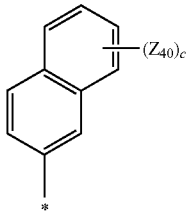

Formula 11(26)
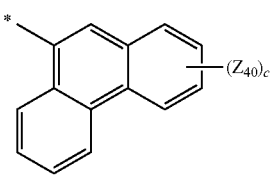

In Formulae 11(1) to 11(26), R10, $Z_{40}$, and c are as defined above.

For example, in Formula 20A, at least one of $Ar_{211}$ to $Ar_{213}$ may be a substituted or unsubstituted phenanthrenyl group.

In some embodiments, at least one of the electron-transporting organic material in the first mixed layers 13 and 23, and the electron-transporting organic material in the second mixed layers 17 and 27 may include a compound represented by Formula 20A(1) or 20A(2), but is not limited thereto:

Formula 20A(1)
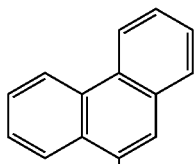

Formula 20A(2)
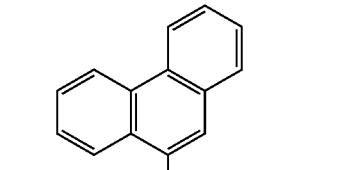
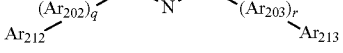

Formula 20A(3)

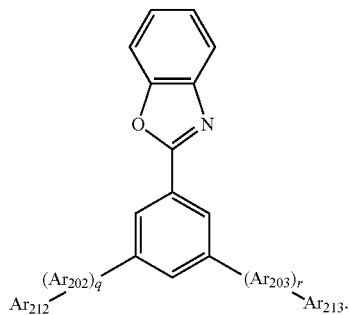

In Formulae 20A(1) to 20A(3), $Ar_{202}$, $Ar_{203}$, q, r, $Ar_{212}$, and $Ar_{213}$ are as defined above.

In some embodiments, at least one of the electron-transporting organic material in the first mixed layers 13 and 23 and the electron-transporting organic material in the second mixed layers 17 and 27 may include one of Compounds 600 to 604 below, but is not limited thereto:

Compound 600

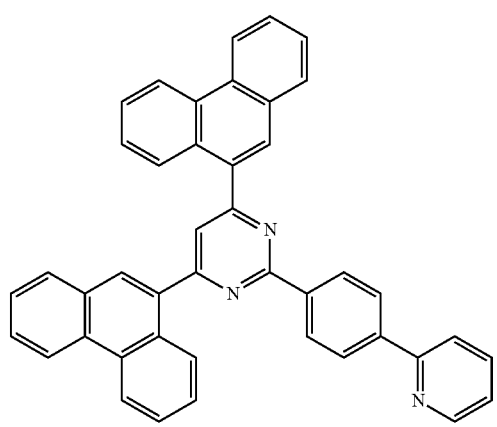

Compound 601

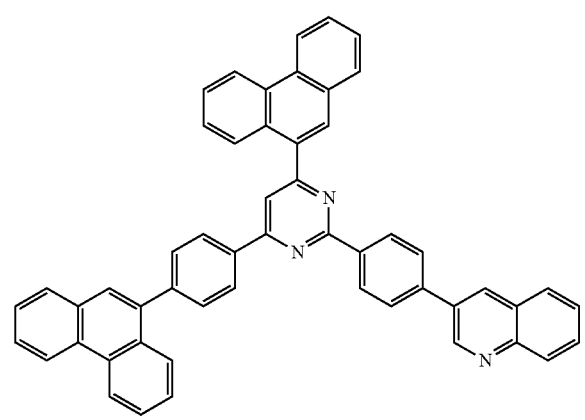

Compound 602

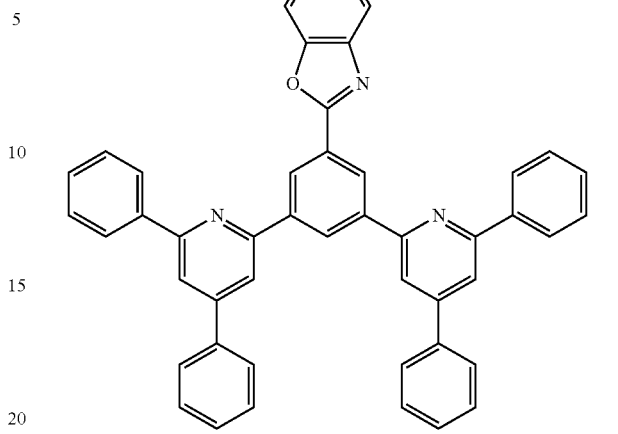

Compound 603

Compound 604

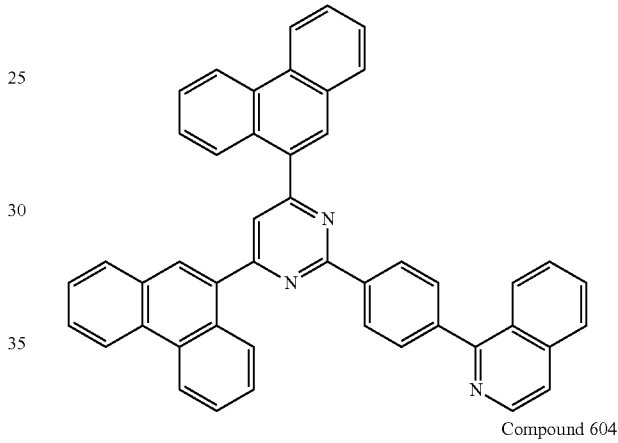

A thickness ratio of each of the first layers (11, 21) and the third layers (19, 29) to each of the first mixed layer (13, 23) and the second mixed layer (17, 27) may be varied within a range of from about 1:99 to about 99:1. For example, the thickness ratio of each of the first layers (11, 21) and the third layers (19, 29) to each of the first mixed layer (13, 23) and the second mixed layer (17, 27) may be from about 1:99 to about 1:10, and in some embodiments, may each be fro about 1:50 to about 1:20, but are not limited thereto. In some embodiments, the first mixed layers 13 and 23 may each have a thickness of from about 30 Å to about 100 Å. In some embodiments, the second mixed layers 17 and 27 may each have a thickness of from about 30 Å to about 100 Å. When the thickness ratios and the thicknesses of the first mixed layers 13 and 23 and the second mixed layers 17 and 27 are within these ranges, an organic light-emitting diode with high efficiency and long lifetime may be implemented.

In some embodiments, the thicknesses of the first electron transport unit 10 and the second electron transport unit 20 may be the same as or different from each other, or may be varied, not limited thereto.

In some embodiments, the thickness of the electron transport layer 160 may be from about 300 Å to about 5.00 Å, and in some embodiments, may be from about 300 Å to about 400 Å. When the thickness of the electron transport layer 160 is within these ranges, the electron transport layer 160 may have satisfactory electron transporting ability without a substantial increase in driving voltage.

Hereinafter, a method of forming the first electron transport unit 10 of the electron transport layer 160, according to an embodiment of the preset invention will be described with reference to FIGS. 2A to 2G.

FIGS. 2A to 2G are views illustrating a method of forming the first electron transport unit 10 of the electron transport layer 160 on the emission layer 150, according to an embodiment. Although not illustrated in FIGS. 2A to 2G for convenience, the surface 110, the first electrode 120, the hole injection layer 130, and the hole transport layer 140 described above are on a surface of the emission layer 150 opposite to the surface having the electron transport layer 160 thereon.

Figure 2A:
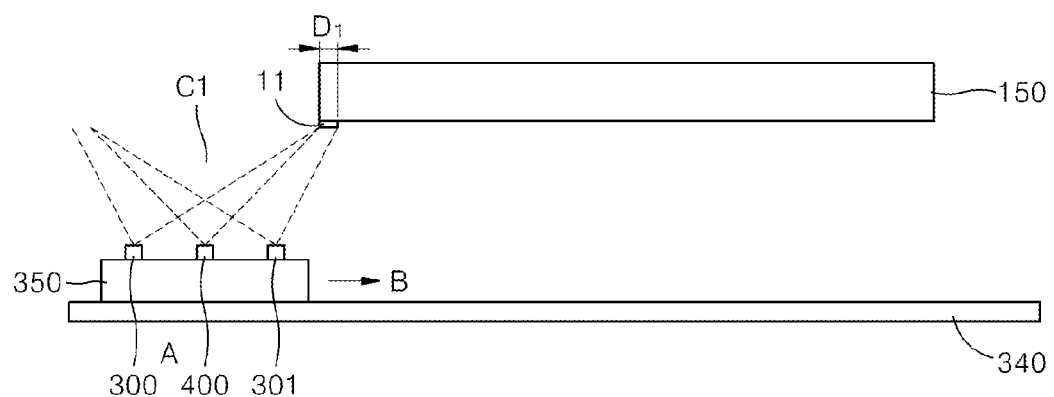
FIGS. 2A to 2G are views illustrating a method of forming a first electron transport unit of a electron transport layer of the organic light-emitting diode of FIG. 1, according to an embodiment of the present invention.

Referring to FIG. 2A, a first deposition source 300, a second deposition source 400, and a third deposition source 301 may be below the surface of the emission layer 150 (without the hole injection layer 130 and the hole transport layer 140 thereon). The first deposition source 300 is a deposition source for discharging an electron migration-facilitating material, the second deposition source 400 is a deposition source for discharging an electron-transporting organic material, and the third deposition source 301 is a deposition source for discharging an electron migration-facilitating material. In some embodiments, the electron migration-facilitating material discharged from the first deposition source 300 and the electron migration-facilitating material discharged from the third deposition source 301 may be the same or different from each other. In some embodiments, the electron migration-facilitating material discharged from the first deposition source 300 and the electron migration-facilitating material discharged from the third deposition source 301 may be the same, but are not limited thereto. In some embodiments, a discharging domain of the electron migration-facilitating material from the first deposition source 300, a discharging domain of the electron-transporting organic material from the second deposition source 400, and a discharging domain of the electron migration-facilitating material from the third deposition source 301 may have a fan shape at a predetermined angle as illustrated in FIG. 2A.

In some embodiments, the first deposition source 300, the second deposition source 400, and the third deposition source 301 may be at predetermined intervals so that the discharging domain of the electron migration-facilitating material from the first deposition source 300 and the discharging domain of the electron-transporting organic material from the second deposition source 400 have an overlapping domain therebetween, and the discharging domain of the electron-transporting organic material from the second deposition source 400 and the discharging domain of the electron migration-facilitating material from the third deposition source 301 have an overlapping domain therebetween (refer to a domain C1 in FIG. 2A). As a result, the first mixed layer 13 and the second mixed layer 17 can be formed, which will be described below with reference to FIG. 3B.

In some embodiments, the first layer 11, the second layer 15, and the third layer 19 that include the electron migration-facilitating material may be formed through non-overlapping domains between the discharging domain of the electron migration-facilitating material of the first deposition source 300 and the discharging domain of the electron-transporting organic material of the second deposition source 400, and non-overlapping domains between the discharging domain of the electron-transporting organic material of the second deposition source 400 and the discharging domain of the electron migration-facilitating material of the third deposition source 301. In some embodiments, the areas of these non-overlapping domains may be controllable by adjusting the discharge angles at which the electron migration-facilitating material is emitted from the first deposition source 300 and the electron migration-facilitating material is discharged from the third deposition source 301. In some embodiments, the thicknesses of the first layer 11, the second layer 15, and the third layer 19 may also be controllable by adjusting the areas of the non-overlapping domains.

In some embodiments, the first deposition source 300, the second deposition source 400, and the deposition source 301 may be mounted on a base 350. In some embodiments, the base 350 may be loaded to be reciprocally movable along a guide rail 340 laid in a chamber. In some embodiments, the base 350 may be operated in connection with a driving unit (not shown).

In some embodiments, the base 350 with the first deposition source 300, the second deposition source 400, and the third deposition source 301 loaded thereon and disposed at predetermined intervals may be moved under the emission layer 150 from a first end A toward a direction B, while the first deposition source 300, the second deposition source 400, and the third deposition source 301 are turned on, as illustrated in FIG. 2A. In this regard, only the electron migration-facilitating material discharged from the third deposition source 301 starts to be deposited on the emission layer 150 to form the first layer 11 (refer to D1) consisting of the electron migration-facilitating material. With the base 350 continuing to moving in direction B, the first layer 11 is extended and deposited on the emission layer 150.

Figure 2B:
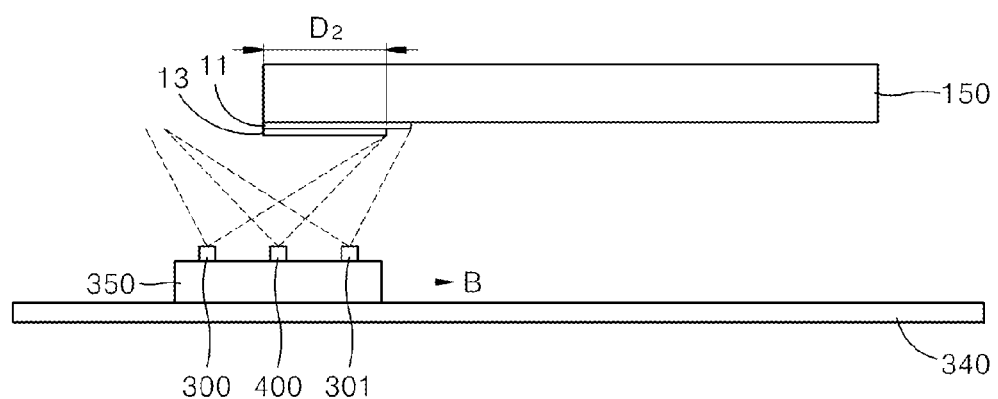

When the base 350 with the first deposition source 300, the second deposition source 400, and the third deposition source 301 loaded thereon continues to move in direction B, as illustrated in FIG. 2B, a domain in which the electron migration-facilitating material discharged from the third deposition source 301 and the electron-transporting organic material discharged from the second deposition source 400 are simultaneously deposited (refer to D2) is formed, so that a first mixed layer 13 including both the electron migration-facilitating material and the electron-transporting organic material starts to be formed on a lower surface of the first layer 11. With the base 350 continuing to moving in direction B, the first mixed layer 13 is extended and deposited on the first layer 11.

Figure 2C:
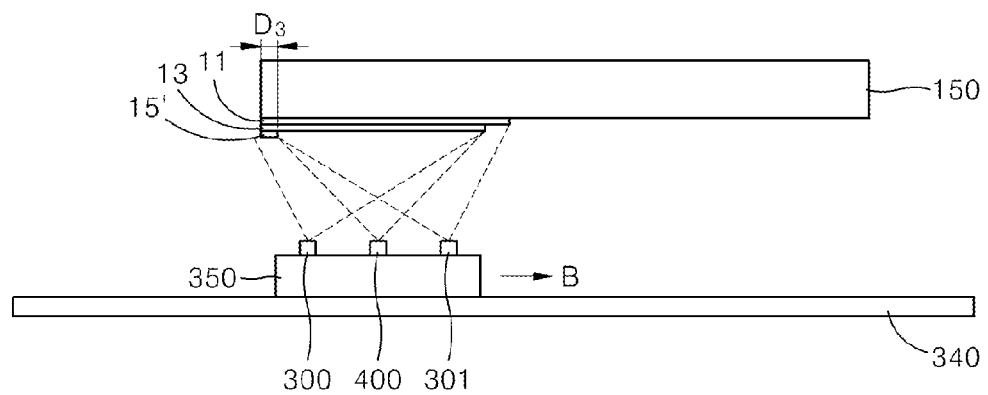

Subsequently, when the base 350 with the first deposition source 300, the second deposition source 400, and the third deposition source 301 continues to move further in direction B, as illustrated in FIG. 2C, a second "a" layer 15' including the electron migration-facilitating material discharged from the first deposition source 300 starts to be formed on a lower surface of the first mixed layer 13 (refer to D3).

Figure 2D:
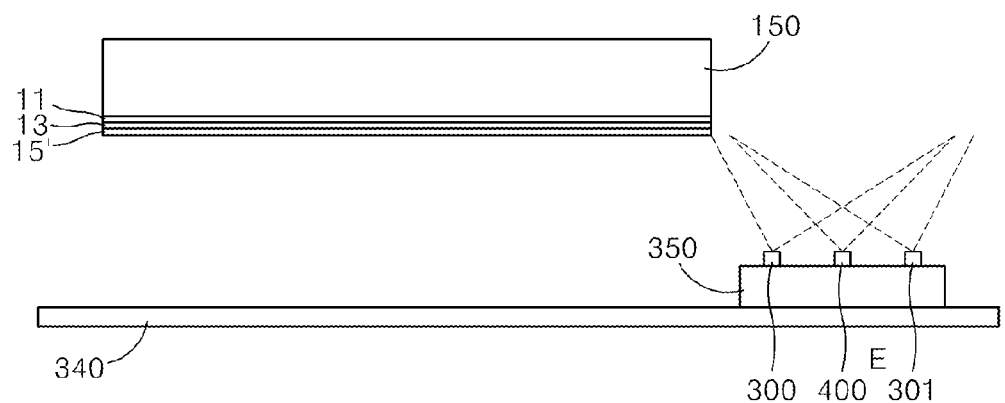

Subsequently, when the base 350 with the first deposition source 300, the second deposition source 400, and the third deposition source 301 disposed thereon continues to move further in direction B and reaches a second end E under the emission layer 150, as illustrated in FIG. 2D, the formation of i) the first layer 11 including the electron migration-facilitating material, ii) the first mixed layer 13 including the electron migration-facilitating material and the electron-transporting organic material, and iii) the second "a" layer 15' including the electron migration-facilitating material on the lower surface of the emission layer 150 is completed.

Figure 2E:
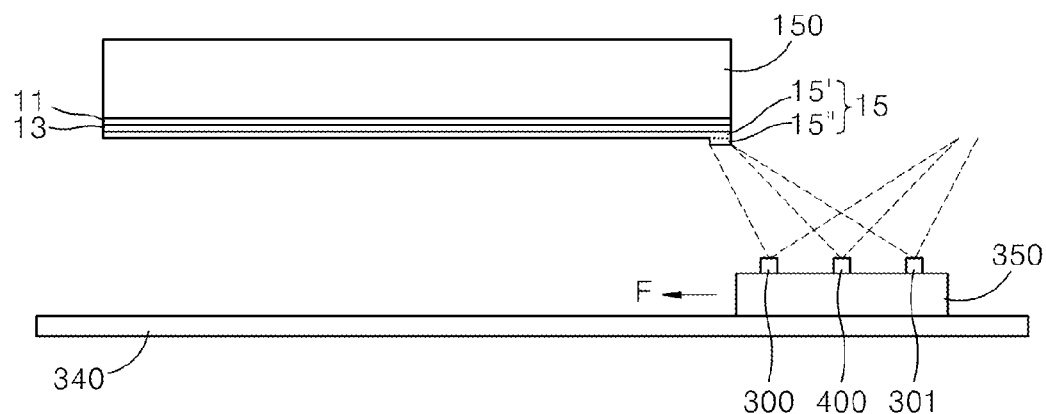

Next, the base 350 at the second end E under the emission layer 150 changes the direction of movement and starts to move direction F opposite to direction B, as illustrated in FIG. 2E. As illustrated in FIG. 2E, a second "b" layer 15" including the electron migration-facilitating material emitted from the first deposition source 300 starts to be deposited to form the second layer 15.

Figure 2F:
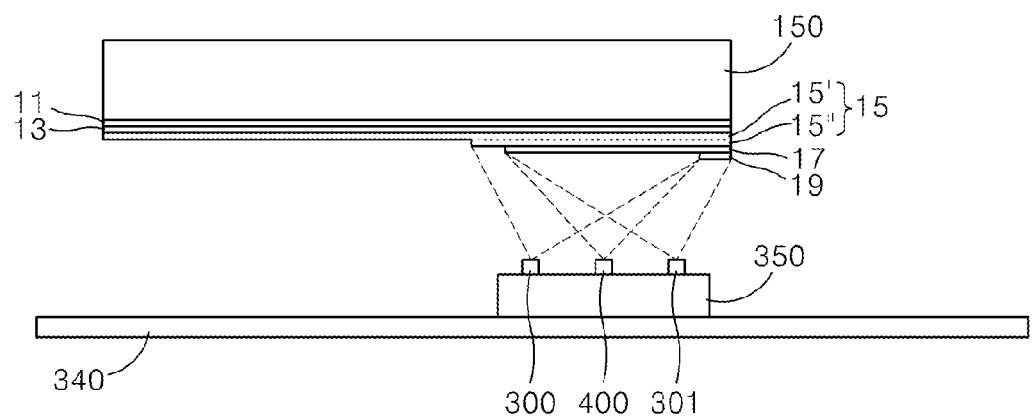

Subsequently, when the base 350 continues to move further in direction F, as illustrated in FIG. 2F, i) a second mixed layer 17 including the electron migration-facilitating material emitted from the first deposition source 300 and the electron-transporting organic material discharged from the second deposition source 400, and ii) a third layer 19 including the electron migration-facilitating material discharged from the third deposition source 301 may be sequentially formed on a lower surface of the second layer 15.

When the electron migration-facilitating material in the second "a" layer 15' and the electron migration-facilitating material in the second "b" layer 15" are the same, an interface between the second "a" layer 15' and the second "b" layer 15" may not be distinct, and the second "a" layer 15' and the second "b" layer 15" may appear as one layer, that is, the second layer 15. For this reason, the interface between the second "a" layer 15' and the second "b" layer 15" is denoted by dashed lines, not solid lines, in FIG. 2F. Accordingly, in some embodiments, the second "a" layer 15' and the second "b" layer 15" may appear as one layer, i.e., the second layer 15, but are not limited thereto.

Figure 2G:
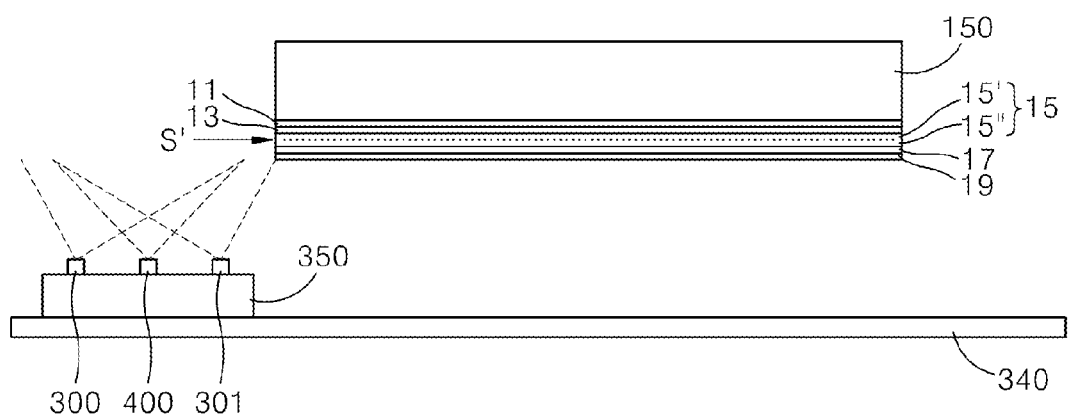

Subsequently, when the base 350 with the first deposition source 300, the second deposition source 400, and the third deposition source 301 disposed thereon reaches the first end A under the emission layer 150, as illustrated in FIG. 2G, the formation of i) the first layer 11 including the electron migration-facilitating material, ii) the first mixed layer 13 including the electron migration-facilitating material and the electron-transporting organic material, iii) the second layer 15 including the electron migration-facilitating material, iv) the second mixed layer 17 including the electron migration-facilitating material and the electron-transporting organic material, and v) the third layer 19 including the electron migration-facilitating material that are sequentially deposited upon one another is completed.

The thickness of the first layer 13, the thickness of the second "a" layer 15', the thickness of the second "b" 15", and the thickness of the third layer 19 may be the same. Accordingly, the thickness of the second layer 15 may be twice the thickness of the first layer 13.

According to the method, the first electron transport unit 10 may be formed through one reciprocation of the base 350 with the first deposition source 300, the second deposition source 400, and the third deposition source 301 disposed thereon from the first end A under the emission layer 150 back to the first end A via the second end E.

Accordingly, the electron transport layer 160 with a stack structure in which the first electron transport unit 10 and the second electron transport unit 20 are sequentially stacked upon one another may be formed easily by reciprocating twice the base 350 with the first deposition source 300, the second deposition source 400, and the third deposition source 301 disposed thereon from the first end A under the emission layer 150 back to the first end A via the second end E. Since the third layer 19 of the first electron transport unit 10 and the first layer 21 of the second electron transport unit 20 are formed of the same material, an interface between the third layer 19 and the first layer 21 may not be distinct, and the third layer 19 and the first layer 21 may appear as one layer. That is, although the interface between the third layer 19 of the first electron transport unit 10 of the electron transport layer 160 of FIG. 1 and the first layer the second electron transport unit 20 is denoted by solid lines in FIG. 1, the third layer 19 and the first layer 21 of the second electron transport unit 20 may appear as one layer.

When the electron transport layer 160 is formed by repeating twice the method illustrated in FIGS. 2A to 2G, the formation of the electron transport layer 160 may be more simple and facilitated. Since the formation processes of multiple layers are performed almost the same time within a single chamber, an additional chamber exhausting process may not be performed between the formations of each layer.

The method of forming the first electron transport unit 10 is described as an embodiment with reference to the present invention, but the present invention is not limited thereto.

Since the third layer 29 of the electron transport layer 160 that is in contact with the second electrode 180 does not include the electron-transporting organic material, interfacial characteristics between the second electrode 180 and the electron transport layer 160 may be stabilized, and an electron injection efficiency from the second electrode 180 to the electron transport layer 160 may be improved. As a result, the emission layer 150 may have hole-electron balance, and thus improved lifetime characteristics, and a continuous increase in driving voltage and voltage overshoot may be prevented.

In some embodiments, the second electrode 180 is on the electron transport layer 160. In some embodiments, the second electrode 180 may be a cathode, which is an electron injecting electrode. In some embodiments, a metal for forming the second electrode 9 may be a metal, an alloy, an electrically conductive compound, which have a low-work function, or a mixture thereof. In this regard, the second electrode 9 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting diode, the transmission electrode may be formed of indium tin oxide (ITO) or indium zinc oxide (IZO).

Although the embodiments of the organic light-emitting diodes with n=2 are described above with reference to FIGS. 1, and 2A to 2G, the present invention is not limited thereto.

As used herein, examples of the unsubstituted $C_1$-$C_{60}$ alkyl group (or $C_1$-$C_{60}$alkyl group are linear or branched $C_1$-$C_{60}$ alkyl groups, such as methyl, ethyl, propyl, isobutyl, sec-butyl, pentyl, iso-amyl, and hexyl. Examples of the substituted $C_1$-$C_{60}$ alkyl group are an unsubstituted $C_1$-$C_{60}$ alkyl group of which at least one hydrogen atom is substituted with a deuterium atom, —F, —Cl, —Br, —I, —CN, a hydroxyl group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_1$-$C_{60}$alkoxy group, a $C_2$-$C_{60}$alkenyl group and a $C_2$-$C_{60}$alkynyl group; a $C_1$-$C_{60}$alkyl group, a $C_1$-$C_{60}$alkoxy group, a $C_2$-$C_{60}$alkenyl group, and a $C_2$-$C_{60}$alkynyl group, substituted with at least one of a deuterium atom, —F, —Cl, —Br, —I, —CN, a hydroxyl group, a nitro group, an amino group, an amidino group, a hydrazine, a hydrazone, a carboxyl group or a salt thereof, a sulfonic acid group or a salt thereof, and a phosphoric acid group or a salt thereof; a $C_3$-$C_{10}$cycloalkyl group, a $C_6$-$C_{60}$aryl group, a $C_2$-$C_{60}$ heteroaryl group, a $C_6$-$C_{60}$aralkyl group and a $C_6$-$C_{60}$aryloxy group; and a $C_3$-$C_{10}$cycloalkyl group, a $C_6$-$C_{60}$aryl group, a $C_2$-$C_{60}$ heteroaryl group, a $C_6$-$C_{60}$aralkyl group, and a $C_6$-$C_{60}$aryloxy group, substituted with at least one of a deuterium atom, —F, —Cl, —Br, —I, —CN, a hydroxyl group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_1$-$C_{60}$alkoxy group, a $C_2$-$C_{60}$alkenyl group, a $C_2$-$C_{60}$alkynyl group, a $C_6$-$C_{60}$aryl group, and a $C_2$-$C_{60}$ heteroaryl group.

As used herein, the unsubstituted $C_1$-$C_{60}$ alkoxy group (or $C_1$-$C_{60}$ alkoxy group) may be a group represented by —OA, wherein A is an unsubstituted $C_1$-$C_{60}$ alkyl group as described above. Examples of the unsubstituted $C_1$-$C_{60}$ alkoxy group are a methoxy group, an ethoxy group, and an isopropyloxy group. At least one hydrogen atom in these alkoxy groups may be substituted with those substituents described above in conjunction with the substituted $C_1$-$C_{60}$ alkyl group.

As used herein, the unsubstituted $C_2$-$C_{60}$ alkynyl group (or $C_2$-$C_{60}$ alkynyl group) is an unsubstituted $C_2$-$C_{60}$ alkyl group having at least one carbon-carbon double bond in the center or at a terminal thereof. Examples of the alkenyl group are an ethenyl group, a propenyl group, a butenyl group, and the like. At least one hydrogen atom in the unsubstituted $C_2$-$C_{60}$ alkenyl group may be substituted with those substituents described above in conjunction with the substituted $C_1$-$C_{60}$ alkyl group.

The unsubstituted $C_2$-$C_{60}$ alkynyl group (or $C_2$-$C_{60}$ alkynyl group) is a $C_2$-$C_{60}$ alkyl group having at least one carbon-carbon triple bond in the center or at a terminal thereof. Examples of the unsubstituted $C_2$-$C_{60}$ alkynyl group (or $C_2$-$C_{60}$ alkynyl group) are an ethenyl group, a propynyl group, and the like. At least one hydrogen atom in the alkynyl group may be substituted with those substituents described above in conjunction with the substituted $C_1$-$C_{60}$ alkyl group.

The unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and the arylene group have at least two rings, they may be fused to each other via a single bond. At least one hydrogen atom in the aryl group and the arylene group may be substituted with those substituents described above in conjunction with the $C_1$-$C_{60}$ alkyl group.

Examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, and an ovalenyl group. Examples of the substituted $C_6$-$C_{60}$ aryl group may be inferred based on those of the unsubstituted $C_6$-$C_{60}$ aryl group and the substituted $C_1$-$C_{30}$ alkyl group described above. Examples of the substituted or unsubstituted $C_6$-$C_{60}$ arylene group may be inferred based on those examples of the substituted or unsubstituted $C_6$-$C_{60}$ aryl group described above.

The unsubstituted $C_2$-$C_{60}$ heteroaryl group is a monovalent group having at least one aromatic ring having at least one of the heteroatoms selected from the group consisting of N, O, P, and S. The unsubstituted $C_2$-$C_{60}$ heteroarylene group is a divalent group having at least one aromatic ring having at least one of the heteroatoms selected from the group consisting of N, O, P, and S. In this regard, when the heteroaryl group and the heteroarylene group have at least two rings, they may be fused to each other via a single bond. At least one hydrogen atom in the heteroaryl group and the heteroarylene group may be substituted with those substituents described with reference to the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the unsubstituted $C_2$-$C_{60}$ heteroarylene group may be understood with reference to those examples of the substituted or unsubstituted $C_2$-$C_{60}$ arylene group described above.

The substituted or unsubstituted $C_6$-$C_{60}$ aryloxy group indicates —$OA_2$ (where $A_2$ is a substituted or unsubstituted $C_6$-$C_{60}$ aryl group described above). The substituted or unsubstituted $C_6$-$C_{60}$ arylthiol group indicates —$SA_3$ (where $A_3$ is a substituted or unsubstituted $C_6$-$C_{60}$ aryl group described above).

The method of forming the electron transport unit described with reference to FIGS. 2A to 2G may be modified in a variety of ways, for example, as a method of forming multiple material layers including at least two different materials, by using a variety of materials as materials discharged from the first deposition source 300, the second deposition source 400, and the third deposition source 301.

In some embodiments, a method of forming multiple material layers may be provided, for example, by using i) a substrate, instead of the emission layer 150 used in the method described with reference to FIGS. 2A to 2G, ii) a first material as a material discharged from the first deposition source 300, instead of the electron migration-facilitating material, iii) a second material discharged as a material from the second deposition source 400, instead of the electron-transporting organic material, and iv a third material as a material discharged from the third deposition source 301, instead of the electron migration-facilitating material, the method including:

preparing the substrate;

preparing a first deposition source discharging the first material, a second deposition source discharging the second material, and a third deposition source discharging the third material;

arranging the first deposition source, the second deposition source and the third deposition source at predetermined intervals therebetween so that a discharging domain of the first material from the first deposition source and a discharging domain of the second material from the second deposition source overlap with each other, and a discharging domain of the second material from the second deposition source and a discharging domain of the third material from the third deposition source overlap with each other; and reciprocating the first deposition source, the second deposition source and the third deposition source from a first end via a second end of the substrate and then back to the first end of the substrate;

wherein the reciprocating is performed n times, where n is an integer of 1 or greater, to form the material layer having a stack structure including n number of stack units on the substrate, where n is an integer of 1 or greater, each stack unit including: a third material layer, a mixed layer of the third material and the second material, a mixed layer of the first material and the third material, a mixed layer of the first material and the second material, and a first material layer that are sequentially stacked upon one another.

The method of forming the material layer may be the same as the method described with reference to FIGS. 2A to 2G, except that the substrate with a region for multiple material layers is any substrate, and the first, second, and third materials may be any depositable material and may be the same or differ from each other. Thus, a detailed description of the material layer formation method is not provided here, and the method described above in detail with reference to FIGS. 2A to 2G may be referred to in this regard.

The first material is same as the third material.

EXAMPLES

Example 1B

To manufacture an anode, a corning 15 $\Omega/cm^2$ (1200 Å) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

4,4'-bis[N-(1-naphthyl)-N-phenylamino]biphenyl (NPB) was deposited on the ITO layer to form a hole transport layer having a thickness of 1400 Å.

Subsequently, 9,10-di-naphthalene-2-yl-anthracene (AND, a host) and 4,4'-bis[2-(4-(N,N-diphenylamino)phenyl)vinyl]biphenyl (DPAVBi, a dopant) were co-deposited on the hole transport layer in a weight ratio of 98:2 to form an emission layer having a thickness of about 300 Å.

Afterward, a first electron transport unit (180 Å) and a second electron transport unit (180 Å) each having a structure of Table 1 below were sequentially formed on the emission layer to form an electron transport layer having a thickness of about 360 Å.

TABLE 1

| First electron transport unit (180 Å) | First layer (3 Å) | formed by deposition of Compound 250 |
| | First mixed layer (84 Å) | formed by co-deposition of Compound 202 and Compound 250 |
| | Second layer (6 Å) | formed by deposition of Compound 250 |
| | Second mixed layer (84 Å) | formed by co-deposition of Compound 202 and Compound 250 |
| | Third layer (3 Å) | formed by deposition of Compound 250 |
| Second electron transport unit (180 Å) | First layer (3 Å) | formed by deposition of Compound 250 |
| | First mixed layer (84 Å) | formed by co-deposition of Compound 202 and Compound 250 |
| | Second layer (6 Å) | formed by deposition of Compound 250 |
| | Second mixed layer (84 Å) | formed by co-deposition of Compound 202 and Compound 250 |
| | Third layer (3 Å) | formed by deposition of Compound 250 |

The first electron transport unit and the second electron transport unit were each formed according to the method described with reference to FIGS. 2A to 2G above. In particular, after a base with a first deposition source for discharging Compound 250, a second deposition source for discharging Compound 202, and a third deposition source for discharging Compound 250 disclosed thereon were prepared, a) intervals between and discharge angles of the first deposition source, the second deposition source, and the third deposition source were adjusted so that i) a discharging domain of the Compound 250 from the first deposition source and a discharging domain of Compound 202 from the second deposition source appropriately overlap with one another and ii) a discharging domain of Compound 202 from the second deposition source and a discharging domain of Compound 250 from the third deposition source appropriately overlap with one another, and b) the base was reciprocated twice under the emission layer between opposite ends of the base, so that an electron transport layer as described above was formed on a lower surface of the emission layer.

Subsequently, Al was deposited on the electron transport layer to form a second electrode (cathode) having a thickness of about 3000 Å, thereby manufacturing an organic light-emitting diode.

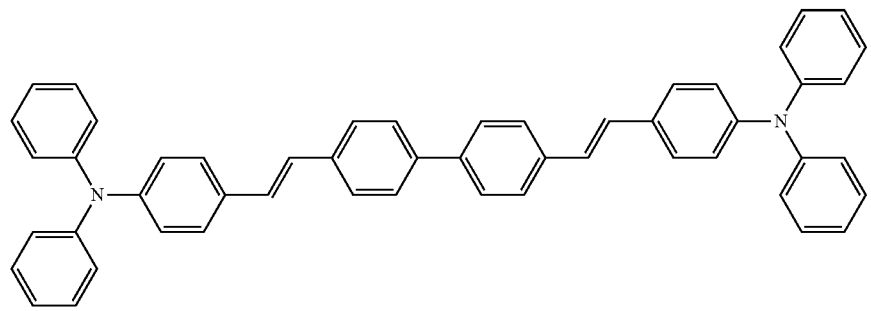

DPAVBi

Compound 202

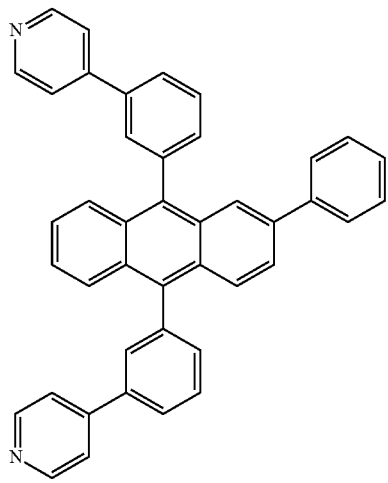

Compound 250

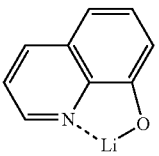

Example 1G

To manufacture an anode, a corning 15 $\Omega/cm^2$ (1200 Å) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

2-TNATA was deposited on the ITO glass substrate to form an hole injection layer having a thickness of 350 Å on the anode, and then 4,4'-bis[N-(1-naphthyl)-N-phenylamino]biphenyl (NPB) was deposited on the hole injection layer to form a hole transport layer having a thickness of 1400 Å.

Compound H1 (host) and Compound GD1 (dopant) were co-deposited on the hole transport layer in a weight ratio of about 98:5 to form an emission layer having a thickness of about 400 Å.

Afterward, a first electron transport unit (180 Å) and a second electron transport unit (180 Å) each having the structure of Table 1 above were sequentially formed on the emission layer to form an electron transport layer having a thickness of about 360 Å.

Subsequently, Al was deposited on the electron transport layer to form a second electrode (cathode) having a thickness of about 3000 Å, thereby completing the manufacture of an organic light-emitting diode.

Compound H1

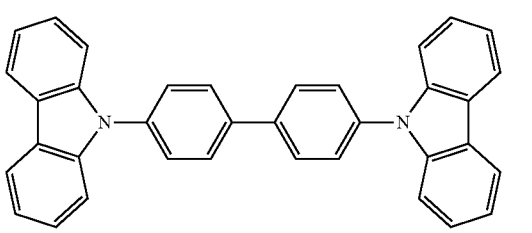

Compound GD1

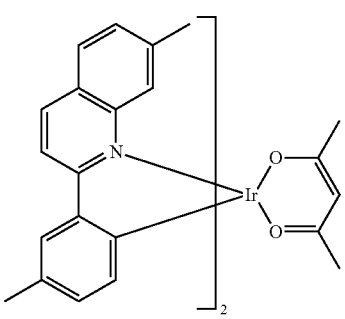

Example 1R

An organic light-emitting diode was manufactured in the same manner as in Example 1G, except that the thickness of the hole injection layer was adjusted to about 780 Å, and Compound RD1 below was used as a dopant in forming the emission layer.

Compound RD1

Example 2B

An organic light-emitting diode was manufactured in the same manner as in Example 1B, except that an electron transport layer having a structure of Table 2 below was formed.

TABLE 2

| First electron transport unit (180 Å) | First layer(3.5 Å) | formed by deposition of Compound 250 |
| --- | --- | --- |
| | First mixed layer(83 Å) | formed by co-deposition of Compound 202 and Compound 250 |
| | Second layer(7 Å) | formed by deposition of Compound 250 |
| | Second mixed layer(83 Å) | formed by co-deposition of Compound 202 and Compound 250 |
| | Third layer(3.5 Å) | formed by deposition of Compound 250 |
| Second electron transport unit (180 Å) | First layer(3.5 Å) | formed by deposition of Compound 250 |
| | First mixed layer(83 Å) | formed by co-deposition of Compound 202 and Compound 250 |
| | Second layer(7 Å) | formed by deposition of Compound 250 |
| | Second mixed layer(83 Å) | formed by co-deposition of Compound 202 and Compound 250 |
| | Third layer(3.5 Å) | formed by deposition of Compound 250 |

Example 2G

An organic light-emitting diode was manufactured in the same manner as in Example 1G, except that Compound H1 as a host, and Compound GD1 as a dopant were used to form the emission layer, and the electron transport layer having the structure of Table 2 in Example 1B was formed.

Example 2R

An organic light-emitting diode was manufactured in the same manner as in Example 2G, except that the thickness of the hole injection layer was adjusted to about 780 Å, and Compound RD1 below was used as a dopant in forming the emission layer.

Example 3B

An organic light-emitting diode was manufactured in the same manner as in Example 1B, except that an electron transport layer having a structure of Table 3 below was formed.

TABLE 3

| First electron transport unit (180 Å) | First layer (2.5 Å) | formed by deposition of Compound 250 |
| --- | --- | --- |
| | First mixed layer (85 Å) | formed by co-deposition of Compound 600 and Compound 250 |
| | Second layer (5 Å) | formed by deposition of Compound 250 |
| | Second mixed layer (85 Å) | formed by co-deposition of Compound 600 and Compound 250 |
| | Third layer (2.5 Å) | formed by deposition of Compound 250 |
| Second electron transport unit (180 Å) | First layer (2.5 Å) | formed by deposition of Compound 250 |
| | First mixed layer(85 Å) | formed by co-deposition of Compound 600 and Compound 250 |
| | Second layer (5 Å) | formed by deposition of Compound 250 |
| | Second mixed layer (85 Å) | formed by co-deposition of Compound 600 and Compound 250 |
| | Third layer (2.5 Å) | formed by deposition of Compound 250 |

Example 3G

An organic light-emitting diode was manufactured in the same manner as in Example 1G, except that Compound H1 as a host and Compound GD1 as a dopant were used to form the emission layer, and the electron transport layer having the structure of Table 3 in Example 3B was formed.

Example 3R

An organic light-emitting diode was manufactured in the same manner as in Example 3G, except that the thickness of the hole injection layer was adjusted to about 780 Å, and Compound RD1 below was used as a dopant in forming the emission layer.

Evaluation Example 1

Driving voltages, efficiencies and color coordinates of the organic light-emitting diodes of Examples 1B to 3R were measured using a PR650 (Spectroscan) Source Measurement Unit. (available from PhotoResearch, Inc.). The results are shown in Table 4 below.

TABLE 4

| | Driving voltage(V) | Efficiency (Cd/A) | CIEx | CIEy |
| --- | --- | --- | --- | --- |
| Example 1B | 4.7 | 65.1 | 0.141 | 0.054 |
| Example 2B | 6.7 | 49.7 | 0.140 | 0.058 |
| Example 3B | 4.5 | 68.6 | 0.138 | 0.047 |
| Example 1G | 3.9 | 97.5 | 0.230 | 0.719 |
| Example 2G | 5.6 | 99.3 | 0.241 | 0.711 |
| Example 3G | 4.4 | 105.7 | 0.234 | 0.716 |
| Example 1R | 5.0 | 30.3 | 0.667 | 0.333 |
| Example 2R | 7.1 | 26.7 | 0.669 | 0.331 |
| Example 3R | 5.2 | 30.3 | 0.668 | 0.330 |

Referring to Table 4 above, the organic light-emitting diodes of Examples 1b to 3R are found to have high efficiencies and good color purity characteristics.

As described above, according to the one or more of the above embodiments of the present invention, an organic light-emitting diode including an electron transport layer having a novel structure as describe above may have high efficiency and long lifetime. According to a method of manufacturing the organic light-emitting diode, the electron transport layer may be easily formed. A multi-layered material layer including at least two different materials may be easily formed using the organic light-emitting diode manufacturing method.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An organic light-emitting diode comprising:
a substrate; a first electrode on the substrate; a second electrode opposite to the first electrode; an emission layer between the first electrode and the second electrode; and an electron transport layer between the emission layer and the second electrode,
wherein the electron transport layer comprises a stack structure including n number of electron transport units (where n is an integer of 1 or greater) each including a stack of a first layer, a first mixed layer, a second layer, a second mixed layer, and a third layer that are sequentially stacked upon one another,
the first mixed layer and the second mixed layer each comprise an electron-transporting organic material and an electron migration-facilitating material, and
the first layer comprises a first electron migration-facilitating material and excludes the electron-transporting organic material, the second layer comprises a second electron migration-facilitating material and excludes the electron-transporting organic material, and the third layer comprises a third electron migration-facilitating material and excludes the electron-transporting organic material.

2. The organic light-emitting diode of claim 1, wherein n is equal to 2.

3. The organic light-emitting diode of claim 1, wherein the first electron migration-facilitating material, the second electron migration-facilitating material, and the third electron migration-facilitating material are the same material.

4. The organic light-emitting diode of claim 1, wherein the first electron migration-facilitating material, the second electron migration-facilitating material, and the third electron migration-facilitating material each independently comprise at least one of a Li complex, LiF, CsF, $Al_2O_3$, $SiO_2$, $Si_3N_4$, and $Cs_2CO_3$.

5. The organic light-emitting diode of claim 1, wherein the first electron migration-facilitating material, the second electron migration-facilitating material, and the third electron migration-facilitating material each independently comprise at least one of Compounds 250 and 251 below:

Compound 250

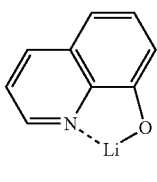

Compound 251

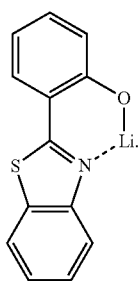

6. The organic light-emitting diode of claim 1, wherein the first layer, the second layer, and the third layer each independently have a thickness of from about 0.1 nm to about 50 nm.

7. The organic light-emitting diode of claim 1, wherein at least one of the first electron migration-facilitating material, the second electron migration-facilitating material and the third electron migration-facilitating material is the same material as at least one of the electron migration-facilitating material in the first mixed layer and the electron migration-facilitating material in the second mixed layer.

8. The organic light-emitting diode of claim 1, wherein the electron-transporting organic material in the first mixed layer and the electron-transporting organic material in the second mixed layer are the same.

9. The organic light-emitting diode of claim 1, wherein the electron-transporting organic material in the first mixed layer and the electron-transporting organic material in the second mixed layer each independently comprise at least one of i) a compound represented by one of Formulae 10A, 10B and 10C below, and ii) a compound represented by Formula 20A below:

Formula 10A

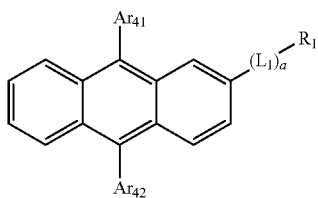

Formula 10B

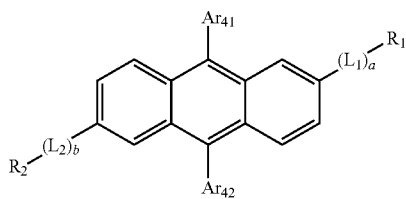

Formula 10C

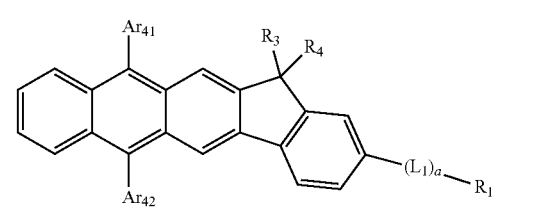

Formula 20A

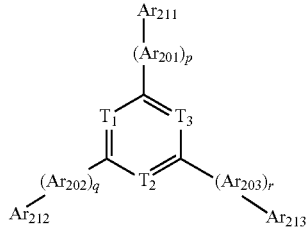

wherein, in Formulae 10A to 10C, $Ar_{41}$ and $Ar_{42}$ are each independently selected from a substituted or unsubstituted $C_6$-$C_{60}$ aryl group and a substituted or unsubstituted $C_2$-$C_{60}$ heteroaryl group;

$L_1$ and $L_2$ are each independently selected from a substituted or unsubstituted $C_6$-$C_{60}$ arylene group and a substituted or unsubstituted $C_2$-$C_{60}$ heteroarylene group;

a and b are each independently 0, 1 or 2;

$R_1$ and $R_2$ are each independently selected from a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, and a substituted or unsubstituted phenanthrenyl group; and $R_3$ and $R_4$ are each independently selected from a $C_1$-$C_{20}$ alkyl group and a $C_2$-$C_{20}$ aryl group, each unsubstituted or substituted with at least one of a deuterium atom, —F, —Cl, —Br, —I, —CN, a hydroxyl group, a nitro group, an amino group, a amidino group, a hydrazine, a hydrazone, a carboxyl group or a salt thereof, sulfonic acid group or a salt thereof, and a phosphoric acid group or a salt thereof, and in Formula 20A, $T_1$ to $T_3$ are each independently N (nitrogen) or C(R100), wherein R100 is selected from,
a hydrogen atom, a deuterium atom, —F, —Cl, —Br, —I, —CN, hydroxyl group, —$NO_2$, amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group and a $C_1$-$C_{60}$alkoxy group, said $C_1$-$C_{60}$alkyl group and a $C_1$-$C_{60}$alkoxy group each unsubstituted or substituted with at least one of a deuterium atom, —F, —Cl, —Br, —I, —CN, a hydroxyl group, a nitro group, an amino group, an amidino group, a hydrazine, a hydrazone, a carboxyl group or a salt thereof, a sulfonic acid group or a salt thereof, and a phosphoric acid group or a salt thereof;

$Ar_{201}$ to $Ar_{203}$ are each independently selected from a substituted or unsubstituted $C_6$-$C_{60}$ arylene group and a substituted or unsubstituted $C_2$-$C_{60}$ heteroarylene group;

p, q and r are each independently, 0, 1 or 2; and $Ar_{211}$ to $Ar_{213}$ are each independently selected from a substituted or unsubstituted $C_6$-$C_{60}$aryl group and a substituted or unsubstituted $C_2$-$C_{60}$ heteroaryl group.

10. The organic light-emitting diode of claim 9, wherein at least one of the electron-transporting organic material in the first mixed layer and the electron-transporting organic material in the second mixed layer comprises a compound represented by one of Formula 10A(1) to 10A(12), 10B(1) to 10B(12), and 10C(1) to 10C(6) below:

Formula 10A(1)

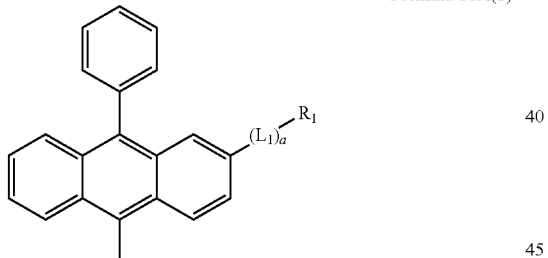

Formula 10A(2)

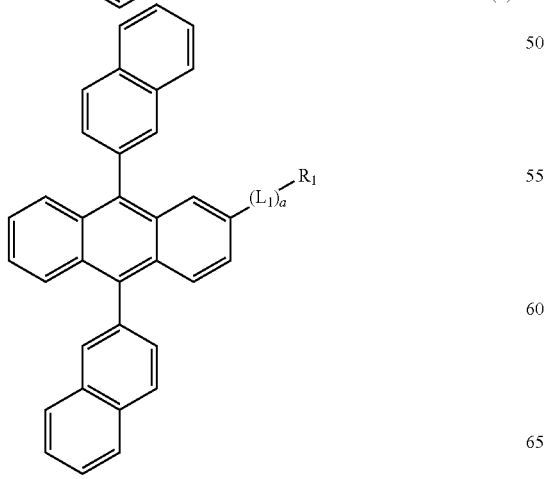

Formula 10A(3)

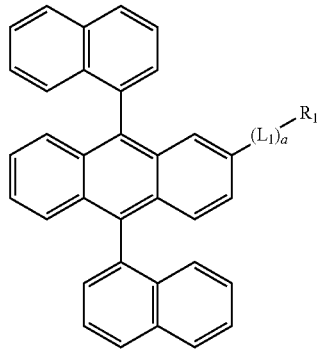

Formula 10A(4)

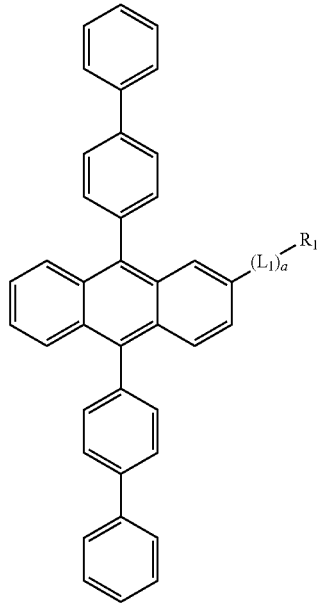

Formula 10A(5)

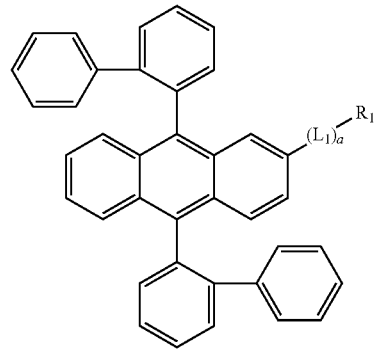

Formula 10A(6)
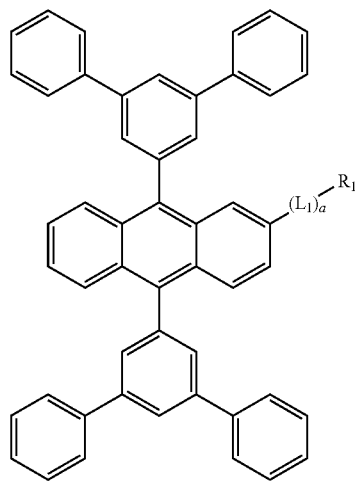
Formula 10A(7)
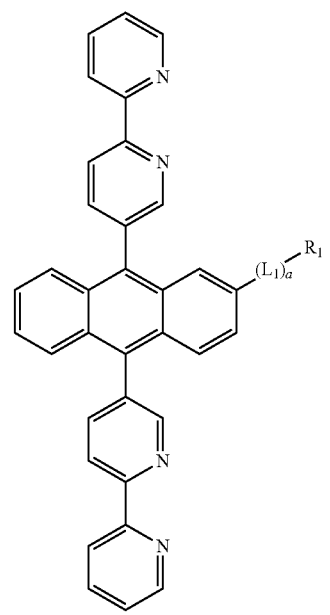
Formula 10A(8)
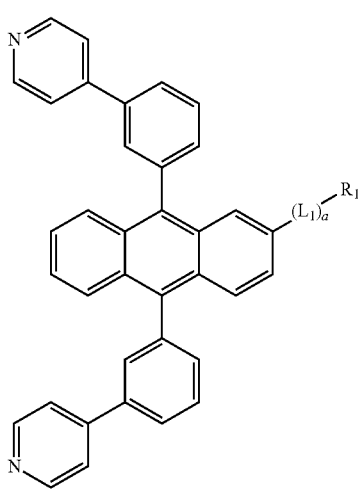
Formula 10A(9)
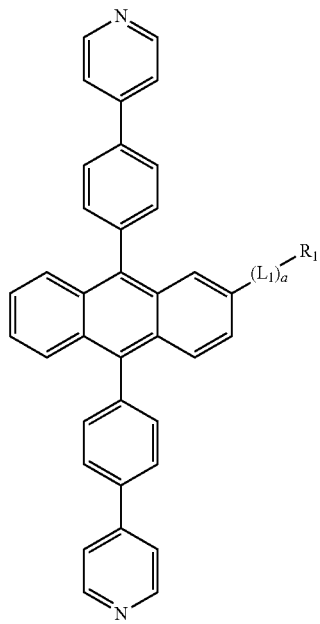
Formula 10A(10)
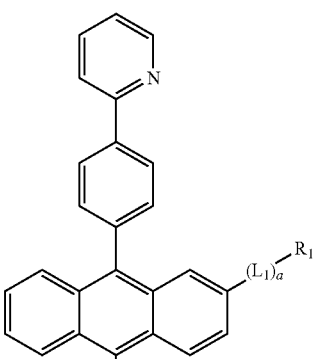
Formula 10A(11)
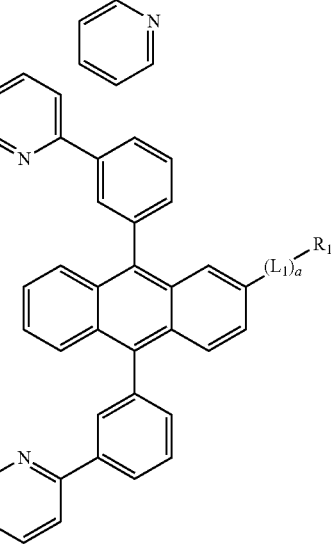

Formula 10A(12)
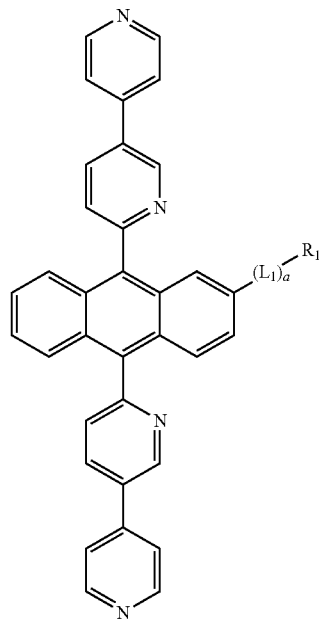
Formula 10B(1)
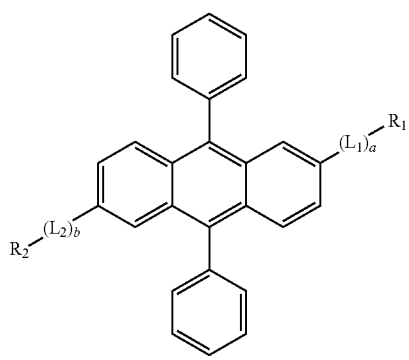
Formula 10B(2)
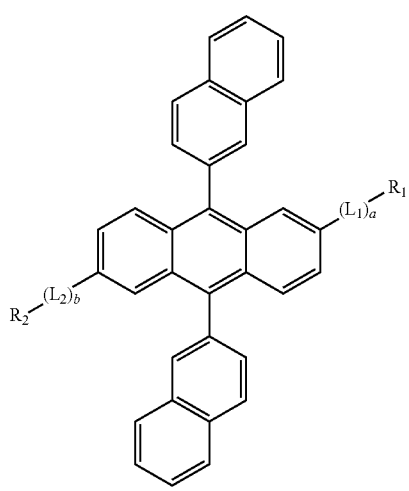
Formula 10B(3)
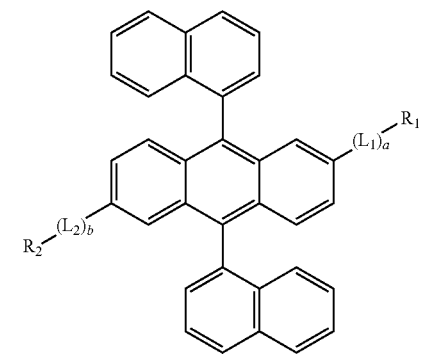
Formula 10B(4)
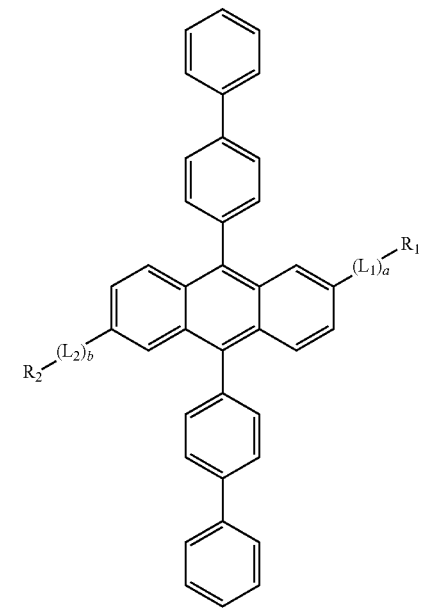
Formula 10B(5)
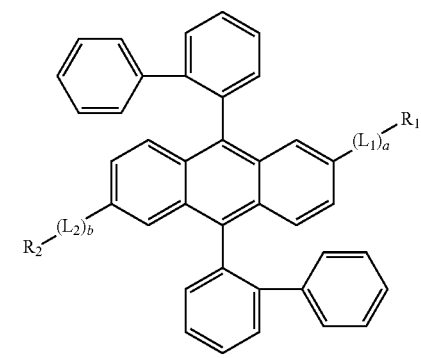

Formula 10B(6)
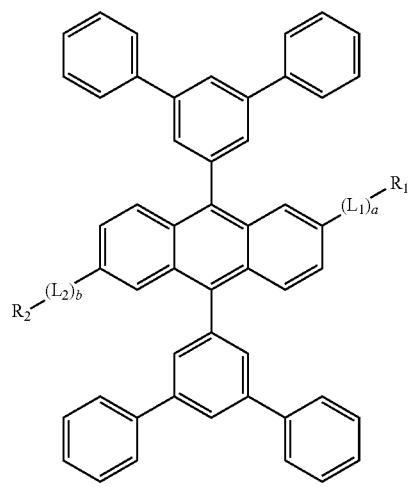
Formula 10B(7)
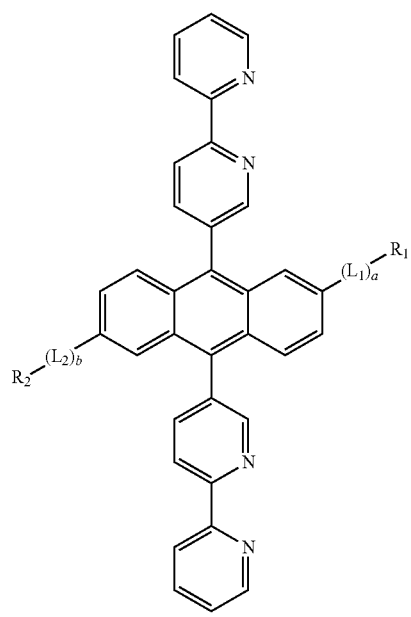
Formula 10B(8)
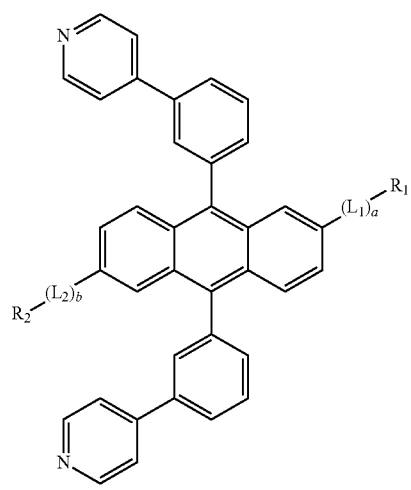
Formula 10B(9)
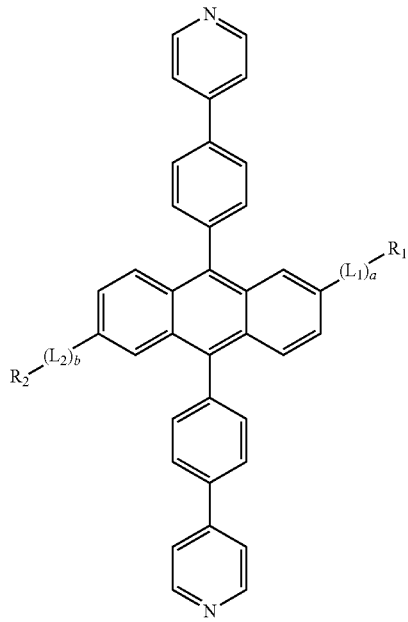
Formula 10B(10)
Formula 10B(11)
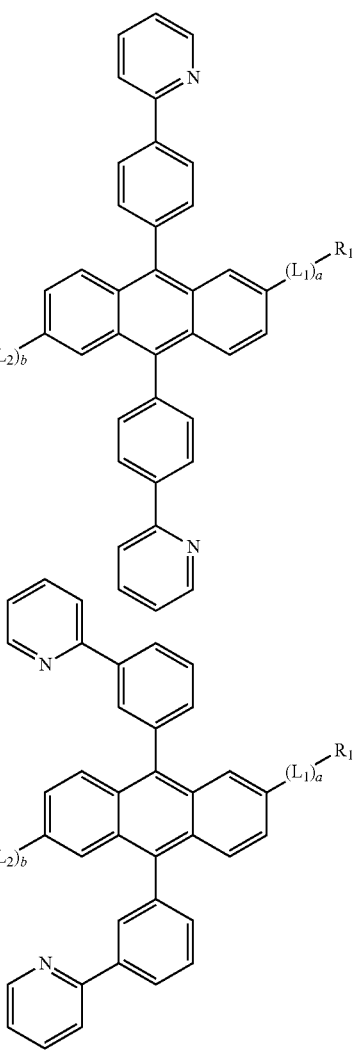

Formula 10B(12)
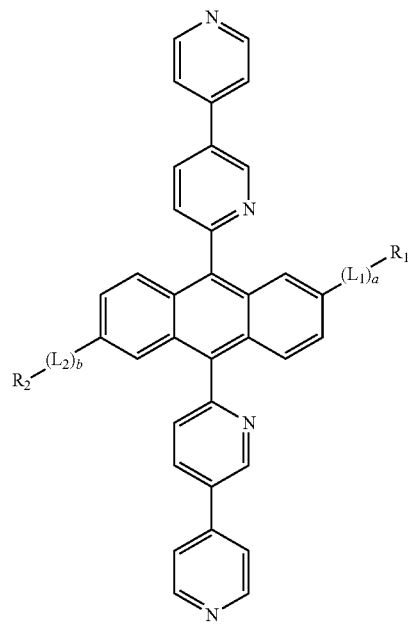
Formula 10C(1)
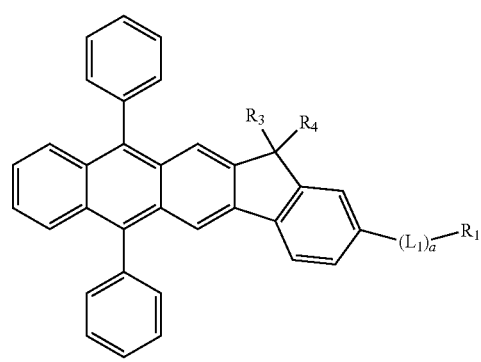
Formula 10C(2)
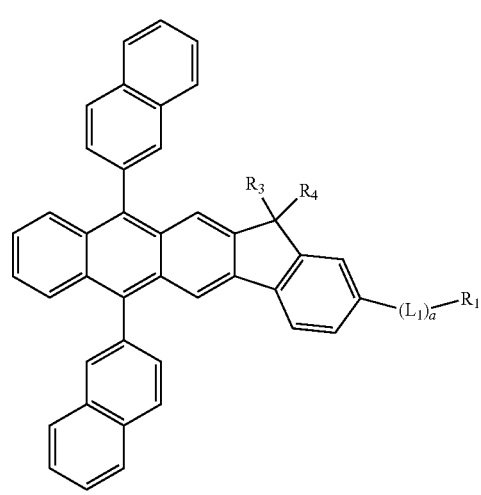
Formula 10C(3)
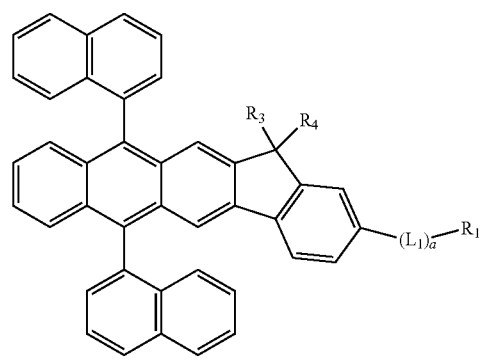
Formula 10C(4)
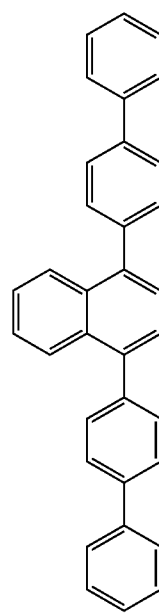
Formula 10C(5)
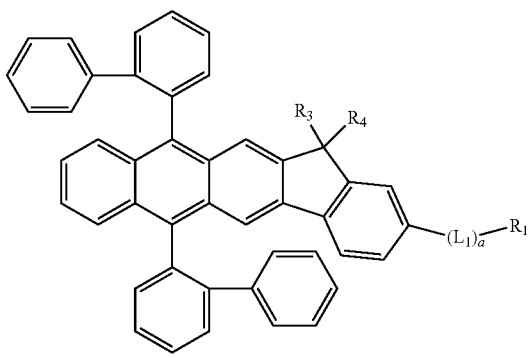

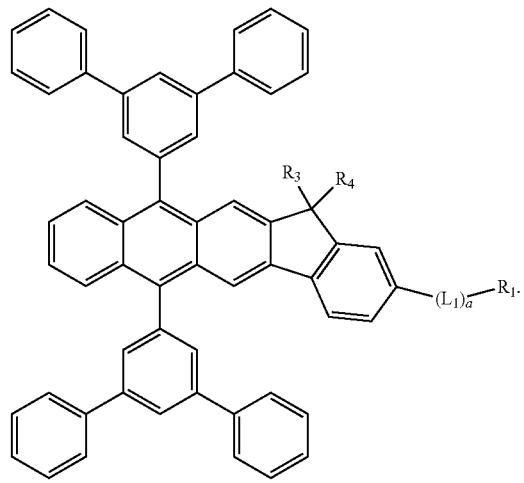

Formula 10c(6)

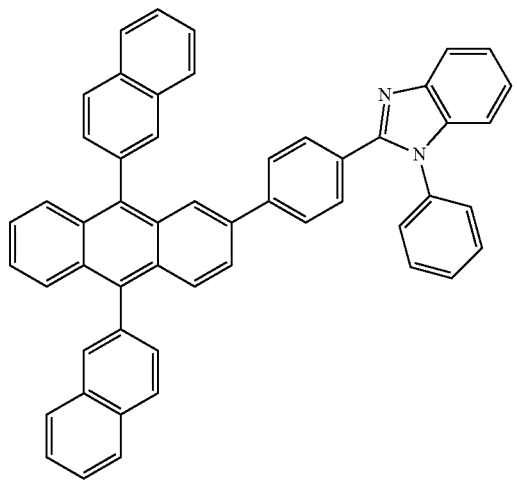

Compound 200

11. The organic light-emitting diode of claim 10, wherein at least one of the electron-transporting organic material in the first mixed layer and the electron-transporting organic material in the second mixed layer comprises a compound represented by one of Formulae 10A(1) to 10A(6), 10B(1) to 10B(6), and 10C(1) to 10C(6), wherein R1 and R2 are each independently selected from a substituted or unsubstituted benzoimidazolyl group, a substituted or unsubstituted benzoxazolyl group, and a substituted or unsubstituted benzothiazolyl group.

12. The organic light-emitting diode of claim 10, wherein at least one of the electron-transporting organic material in the first mixed layer and the electron-transporting organic material in the second mixed layer comprises a compound represented by one of Formulae 10A(7) to 10A(12) and 10B(7) to 10B(12), wherein $R_1$ and $R_2$ are each independently selected from a substituted or unsubstituted phenyl group and a substituted or unsubstituted naphthyl group.

13. The organic light-emitting diode of claim 9, wherein at least one of the electron-transporting organic material in the first mixed layer and the electron-transporting organic material in the second mixed layer comprises a compound represented by Formula 20A, wherein $T_1$ to $T_3$ in Formula 20A are N (nitrogen); or $T_1$ is $C(R_{100})$, and $T_2$ and $T_3$ are N (nitrogen); or $T_1$ to $T_3$ are $C(R_{100})$.

14. The organic light-emitting diode of claim 13, wherein $Ar_{201}$ to $Ar_{203}$ in Formula 20A are each independently selected from,
- a phenylene group, a naphthylene group, an anthrylene group, a pyrenylene group, a fluorenylene group, a pyridinylene group, a pyrazinylene group, and a pyrimidinylene group; and
- a phenylene group, a naphthylene group, an anthrylene group, a pyrenylene group, a fluorenylene group, a pyridinylene group, a pyrazinylene group, and a pyrimidinylene group, substituted with at least one of a phenyl group, a naphthyl group, an anthryl group, a pyrenyl group, a fluorenyl group, a pyridinyl group, a pyrazinyl group, and a pyrimidinyl group.

15. The organic light-emitting diode of claim 1, wherein the electron-transporting organic material in the first mixed layer and the electron-transporting organic material in the second mixed layer each independently comprise one of Compounds 200 to 210 and Compounds 600 to 604 below

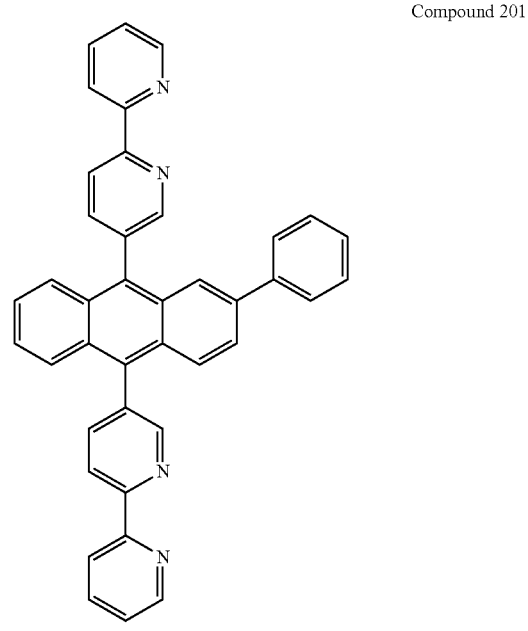

Compound 201

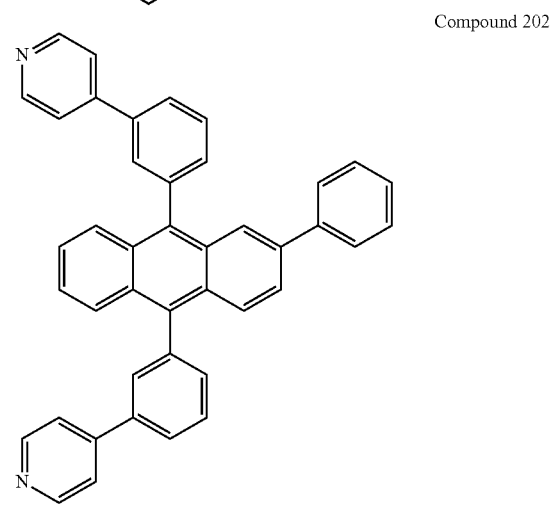

Compound 202

Compound 203
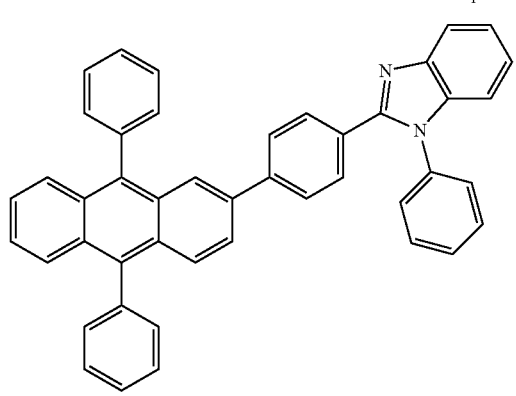
Compound 204
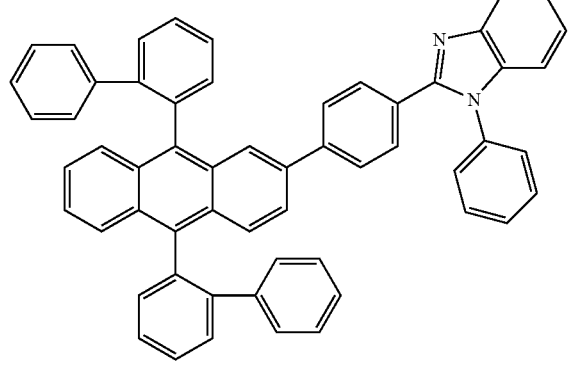
Compound 205
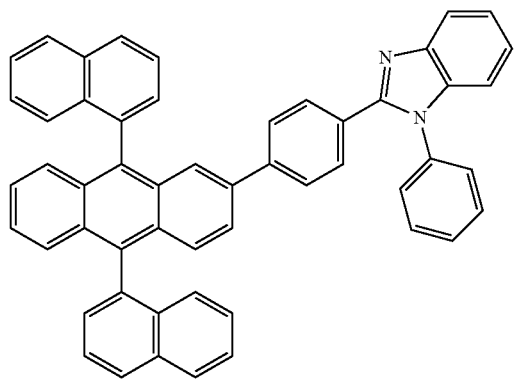
Compound 206
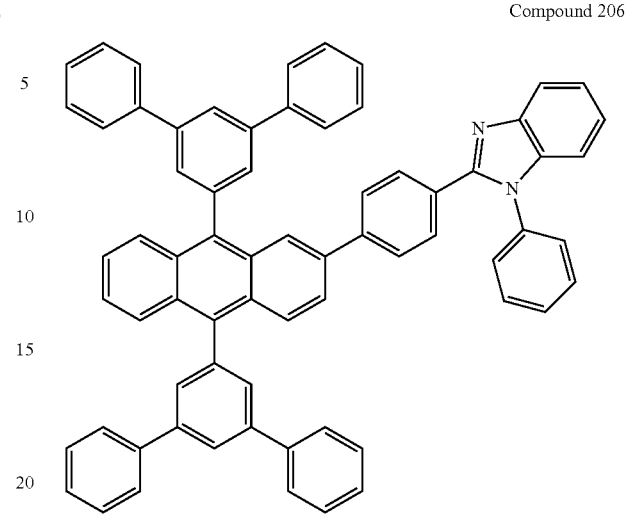
Compound 207
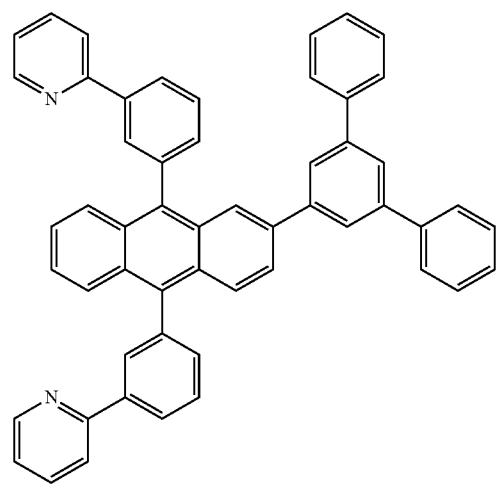
Compound 208
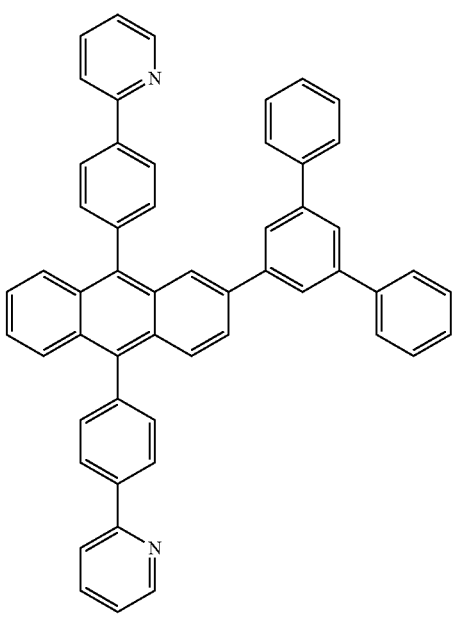

Compound 209
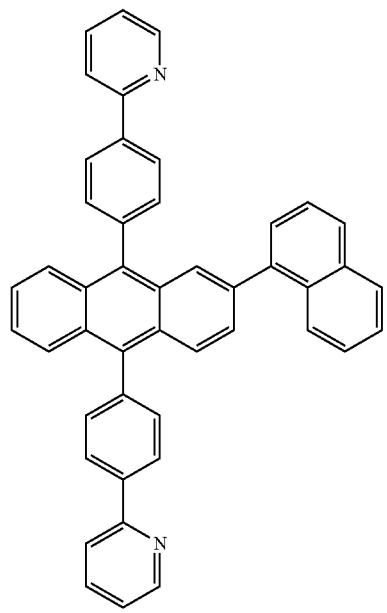
Compound 210
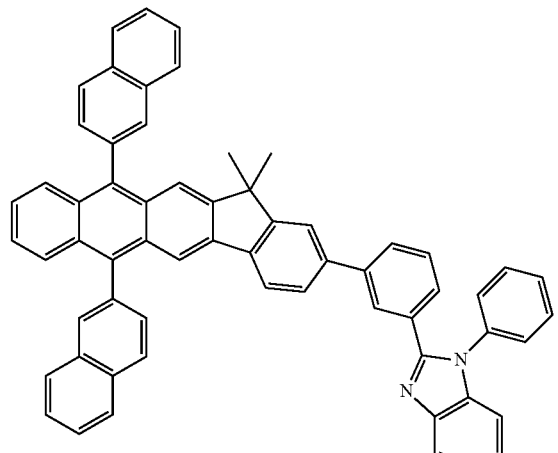
Compound 600
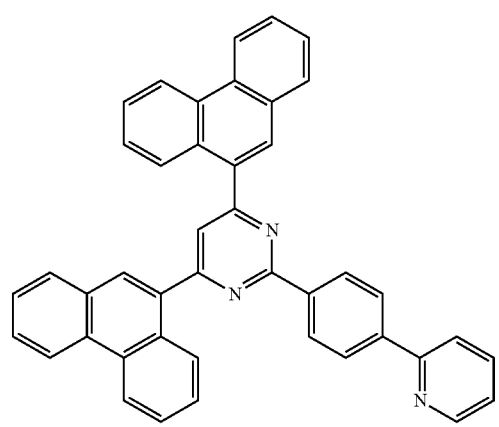
Compound 601
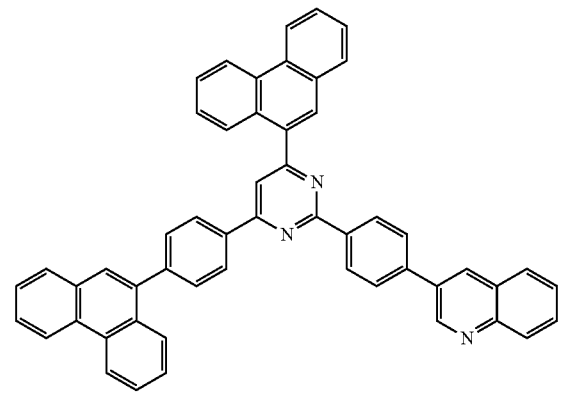
Compound 602
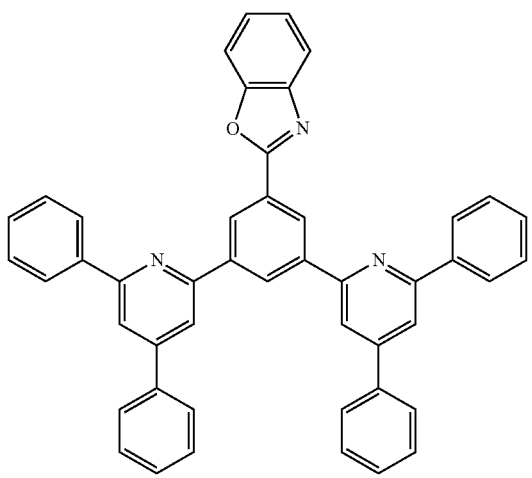
Compound 603
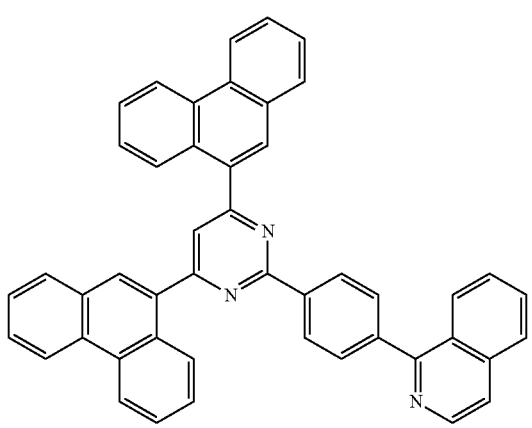

Compound 604
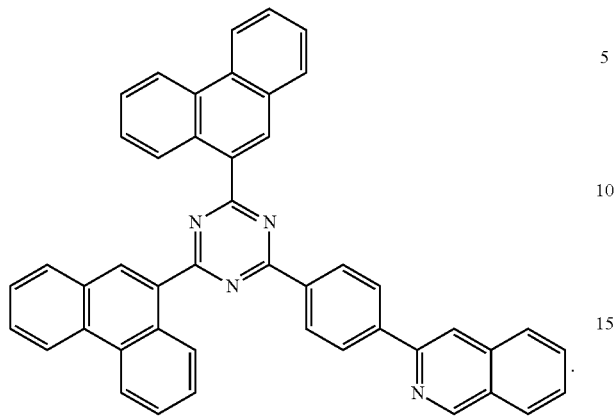
16. The organic light-emitting diode of claim 1, wherein the first mixed layer and the second mixed layer each independently have a thickness of from about 30 Å to about 100 Å.
* * * * *